United States Patent
Mammou et al.

(10) Patent No.: US 11,527,018 B2
(45) Date of Patent: *Dec. 13, 2022

(54) POINT CLOUD COMPRESSION

(71) Applicant: Apple Inc., Cupertino, CA (US)

(72) Inventors: Khaled Mammou, Vancouver (CA); Fabrice A. Robinet, Sunnyvale, CA (US); Alexandros Tourapis, Los Gatos, CA (US); Yeping Su, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/157,833

(22) Filed: Jan. 25, 2021

(65) Prior Publication Data

US 2021/0150765 A1    May 20, 2021

Related U.S. Application Data

(63) Continuation of application No. 16/132,230, filed on Sep. 14, 2018, now Pat. No. 10,909,725.

(60) Provisional application No. 62/560,163, filed on Sep. 18, 2017, provisional application No. 62/560,165, filed on Sep. 18, 2017, provisional application No. 62/569,603, filed on Oct. 8, 2017, provisional application No. 62/569,604, filed on Oct. 8, 2017, provisional application No. 62/590,195, filed on Nov.
(Continued)

(51) Int. Cl.
*G06T 9/00* (2006.01)
*H03M 7/30* (2006.01)

(52) U.S. Cl.
CPC .............. *G06T 9/001* (2013.01); *H03M 7/30* (2013.01); *H03M 7/3059* (2013.01); *H03M 7/70* (2013.01)

(58) Field of Classification Search
None
See application file for complete search history.

(56) References Cited

U.S. PATENT DOCUMENTS 5,793,371 A    8/1998 Deering
5,842,004 A    11/1998 Deering
(Continued)

FOREIGN PATENT DOCUMENTS

CA    309618    10/2019
CN    10230618    1/2012
(Continued)

OTHER PUBLICATIONS

Office action from Korean Application No. 10-2020-7007975, dated Mar. 26, 2021, (English Translation and Korean Version), pp. 1-10.
(Continued)

*Primary Examiner* — James A Thompson
(74) *Attorney, Agent, or Firm* — Alexander A. Knapp; Kowert, Hood, Munyon, Rankin & Goetzel, P.C.

(57) ABSTRACT

A system comprises an encoder configured to compress attribute information and/or spatial for a point cloud and/or a decoder configured to decompress compressed attribute and/or spatial information for the point cloud. To compress the attribute and/or spatial information, the encoder is configured to convert a point cloud into an image based representation. Also, the decoder is configured to generate a decompressed point cloud based on an image based representation of a point cloud.

20 Claims, 39 Drawing Sheets

Related U.S. Application Data 22, 2017, provisional application No. 62/590,206, filed on Nov. 22, 2017, provisional application No. 62/590,191, filed on Nov. 22, 2017, provisional application No. 62/655,763, filed on Apr. 10, 2018, provisional application No. 62/691,572, filed on Jun. 28, 2018, provisional application No. 62/693,379, filed on Jul. 2, 2018, provisional application No. 62/693,376, filed on Jul. 2, 2018, provisional application No. 62/694,124, filed on Jul. 5, 2018, provisional application No. 62/697,369, filed on Jul. 12, 2018.

(56) References Cited

U.S. PATENT DOCUMENTS

| | | |
|---|---|---|
| 5,867,167 A | 2/1999 | Deering |
| 5,870,094 A | 2/1999 | Deering |
| 5,905,502 A | 5/1999 | Deering |
| 5,933,153 A | 8/1999 | Deering |
| 6,018,353 A | 1/2000 | Deering |
| 6,028,610 A | 2/2000 | Deering |
| 6,088,034 A | 7/2000 | Deering |
| 6,188,796 B1 | 2/2001 | Kadono |
| 6,215,500 B1 | 4/2001 | Deering |
| 6,239,805 B1 | 5/2001 | Deering |
| 6,256,041 B1 | 7/2001 | Deering |
| 6,307,557 B1 | 10/2001 | Deering |
| 6,429,867 B1 | 8/2002 | Deering |
| 6,459,428 B1 | 10/2002 | Burk et al. |
| 6,459,429 B1 | 10/2002 | Deering |
| 6,522,326 B1 | 2/2003 | Deering |
| 6,522,327 B2 | 2/2003 | Deering |
| 6,525,722 B1 | 2/2003 | Deering |
| 6,525,725 B1 | 2/2003 | Deering |
| 6,531,012 B2 | 3/2003 | Ishiyama |
| 6,559,842 B1 | 5/2003 | Deering |
| 6,603,470 B1 | 8/2003 | Deering |
| 6,628,277 B1 | 9/2003 | Deering |
| 6,747,644 B1 | 6/2004 | Deering |
| 6,858,826 B2 | 2/2005 | Mueller et al. |
| 7,071,935 B1 | 7/2006 | Deering |
| 7,110,617 B2 | 9/2006 | Zhang et al. |
| 7,215,810 B2 | 5/2007 | Kaufman et al. |
| 7,373,473 B2 | 5/2008 | Bukowski et al. |
| 7,737,985 B2 | 6/2010 | Torzewski et al. |
| 7,961,934 B2 | 6/2011 | Thrun et al. |
| 8,022,951 B2 | 9/2011 | Zhirkov et al. |
| 8,040,355 B2 | 10/2011 | Burley |
| 3,055,070 A1 | 11/2011 | Bassi et al. |
| 8,264,549 B2 | 9/2012 | Tokiwa et al. |
| 8,411,932 B2 | 4/2013 | Liu et al. |
| 8,520,740 B2 | 8/2013 | Flachs |
| 8,643,515 B2 | 2/2014 | Cideciyan |
| 8,780,112 B2 | 7/2014 | Kontkanen et al. |
| 8,805,097 B2 | 8/2014 | Ahn et al. |
| 8,884,953 B2 | 11/2014 | Chen et al. |
| 9,064,311 B2 | 6/2015 | Mammou et al. |
| 9,064,331 B2 | 6/2015 | Yamashita et al. |
| 9,171,383 B2 | 10/2015 | Ahn et al. |
| 9,191,670 B2 | 11/2015 | Karczewicz |
| 9,199,641 B2 | 12/2015 | Ferguson et al. |
| 9,214,042 B2 | 12/2015 | Cai et al. |
| 9,223,765 B1 | 12/2015 | Alakuijala |
| 9,234,618 B1 | 1/2016 | Zhu et al. |
| 9,292,961 B1 | 3/2016 | Korchev |
| 9,300,321 B2 | 3/2016 | Zalik et al. |
| 9,317,965 B2 | 4/2016 | Krishnaswamy et al. |
| 9,412,040 B2 | 8/2016 | Feng et al. |
| 9,424,672 B2 | 8/2016 | Zavodny |
| 9,430,837 B2 | 8/2016 | Fujiki |
| 9,530,225 B1 | 12/2016 | Nieves |
| 9,532,056 B2 | 12/2016 | Jiang et al. |
| 9,613,388 B2 | 4/2017 | Loss |
| 9,633,146 B2 | 4/2017 | Plummer et al. |
| 9,678,963 B2 | 6/2017 | Hernandez Londono et al. |
| 9,729,169 B2 | 8/2017 | Kalevo |
| 9,734,595 B2 | 8/2017 | Lukac et al. |
| 9,753,124 B2 | 9/2017 | Hayes |
| 9,787,321 B1 | 10/2017 | Hemmer et al. |
| 9,800,766 B2 | 10/2017 | Tsuji |
| 9,836,483 B1 | 12/2017 | Hickman |
| 9,972,129 B2 | 5/2018 | Michel et al. |
| 10,089,312 B2 | 10/2018 | Tremblay et al. |
| 10,223,810 B2 | 3/2019 | Chou et al. |
| 10,259,164 B2 | 4/2019 | Bader |
| 10,277,248 B2 | 4/2019 | Lee |
| 10,372,728 B2 | 8/2019 | Horhammer et al. |
| 10,395,419 B1 | 8/2019 | Godzaridis |
| 10,462,485 B2 | 10/2019 | Mammou et al. |
| 10,467,756 B2 | 11/2019 | Arlinsky et al. |
| 10,559,111 B2 | 2/2020 | Sachs |
| 10,587,286 B1 | 3/2020 | Flynn |
| 10,607,373 B2 | 3/2020 | Mammou et al. |
| 10,659,816 B2 | 5/2020 | Mammou et al. |
| 10,699,444 B2 | 6/2020 | Mammou et al. |
| 10,715,618 B2 | 7/2020 | Bhaskar |
| 10,762,667 B2 | 9/2020 | Mekuria |
| 10,783,668 B2 | 9/2020 | Sinharoy et al. |
| 10,789,733 B2 | 9/2020 | Mammou et al. |
| 10,805,646 B2 | 10/2020 | Tourapis et al. |
| 10,861,196 B2 | 12/2020 | Mammou et al. |
| 10,867,413 B2 | 12/2020 | Mammou et al. |
| 10,869,059 B2 | 12/2020 | Mammou et al. |
| 10,897,269 B2 | 1/2021 | Mammou et al. |
| 10,909,725 B2 * | 2/2021 | Mammou ............... H03M 7/30 |
| 10,909,726 B2 | 2/2021 | Mammou et al. |
| 10,909,727 B2 | 2/2021 | Mammou et al. |
| 10,911,787 B2 | 2/2021 | Tourapis et al. |
| 10,939,123 B2 | 3/2021 | Li |
| 10,939,129 B2 | 3/2021 | Mammou |
| 10,977,773 B2 | 4/2021 | Hemmer |
| 11,010,907 B1 | 5/2021 | Bagwell |
| 11,010,928 B2 | 5/2021 | Mammou et al. |
| 11,012,713 B2 | 5/2021 | Kim et al. |
| 11,017,566 B1 | 5/2021 | Tourapis et al. |
| 11,044,478 B2 | 6/2021 | Tourapis et al. |
| 11,044,495 B1 | 6/2021 | Dupont |
| 11,113,845 B2 | 9/2021 | Tourapis et al. |
| 11,132,818 B2 | 9/2021 | Mammou et al. |
| 11,202,078 B2 | 12/2021 | Tourapis et al. |
| 11,202,098 B2 | 12/2021 | Mammou et al. |
| 11,212,558 B2 | 12/2021 | Sugio |
| 11,252,441 B2 | 2/2022 | Tourapis et al. |
| 11,276,203 B2 | 3/2022 | Tourapis et al. |
| 11,284,091 B2 | 3/2022 | Tourapis et al. |
| 11,363,309 B2 | 6/2022 | Tourapis et al. |
| 11,386,524 B2 | 7/2022 | Mammou et al. |
| 2002/0181741 A1 | 12/2002 | Masukura |
| 2004/0217956 A1 | 11/2004 | Besl et al. |
| 2006/0133508 A1 | 6/2006 | Sekiguchi |
| 2007/0098283 A1 | 5/2007 | Kim et al. |
| 2007/0160140 A1 | 7/2007 | Fujisawa |
| 2008/0050047 A1 | 2/2008 | Bashyam |
| 2008/0154928 A1 | 6/2008 | Bashyam |
| 2009/0016598 A1 | 1/2009 | Lojewski |
| 2009/0087111 A1 | 4/2009 | Noda et al. |
| 2009/0285301 A1 | 11/2009 | Kurata |
| 2010/0104157 A1 | 4/2010 | Doyle |
| 2010/0104158 A1 | 4/2010 | Shechtman et al. |
| 2010/0106770 A1 | 4/2010 | Taylor |
| 2010/0166064 A1 | 7/2010 | Perlman |
| 2010/0208807 A1 | 8/2010 | Sikora |
| 2010/0260429 A1 | 10/2010 | Ichinose |
| 2010/0260729 A1 | 10/2010 | Cavato et al. |
| 2010/0296579 A1 | 11/2010 | Panchai et al. |
| 2011/0010400 A1 | 1/2011 | Hayes |
| 2011/0107720 A1 | 5/2011 | Oakey |
| 2011/0142139 A1 | 6/2011 | Cheng |
| 2011/0182477 A1 | 7/2011 | Tamrakar |
| 2012/0124113 A1 | 5/2012 | Zalik et al. |
| 2012/0188344 A1 | 7/2012 | Imai |
| 2012/0246166 A1 | 9/2012 | Krishnaswamy et al. |
| 2012/0300839 A1 | 11/2012 | Sze et al. |

(56) References Cited

U.S. PATENT DOCUMENTS

| | | |
|---|---|---|
| 2012/0314026 A1 | 12/2012 | Chen et al. |
| 2013/0034150 A1 | 2/2013 | Sadafale |
| 2013/0094777 A1 | 4/2013 | Nomura et al. |
| 2013/0106627 A1 | 5/2013 | Cideciyan |
| 2013/0195352 A1 | 8/2013 | Nystad |
| 2013/0202197 A1 | 8/2013 | Reeler |
| 2013/0321418 A1 | 12/2013 | Kirk |
| 2013/0329778 A1 | 12/2013 | Su et al. |
| 2014/0036033 A1 | 2/2014 | Takahashi |
| 2014/0098855 A1 | 4/2014 | Gu et al. |
| 2014/0125671 A1 | 5/2014 | Vorobyov et al. |
| 2014/0198097 A1 | 7/2014 | Evans |
| 2014/0204088 A1 | 7/2014 | Kirk et al. |
| 2014/0294088 A1 | 10/2014 | Sung et al. |
| 2014/0334557 A1 | 11/2014 | Schierl et al. |
| 2015/0003723 A1 | 1/2015 | Huang et al. |
| 2015/0092834 A1 | 4/2015 | Cote et al. |
| 2015/0139560 A1 | 5/2015 | DeWeert et al. |
| 2015/0160450 A1 | 6/2015 | Ou et al. |
| 2015/0186744 A1 | 7/2015 | Nguyen et al. |
| 2015/0268058 A1 | 9/2015 | Samarasekera et al. |
| 2016/0035081 A1 | 2/2016 | Stout et al. |
| 2016/0071312 A1 | 3/2016 | Laine et al. |
| 2016/0086353 A1 | 3/2016 | Lukac et al. |
| 2016/0100151 A1 | 4/2016 | Schaffer et al. |
| 2016/0142697 A1 | 5/2016 | Budagavi et al. |
| 2016/0165241 A1 | 6/2016 | Park |
| 2016/0286215 A1 | 9/2016 | Gamei |
| 2016/0295219 A1 | 10/2016 | Ye et al. |
| 2017/0039765 A1 | 2/2017 | Zhou et al. |
| 2017/0063392 A1 | 3/2017 | Kalevo |
| 2017/0118675 A1 | 4/2017 | Boch |
| 2017/0155402 A1 | 6/2017 | Karkkainen |
| 2017/0155922 A1 | 6/2017 | Yoo |
| 2017/0214943 A1 | 7/2017 | Cohen et al. |
| 2017/0220037 A1 | 8/2017 | Berestov |
| 2017/0243405 A1 | 8/2017 | Brandt et al. |
| 2017/0249401 A1 | 8/2017 | Ckart et al. |
| 2017/0337724 A1* | 11/2017 | Gervais ............... H04N 19/14 |
| 2017/0347100 A1 | 11/2017 | Chou et al. |
| 2017/0347120 A1* | 11/2017 | Chou ............... H04N 19/597 |
| 2017/0347122 A1 | 11/2017 | Chou et al. |
| 2017/0358063 A1 | 12/2017 | Chen |
| 2018/0053324 A1 | 2/2018 | Cohen et al. |
| 2018/0063543 A1 | 3/2018 | Reddy |
| 2018/0075622 A1 | 3/2018 | Tuffreau et al. |
| 2018/0189982 A1 | 7/2018 | Laroche et al. |
| 2018/0268570 A1 | 9/2018 | Budagavi et al. |
| 2018/0308249 A1 | 10/2018 | Nash et al. |
| 2018/0330504 A1 | 11/2018 | Karlinsky et al. |
| 2018/0338017 A1 | 11/2018 | Mekuria |
| 2018/0342083 A1 | 11/2018 | Onno et al. |
| 2018/0365898 A1 | 12/2018 | Costa |
| 2019/0018730 A1 | 1/2019 | Charamisinau et al. |
| 2019/0020880 A1 | 1/2019 | Wang |
| 2019/0026956 A1 | 1/2019 | Gausebeck |
| 2019/0081638 A1 | 3/2019 | Mammou et al. |
| 2019/0087978 A1 | 3/2019 | Tourapis et al. |
| 2019/0087979 A1 | 3/2019 | Mammou et al. |
| 2019/0088004 A1 | 3/2019 | Lucas et al. |
| 2019/0108655 A1 | 4/2019 | Lasserre |
| 2019/0114504 A1 | 4/2019 | Vosoughi et al. |
| 2019/0114809 A1 | 4/2019 | Vosoughi et al. |
| 2019/0114830 A1 | 4/2019 | Bouazizi |
| 2019/0116257 A1 | 4/2019 | Rhyne |
| 2019/0116357 A1 | 4/2019 | Tian et al. |
| 2019/0122393 A1 | 4/2019 | Sinharoy |
| 2019/0089987 A1 | 5/2019 | Won et al. |
| 2019/0139266 A1 | 5/2019 | Budagavi et al. |
| 2019/0156519 A1 | 5/2019 | Mammou et al. |
| 2019/0156520 A1 | 5/2019 | Mammou et al. |
| 2019/0195616 A1 | 6/2019 | Cao et al. |
| 2019/0197739 A1 | 6/2019 | Sinharoy et al. |
| 2019/0199995 A1 | 6/2019 | Yip et al. |
| 2019/0204076 A1 | 7/2019 | Nishi et al. |
| 2019/0262726 A1 | 8/2019 | Spencer et al. |
| 2019/0289306 A1 | 9/2019 | Zhao |
| 2019/0304139 A1 | 10/2019 | Joshi et al. |
| 2019/0311502 A1 | 10/2019 | Mammou et al. |
| 2019/0313110 A1 | 10/2019 | Mammou et al. |
| 2019/0318488 A1 | 10/2019 | Lim |
| 2019/0318519 A1 | 10/2019 | Graziosi et al. |
| 2019/0340306 A1 | 11/2019 | Harrison |
| 2019/0341930 A1 | 11/2019 | Pavlovic |
| 2019/0371051 A1 | 12/2019 | Dore et al. |
| 2019/0392651 A1 | 12/2019 | Graziosi |
| 2020/0005518 A1 | 1/2020 | Graziosi |
| 2020/0013235 A1 | 1/2020 | Tsai et al. |
| 2020/0020132 A1 | 1/2020 | Sinharoy et al. |
| 2020/0020133 A1 | 1/2020 | Najaf-Zadeh et al. |
| 2020/0021847 A1 | 1/2020 | Kim et al. |
| 2020/0027248 A1 | 1/2020 | Verschaeve |
| 2020/0043220 A1 | 2/2020 | Mishaev |
| 2020/0045344 A1 | 2/2020 | Boyce et al. |
| 2020/0104976 A1 | 4/2020 | Mammou et al. |
| 2020/0105024 A1 | 4/2020 | Mammou et al. |
| 2020/0107022 A1 | 4/2020 | Ahn et al. |
| 2020/0107048 A1 | 4/2020 | Yea |
| 2020/0111237 A1 | 4/2020 | Tourapis et al. |
| 2020/0137399 A1 | 4/2020 | Li et al. |
| 2020/0153885 A1 | 5/2020 | Lee et al. |
| 2020/0154137 A1 | 5/2020 | Fleureau et al. |
| 2020/0195946 A1 | 6/2020 | Choi |
| 2020/0204808 A1 | 6/2020 | Graziosi |
| 2020/0217937 A1 | 7/2020 | Mammou et al. |
| 2020/0219285 A1 | 7/2020 | Faramarzi et al. |
| 2020/0219288 A1 | 7/2020 | Joshi |
| 2020/0219290 A1 | 7/2020 | Tourapis et al. |
| 2020/0228836 A1 | 7/2020 | Schwarz et al. |
| 2020/0244993 A1 | 7/2020 | Schwarz et al. |
| 2020/0260063 A1 | 8/2020 | Hannuksela |
| 2020/0273208 A1 | 8/2020 | Mammou et al. |
| 2020/0273258 A1 | 8/2020 | Lasserre et al. |
| 2020/0275129 A1 | 8/2020 | Deshpande |
| 2020/0279435 A1 | 9/2020 | Kuma |
| 2020/0286261 A1 | 9/2020 | Faramarzi et al. |
| 2020/0288171 A1 | 9/2020 | Hannuksela et al. |
| 2020/0302571 A1 | 9/2020 | Schwartz |
| 2020/0302578 A1 | 9/2020 | Graziosi |
| 2020/0302621 A1 | 9/2020 | Kong |
| 2020/0302651 A1 | 9/2020 | Flynn |
| 2020/0302655 A1 | 9/2020 | Oh |
| 2020/0359035 A1 | 11/2020 | Chevet |
| 2020/0359053 A1 | 11/2020 | Yano |
| 2020/0366941 A1 | 11/2020 | Sugio et al. |
| 2020/0374559 A1 | 11/2020 | Fleureau et al. |
| 2020/0380765 A1 | 12/2020 | Thudor et al. |
| 2021/0005006 A1 | 1/2021 | Oh |
| 2021/0006805 A1 | 1/2021 | Urban et al. |
| 2021/0006833 A1 | 1/2021 | Tourapis |
| 2021/0012536 A1 | 1/2021 | Mammou et al. |
| 2021/0012538 A1 | 1/2021 | Wang |
| 2021/0014293 A1 | 1/2021 | Yip |
| 2021/0021869 A1 | 1/2021 | Wang |
| 2021/0027505 A1 | 1/2021 | Yano et al. |
| 2021/0029381 A1 | 1/2021 | Zhang et al. |
| 2021/0084333 A1 | 3/2021 | Zhang |
| 2021/0090301 A1 | 3/2021 | Mammou et al. |
| 2021/0097723 A1 | 4/2021 | Kim et al. |
| 2021/0097725 A1 | 4/2021 | Mammou et al. |
| 2021/0097726 A1 | 4/2021 | Mammou et al. |
| 2021/0099701 A1 | 4/2021 | Tourapis |
| 2021/0103780 A1 | 4/2021 | Mammou et al. |
| 2021/0104014 A1 | 4/2021 | Kolb, V |
| 2021/0104073 A1 | 4/2021 | Yea et al. |
| 2021/0104075 A1 | 4/2021 | Mammou et al. |
| 2021/0105022 A1 | 4/2021 | Flynn et al. |
| 2021/0105493 A1 | 4/2021 | Mammou et al. |
| 2021/0105504 A1 | 4/2021 | Hur et al. |
| 2021/0112281 A1 | 4/2021 | Wang |
| 2021/0118190 A1 | 4/2021 | Mammou et al. |
| 2021/0119640 A1 | 4/2021 | Mammou et al. |
| 2021/0142522 A1 | 5/2021 | Li |
| 2021/0150766 A1 | 5/2021 | Mammou et al. |

(56) References Cited

U.S. PATENT DOCUMENTS

| | | |
|---|---|---|
| 2021/0166432 A1 | 6/2021 | Wang |
| 2021/0166436 A1 | 6/2021 | Zhang |
| 2021/0168386 A1 | 6/2021 | Zhang |
| 2021/0183112 A1 | 6/2021 | Mammou et al. |
| 2021/0185331 A1 | 6/2021 | Mammou et al. |
| 2021/0195162 A1 | 6/2021 | Chupeau et al. |
| 2021/0203989 A1 | 7/2021 | Wang |
| 2021/0211724 A1 | 7/2021 | Kim et al. |
| 2021/0217139 A1 | 7/2021 | Yano |
| 2021/0217203 A1 | 7/2021 | Kim et al. |
| 2021/0217206 A1 | 7/2021 | Flynn |
| 2021/0218969 A1 | 7/2021 | Lasserre |
| 2021/0218994 A1 | 7/2021 | Flynn |
| 2021/0233281 A1 | 7/2021 | Wang et al. |
| 2021/0248784 A1 | 8/2021 | Gao |
| 2021/0248785 A1 | 8/2021 | Zhang |
| 2021/0256735 A1 | 8/2021 | Tourapis et al. |
| 2021/0258610 A1 | 8/2021 | Iguchi |
| 2021/0264640 A1 | 8/2021 | Mammou et al. |
| 2021/0264641 A1 | 8/2021 | Iguchi |
| 2021/0266597 A1 | 8/2021 | Kim et al. |
| 2021/0295569 A1 | 9/2021 | Sugio |
| 2021/0319593 A1 | 10/2021 | Flynn |
| 2021/0400280 A1 | 12/2021 | Zaghetto |
| 2021/0407147 A1 | 12/2021 | Flynn |
| 2021/0407148 A1 | 12/2021 | Flynn |
| 2022/0005228 A1 | 1/2022 | Tourapis et al. |

FOREIGN PATENT DOCUMENTS

| | | |
|---|---|---|
| CN | 104408689 | 3/2015 |
| CN | 106651942 | 5/2017 |
| CN | 108632607 | 10/2018 |
| EP | 2533213 | 12/2012 |
| EP | 3429210 | 1/2019 |
| EP | 3496388 | 6/2019 |
| EP | 3614674 | 2/2020 |
| EP | 3751857 | 12/2020 |
| WO | 200004506 | 1/2000 |
| WO | 2013022540 | 2/2013 |
| WO | 2018050725 | 3/2018 |
| WO | 2018094141 | 5/2018 |
| WO | 2019011636 | 1/2019 |
| WO | 2019013430 | 1/2019 |
| WO | 2019076503 | 4/2019 |
| WO | 2019078696 | 4/2019 |
| WO | 2019093834 | 5/2019 |
| WO | 2019129923 | 7/2019 |
| WO | 2019135024 | 7/2019 |
| WO | 2019143545 | 7/2019 |
| WO | 2019194522 | 10/2019 |
| WO | 2019199415 | 10/2019 |
| WO | 20190197708 | 10/2019 |
| WO | 2019069711 | 11/2019 |
| WO | 2020012073 | 1/2020 |
| WO | 2020066680 | 2/2020 |

OTHER PUBLICATIONS

R. Mekuria, et al., "Design, Implementation and Evaluation of a Point Cloud Codec for Tele-Immersive Video", IEEE Transactions on Circuits and Systems for Video Technology 27.4, 2017, pp. 1-14.
Tim Golla, et al., "Real-time Point Cloud Compression", ©IEEE, In IROS, 2015, pp. 1-6.
Dong Liu, et al., "Three-Dimensional Point-Cloud Plus Patches: Towards Model-Based Image Coding in the Cloud", 2015 IEEE International Conference on Multimedia Big Data, IEEE Computer Society, pp. 395-400.
International Search Report and Written Opinion from PCT/US2018/051448, dated Dec. 19, 2018, Apple Inc., pp. 1-12.
Tilo Ochotta, et al., "Image-Based Surface Compression", Computer Graphics Forum, Retrieved from URL: https://www.uni-konstanz.de/mmsp/pubsys/publishedFiles/OcSa06.pdf, Sep. 1, 2008, pp. 1647-1663.
Robert A. Cohen, et al., "Point Cloud Attribute Compression using 3-D Intra Prediction and Shape-Adaptive Transforms", 2016 Data Compression Conference, pp. 141-150.
Jae-Kyun, et al., "Large-Scale 3D Point Cloud Compression Using Adaptive Radial Distance Prediction in Hybrid Coordinate Domains", IEEE Journal of Selected Topics in Signal Processing, vol. 9, No. 3, Apr. 2015, pp. 1-14.
Yiting Shao, et al., "Attribute Compression of 3D Point Clouds Using Laplacian Sparsity Optimized Graph Transform", 2017 IEEE Visual Communication and Image Processing (VCIP), 2017, pp. 1-4.
Li Li, et al., "Efficient Projected Frame Padding for Video-Based Point Cloud Compression", in IEEE Transactions on Multimedia, doi: 10.1109/TMM.2020.30169894, 2020, pp. 1-14.
Ismael Daribo, et al., Efficient Rate-Distortion Compression of Dynamic Point Cloud for Grid-Pattern-Based 3D Scanning Systems, Research 3.1, 2012, pp. 1-9.
Sebastian Schwarz, et al., "Emerging MPEG Standards for Point Cloud Compression", IEEE Journal of Emerging and Selected Topics in Circuits and Systems, vol. 9, No. 1, Mar. 2019, pp. 133-148.
Siheng Chen, et al., "Fast Resampling of 3D Point Clouds via Graphs", arXiv:1702.06397v1, Feb. 11, 2017, pp. 1-15.
Mahid Sheikhi Pour, "Improvements for Projection-Based Point Cloud Compression", MS thesis, 2018, pp. 1-75.
Robert Skupin, et al., "Multiview Point Cloud Filtering for Spatiotemporal Consitency", 2014 International Conference an Computer Vision Theory and Applications (VISAPP), vol. 3, IEEE, 2014, pp. 531-538.
Lujia Wang, et al., "Point-cloud Compression Using Data Independent Method—A 3D Discrete Cosine Transform Approach", Proceedings of the 2017 IEEE International Conference on Information and Automation (ICIA), Jul. 2017, pp. 1-6.
U.S. Appl. No. 16/586,872, filed Sep. 27, 2019, Khaled Mammou et al.
Robert Cohen, "CE 3.2 point-based prediction for point loud compression", dated Apr. 2018, pp. 1-6.
Bin Lu, et al., ""Massive Point Cloud Space Management Method Based on Octree-Like Encoding"", Arabian Journal forScience Engineering, https://doi.org/10.1007/s13369-019-03968-7, 2019, pp. 1-15.
Wikipedia, ""k-d tree"", Aug. 1, 2019, Retrieved from URL: https://en.wikipedia.org/w.indec.php?title=Kd_tree&oldid=908900837, pp. 1-9.
"David Flynn et al., ""G-PCC: A hierarchical geometry slice structure"", MPEG Meeting, Retrieved from http://phenix.intevry.fr/mpeg/doc_end_user/documents/131_Online/wg11/m54677-v1-m54677_vl.zip, Jun. 28, 2020, pp. 1-9".
""""G-PCC Future Enhancements"", MPEG Metting, Oct. 7-11, 2019, (Motion Picture Expert Group of ISO/IECJTC1/SC29-WG11), Retrieved from http://phenix.int-evry.fr/mpeg/doc_end_user/documents/128_Geneva/wg11/w18887.zipw18887/w18887 on Dec. 23, 2019, pp. 1-30".
Miska M. Hannuksela, "On Slices and Tiles", JVET Meeting, The Joint Video Exploration Team of ISO/IEC, Sep. 25, 2018, pp. 1-3.
David Flynn, "International Organisation for Standardisation Organisation International De Normalisation ISO/IEC JTC1/SC29/WG11 Coding of Moving Pictures and Audio", dated Apr. 2020. pp. 1-9.
U.S. Appl. No. 17/691,754, filed Mar. 10, 2022, Khaled Mammou.
U.S. Appl. No. 17/718,647, filed Apr. 12, 2022, Alexandros Tourapis, et al.
Stefan Gumhold et al, "Predictive Point-Cloud Compression", dated Jul. 31, 2005, pp. 1-7.
Pierre-Marie Gandoin et al, "Progressive Lossless Compression of Arbitrary Simplicial Complexes", Dated Jul. 1, 2002, pp. 1-8.
Ruwen Schnabel et al., "Octree-based Point-Cloud Compression", Eurographics Symposium on Point-Based Graphics, 2006, pp. 1-11.
Yuxue Fan et al., "Point Cloud Compression Based on Hierarchical Point Clustering", Signal and Information Processing Association Annual Summit and Conference (APSIPA), IEEE, 2013, pp. 1-7.

(56) References Cited

OTHER PUBLICATIONS

Kammert, et al., "Real-time Compression of Point Cloud Streams", 2012 IEEE International Conference on Robotics and Automation, RiverCentre, Saint Paul, Minnesota, USA, May 14-18, 2012, pp. 778-785.
Garcia, et al., "Context-Based Octree Coding for Point Cloud Video", 2017 IEEE International Conference on Image Processing (ICIP), 2017, pp. 1412-1416.
Merry et al., Compression of dense and regular point clouds, Proceedings of the 4th international conference on Computer graphics, virtual reality, visualisation and interaction in Africa (pp. 15-20). ACM. (Jan. 2006).
Lustosa et al., Database system support of simulation data, Proceedings of the VLDB Endowment 9.13 (2016) pp. 1329-1340.
Hao Liu, et al., "A Comprehensive Study and Comparison of Core Technologies for MPEG 3D Point Cloud Compression", arXiv:1912.09674v1, Dec. 20, 2019, pp. 1-17.
Styliani Psomadaki, "Using a Space Filing Curve for the Management of Dynamic Point Cloud Data in a Relational DBMS", Nov. 2016, pp. 1-158.
Remi Cura et al, "Implicit Lod for Processing and Classification in Point Cloud Servers", dated Mar. 4, 2016, pp. 1-18.
Yan Huang et al., Octree-Based Progressive Geometry Coding of Point Clouds, dated Jan. 1, 2006, pp. 1-10.
Khaled Mammou, et al., "G-PCC codec description v1", International Organisation for Standardisation, ISO/IEC JTC1/SC29/WG11, Oct. 2018, pp. 1-32.
"V-PCC Codec Description", 127. MPEG Meeting; Jul. 8, 2019-Jul. 12, 2019; Gothenburg; (Motion Picture Expert Group or ISO/IEC JTC1/SC29/WG), dated Sep. 25, 2019.
G-PPC Codec Description, 127. MPEG Meeting; Jul. 8, 2019-Jul. 12, 2019; Gothenburg; (Motion Picture Expert Group or ISO/IEC JTC1/SC29/WG), dated Sep. 6, 2019.
Jianqiang Liu et al, "Data-Adaptive Packing Method for Compression of Dynamic Point Cloud Sequences", dated Jul. 3, 2019, pp. 904-909.
Jorn Jachalsky et al, "D4.2.1 Scene Analysis with Spatio-Temporal", dated Apr. 30, 2013, pp. 1-60.
Lasserre S et al, "Global Motion Compensation for Point Cloud Compression in TMC3", dated Oct. 3, 2018, pp. 1-28.
D. Graziosi et al, "An overview of ongoing point cloud compression standardization activities: video-based (V-PCC) and geometry-based (G-PCC)" Asipa Transactions on Signal and Information Processing, vol. 9, dated Apr. 30, 2020, pp. 1-17.
"Continuous improvement of study text of ISO-IEC CD 23090-5 Video-Based Point Cloud Compression" dated May 8, 2019, pp. 1-140.
Mehlem D et al, "Smoothing considerations for V-PCC", dated Oct. 2, 2019, pp. 1-8.
Flynn D et al, "G-PCC Bypass coding of bypass bins", dated Mar. 21, 2019, pp. 1-3.
Sharman K et al, "CABAC Packet-Based Stream", dated Nov. 18, 2011, pp. 1-6.
Lasserre S et al, "On bypassed bit coding and chunks", dated Apr. 6, 2020, pp. 1-3.
David Flynn et al., "G-pcc low latency bypass bin coding", dated Oct. 3, 2019, pp. 1-4.
Chuan Wang, et al., "Video Vectorization via Tetrahedral Remeshing", IEEE Transactions on Image Processing, vol. 26, No. 4, Apr. 2017, pp. 1833-1844.
Keming Cao, et al., "Visual Quality of Compressed Mesh and Point Cloud Sequences", IEEE Access, vol. 8, 2020. pp. 171203-171217.
W. Zhu, et al., "Lossless point cloud geometry compression via binary tree partition and intra prediction," 2017 IEEE 19th International Workshop on Multimedia Signal Processing (MMSP), 2017, pp. 1-6, doi: 1.1109/MMSP.2017.8122226 (Year 2017).
Pragyana K Mishra, "Image and Depth Coherent Surface Description", Doctoral dissertation, Carnegie Mellon University, The Robotics Institute, Mar. 2005, pp. 1-152.
Notice of Allowance from Korean Application No. 10-2021-7041003, dated Mar. 24, 2022, (Korean Version only), pp. 1-3.
Jang et al., Video-Based Point-Cloud-Compression Standard in MPEG: From Evidence Collection to Committee Draft [Standards in a Nutshell], IEEE Signal Processing Magazine, Apr. 2019.
Ekekrantz, Johan, et al., "Adaptive Cost Function for Pointcloud Registration," arXiv preprint arXiv: 1704 07910 (2017), pp. 1-10.
Vincente Morell, et al., "Geometric 3D point cloud compression", Copyright 2014 Elsevier B.V. All rights reserved, pp. 1-18.
U.S. Appl. No. 17/523,826, filed Nov. 10, 2021, Mammou, et a.
Chou, et al., "Dynamic Polygon Clouds: Representation and Compression for VR/AR", ARXIV ID: 1610.00402, Published Oct. 3, 2016, pp. 1-28.
U.S. Appl. No. 17/804,477, filed May 27, 2022, Khaled Mammou, et al.
Jingming Dong, "Optimal Visual Representation Engineering and Learning for Computer Vision", Doctoral Dissertation, UCLA, 2017, pp. 1-151.
Khaled Mammou et al, "Working Draft of Point Cloud Coding for Category 2 (Draft 1)", dated Apr. 2018, pp. 1-38.
Khaled Mammou et al , "Input Contribution", dated Oct. 8, 2018, pp. 1-42.
Benjamin Brass et al, "High Effeciency Video Coding (HEVC) Text Specification Draft 8", dated Jul. 23, 2012, pp. 1-86.
JunTaek Park et al, "Non-Overiapping Patch Packing in TMC2 with HEVC-SCC", dated Oct. 8, 2018, pp. 1-6.
Smael Daribo, et al., "Efficient Rate-Distortion Compression on Dynamic Point Cloud for Grid-Pattem-Based 3D Scanning Systems", 3D Research 3.1, Springer, 2012, pp. 1-9.

\* cited by examiner

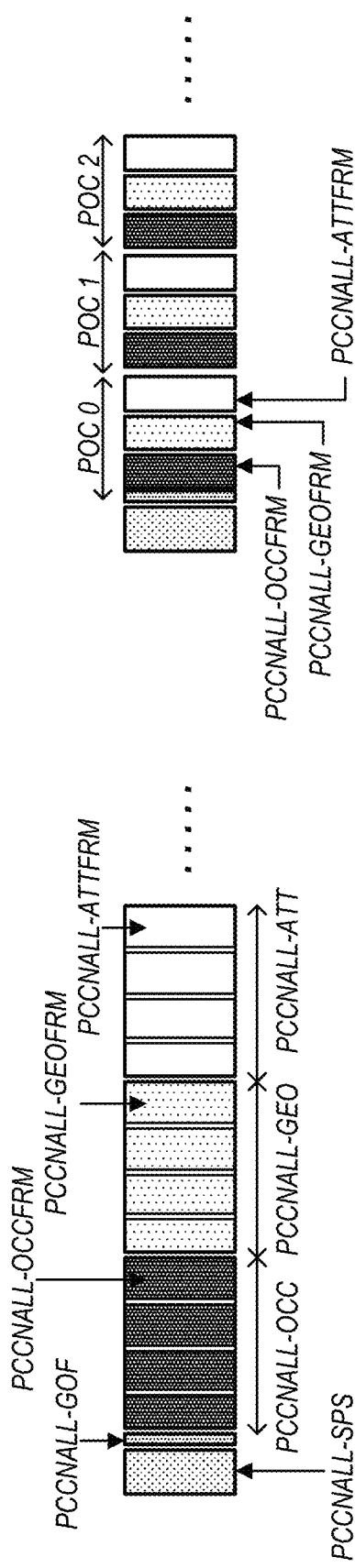
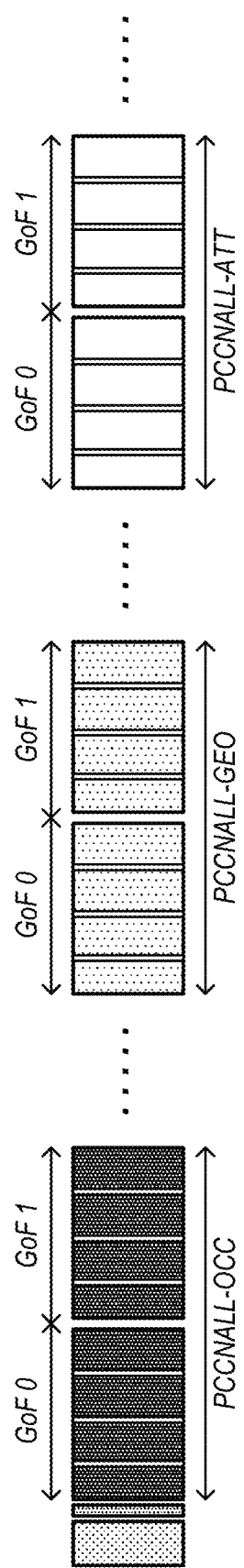
FIG. 7A
FIG. 7B
FIG. 7C

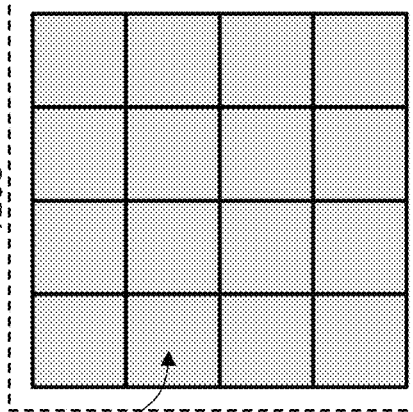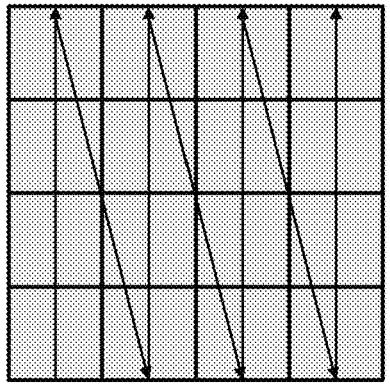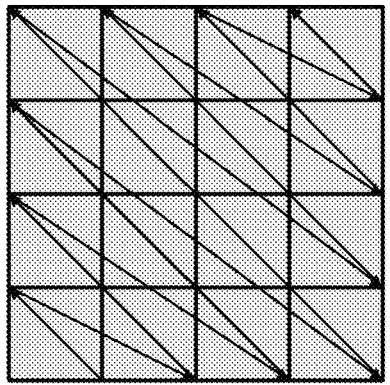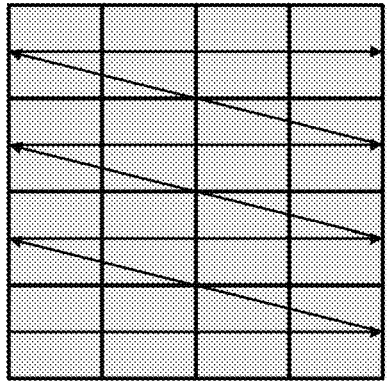
FIG. 12B

POINT CLOUD COMPRESSION

PRIORITY DATA

This application is a continuation of U.S. patent application Ser. No. 16/132,230 filed Sep. 14, 2018 and entitled "Point Cloud Compression", which claims benefit of priority to the following U.S. Provisional applications:

U.S. Provisional Application Ser. No. 62/560,163, entitled "Static and Dynamic Point Cloud Compression," filed Sep. 18, 2017;

U.S. Provisional Application Ser. No. 62/560,165, entitled "Point Cloud Compression Using Projections," filed Sep. 18, 2017;

U.S. Provisional Application Ser. No. 62/569,603, entitled "Static and Dynamic Point Cloud Compression," filed Oct. 8, 2017;

U.S. Provisional Application Ser. No. 62/569,604, entitled "Point Cloud Masks," filed Oct. 8, 2017;

U.S. Provisional Application Ser. No. 62/590,195, entitled "Point Cloud Compression with Closed-Loop Color Conversion," filed Nov. 22, 2017;

U.S. Provisional Application Ser. No. 62/590,206, entitled "Point Cloud Occupancy Map Compression," filed Nov. 22, 2017;

U.S. Provisional Application Ser. No. 62/590,191, entitled "Point Cloud Compression with Multi-Layer Projection," filed Nov. 22, 2017;

U.S. Provisional Application Ser. No. 62/655,763, entitled "Point Cloud Compression," filed Apr. 10, 2018;

U.S. Provisional Application Ser. No. 62/691,572, entitled "Point Cloud Compression," filed Jun. 28, 2018;

U.S. Provisional Application Ser. No. 62/693,379, entitled "Point Cloud Compression with Multi-Level Encoding," filed Jul. 2, 2018;

U.S. Provisional Application Ser. No. 62/693,376, entitled "Point Cloud Compression with Adaptive Filtering," filed Jul. 2, 2018;

U.S. Provisional Application Ser. No. 62/694,124, entitled "Point Cloud Compression with Multi-Resolution Video Encoding," filed Jul. 5, 2018; and U.S. Provisional Application Ser. No. 62/697,369, entitled "Bit Stream Structure for Compressed Point Cloud Data," filed Jul. 12, 2018.

This application incorporates by reference the parent application (U.S. patent application Ser. No. 16/132,230 filed Sep. 14, 2018) and each of the above referenced provisional applications to which the parent application claims priority, in their entirety.

BACKGROUND

Technical Field

This disclosure relates generally to compression and decompression of point clouds comprising a plurality of points, each having associated spatial information and attribute information.

Description of the Related Art

Various types of sensors, such as light detection and ranging (LIDAR) systems, 3-D-cameras, 3-D scanners, etc. may capture data indicating positions of points in three dimensional space, for example positions in the X, Y, and Z planes. Also, such systems may further capture attribute information in addition to spatial information for the respective points, such as color information (e.g. RGB values), texture information, intensity attributes, reflectivity attributes, motion related attributes, modality attributes, or various other attributes. In some circumstances, additional attributes may be assigned to the respective points, such as a time-stamp when the point was captured. Points captured by such sensors may make up a "point cloud" comprising a set of points each having associated spatial information and one or more associated attributes. In some circumstances, a point cloud may include thousands of points, hundreds of thousands of points, millions of points, or even more points. Also, in some circumstances, point clouds may be generated, for example in software, as opposed to being captured by one or more sensors. In either case, such point clouds may include large amounts of data and may be costly and time-consuming to store and transmit.

SUMMARY OF EMBODIMENTS

In some embodiments, a system includes one or more sensors configured to capture points that collectively make up a point cloud, wherein each of the points comprises spatial information identifying a spatial location of the respective point and attribute information defining one or more attributes associated with the respective point.

The system also includes an encoder configured to compress the attribute and/or spatial information of the points. To compress the attribute and/or spatial information, the encoder is configured to determine, for the point cloud, a plurality of patches, each corresponding to portions of the point cloud, wherein each patch comprises points with surface normal vectors that deviate from one another less than a threshold amount. The encoder is further configured to, for each patch, generate a patch image comprising the set of points corresponding to the patch projected onto a patch plane and generate another patch image comprising depth information for the set of points corresponding to the patch, wherein the depth information represents depths of the points in a direction perpendicular to the patch plane.

For example, the patch image corresponding to the patch projected onto a patch plane may depict the points of the point cloud included in the patch in two directions, such as an X and Y direction. The points of the point cloud may be projected onto a patch plane approximately perpendicular to a normal vector, normal to a surface of the point cloud at the location of the patch. Also, for example, the patch image comprising depth information for the set of points included in the patch may depict depth information, such as depth distances in a Z direction. To depict the depth information, the depth patch image may include a parameter that varies in intensity based on the depth of points in the point cloud at a particular location in the patch image. For example, the patch image depicting depth information may have a same shape as the patch image representing points projected onto the patch plane. However, the depth information patch image may be an image comprising image attributes, such as one or more colors, that vary in intensity, wherein the intensity of the one or more image attributes corresponds to a depth of the point cloud at a location in the patch image where the image attribute is displayed in the patch image depicting depth. For example, points that are closer to the patch plane may be encoded as darker values in the patch image depicting depth and points that are further away from the patch plane may be encoded as brighter values in the patch image depicting depth, for example in a monochromatic patch image depicting depth. Thus, the depth information patch image when aligned with other patch images representing points projected onto the patch plane may indicate the relative depths of the points projected onto the patch plane, based on respective image attribute intensities at locations in the depth patch image that correspond to locations of the points in the other patch images comprising point cloud points projected onto the patch plane.

The encoder is further configured to pack generated patch images (including a depth patch image and, optionally, one or more additional patch images for one or more other attributes) for each of the determined patches into one or more image frames and encode the one or more image frames. In some embodiments, the encoder may utilize various image or video encoding techniques to encode the one or more image frames. For example, the encoder may utilize a video encoder in accordance with the High Efficiency Video Coding (HEVC/H.265) standard or other suitable standards such as, the Advanced Video Coding (AVC/H.265) standard, the AOMedia Video 1 (AV1) video coding format produced by the Alliance for Open Media (AOM), etc. In some embodiments, the encoder may utilize an image encoder in accordance with a Motion Picture Experts Group (VIPEG), a Joint Photography Experts Group (JPEG) standard, an International Telecommunication Union-Telecommunication standard (e.g. ITU-T standard), etc.

In some embodiments, a decoder is configured to receive one or more encoded image frames comprising patch images for a plurality of patches of a compressed point cloud, wherein, for each patch, the one or more encoded image frames comprise: a patch image comprising a set of points of the patch projected onto a patch plane and a patch image comprising depth information for the set of points of the patch, wherein the depth information indicates depths of the points of the patch in a direction perpendicular to the patch plane. In some embodiments, a depth patch image may be packed into an image frame with other attribute patch images. For example, a decoder may receive one or more image frames comprising packed patch images as generated by the encoder described above.

The decoder is further configured to decode the one or more encoded image frames comprising the patch images. In some embodiments, the decoder may utilize a video decoder in accordance with the High Efficiency Video Coding (HEVC) standard or other suitable standards such as, the Advanced Video Coding (AVC) standard, the AOMedia Video 1 (AV1) video coding format, etc. In some embodiments, the decoder may utilize an image decoder in accordance with a Motion Picture Experts Group (MPEG) or a Joint Photography Experts Group (JPEG) standard, etc.

The decoder is further configured to determine, for each patch, spatial information for the set of points of the patch based, at least in part, on the patch image comprising the set of points of the patch projected onto the patch plane and the patch image comprising the depth information for the set of points of the patch, and generate a decompressed version of the compressed point cloud based, at least in part, on the determined spatial information for the plurality of patches and the attribute information included in the patches.

In some embodiments, a method includes receiving one or more encoded image frames comprising patch images for a plurality of patches of a compressed point cloud, wherein, for each patch, the one or more encoded image frames comprise: a patch image comprising a set of points of the patch projected onto a patch plane and a patch image comprising depth information for the set of points of the patch, wherein the depth information indicates depths of the points of the patch in a direction perpendicular to the patch plane. The method further includes decoding the one or more encoded image frames comprising the patch images. In some embodiments, decoding may be performed in accordance with the High Efficiency Video Coding (HEVC) standard or other suitable standards such as, the Advanced Video Coding (AVC) standard, an AOMedia Video 1 (AV1) video coding format, etc. In some embodiments, decoding may be performed in accordance with a Motion Picture Experts Group (MPEG) or a Joint Photography Experts Group (JPEG) standard, etc.

The method further includes determining, for each patch, spatial information for the set of points of the patch based, at least in part, on the patch image comprising the set of points of the patch projected onto the patch plane and the patch image comprising the depth information for the set of points of the patch, and generating a decompressed version of the compressed point cloud based, at least in part, on the determined spatial information for the plurality of patches.

In some embodiments, a non-transitory computer-readable medium stores program instructions that, when executed by one or more processors, cause the one or more processors to implement an encoder as described herein to compress attribute information of a point cloud.

In some embodiments, a non-transitory computer-readable medium stores program instructions that, when executed by one or more processors, cause the one or more processors to implement a decoder as described herein to decompress attribute information of a point cloud.

BRIEF DESCRIPTION OF THE DRAWINGS

FIG. 5I illustrates an example closed loop rescaling with spatiotemporal scaling, according to some embodiments.

FIG. 7A illustrates an example of a PCCNAL unit based bit stream, according to some embodiments.

FIG. 7B illustrates an example of a PCCNAL units grouped by POC, according to some embodiments.

FIG. 7C illustrates an example of a PCCNAL unit grouped by type, according to some embodiments.

FIG. 12B illustrates example blocks and traversal patterns for compressing an occupancy map, according to some embodiments.

Figure 1:
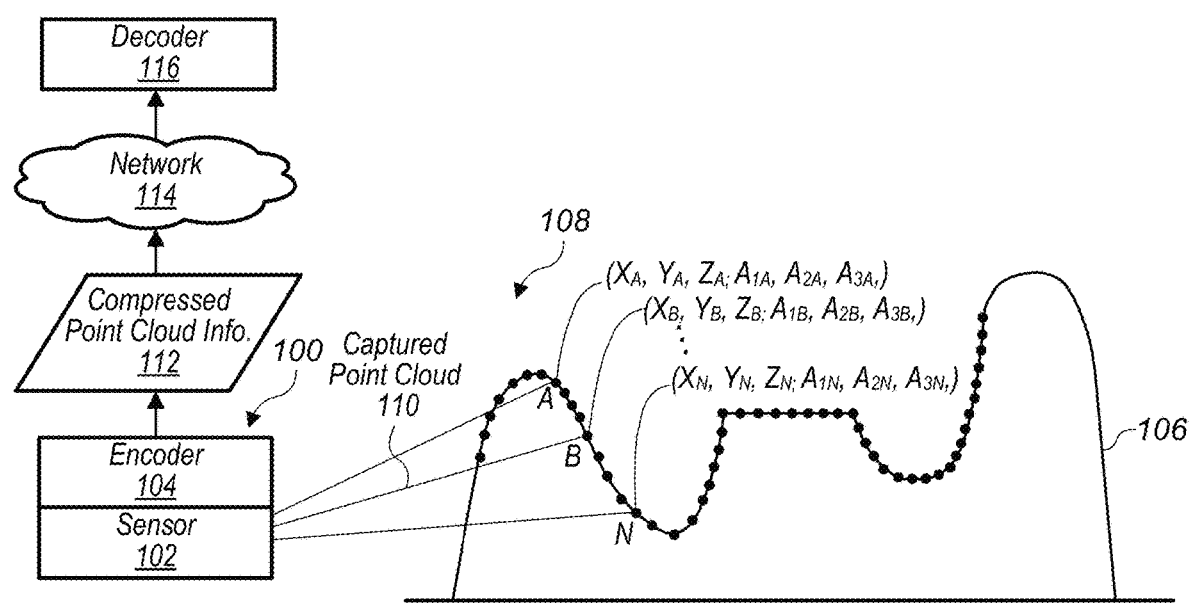
FIG. 1 illustrates a system comprising a sensor that captures information for points of a point cloud and an encoder that compresses spatial information and attribute information of the point cloud, where the compressed spatial and attribute information is sent to a decoder, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure "Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

As data acquisition and display technologies have become more advanced, the ability to capture point clouds comprising thousands or millions of points in 2-D or 3-D space, such as via LIDAR systems, has increased. Also, the development of advanced display technologies, such as virtual reality or augmented reality systems, has increased potential uses for point clouds. However, point cloud files are often very large and may be costly and time-consuming to store and transmit. For example, communication of point clouds over private or public networks, such as the Internet, may require considerable amounts of time and/or network resources, such that some uses of point cloud data, such as real-time uses, may be limited. Also, storage requirements of point cloud files may consume a significant amount of storage capacity of devices storing the point cloud files, which may also limit potential applications for using point cloud data.

In some embodiments, an encoder may be used to generate a compressed point cloud to reduce costs and time associated with storing and transmitting large point cloud files. In some embodiments, a system may include an encoder that compresses attribute and/or spatial information of a point cloud file such that the point cloud file may be stored and transmitted more quickly than non-compressed point clouds and in a manner that the point cloud file may occupy less storage space than non-compressed point clouds. In some embodiments, compression of attributes of points in a point cloud may enable a point cloud to be communicated over a network in real-time or in near real-time. For example, a system may include a sensor that captures attribute information about points in an environment where the sensor is located, wherein the captured points and corresponding attributes make up a point cloud. The system may also include an encoder that compresses the captured point cloud attribute information. The compressed attribute information of the point cloud may be sent over a network in real-time or near real-time to a decoder that decompresses the compressed attribute information of the point cloud. The decompressed point cloud may be further processed, for example to make a control decision based on the surrounding environment at the location of the sensor. The control decision may then be communicated back to a device at or near the location of the sensor, wherein the device receiving the control decision implements the control decision in real-time or near real-time. In some embodiments, the decoder may be associated with an augmented reality system and the decompressed attribute information may be displayed or otherwise used by the augmented reality system. In some embodiments, compressed attribute information for a point cloud may be sent with compressed spatial information for points of the point cloud. In other embodiments, spatial information and attribute information may be separately encoded and/or separately transmitted to a decoder.

In some embodiments, a system may include a decoder that receives one or more sets of point cloud data comprising compressed attribute information via a network from a remote server or other storage device that stores the one or more point cloud files. For example, a 3-D display, a holographic display, or a head-mounted display may be manipulated in real-time or near real-time to show different portions of a virtual world represented by point clouds. In order to update the 3-D display, the holographic display, or the head-mounted display, a system associated with the decoder may request point cloud data from the remote server based on user manipulations of the displays, and the point cloud data may be transmitted from the remote server to the decoder and decoded by the decoder in real-time or near real-time. The displays may then be updated with updated point cloud data responsive to the user manipulations, such as updated point attributes.

In some embodiments, a system, may include one or more LIDAR systems, 3-D cameras, 3-D scanners, etc., and such sensor devices may capture spatial information, such as X, Y, and Z coordinates for points in a view of the sensor devices. In some embodiments, the spatial information may be relative to a local coordinate system or may be relative to a global coordinate system (for example, a Cartesian coordinate system may have a fixed reference point, such as a fixed point on the earth, or may have a non-fixed local reference point, such as a sensor location).

In some embodiments, such sensors may also capture attribute information for one or more points, such as color attributes, reflectivity attributes, velocity attributes, acceleration attributes, time attributes, modalities, and/or various other attributes. In some embodiments, other sensors, in addition to LIDAR systems, 3-D cameras, 3-D scanners, etc., may capture attribute information to be included in a point cloud. For example, in some embodiments, a gyroscope or accelerometer, may capture motion information to be included in a point cloud as an attribute associated with one or more points of the point cloud. For example, a vehicle equipped with a LIDAR system, a 3-D camera, or a 3-D scanner may include the vehicle's direction and speed in a point cloud captured by the LIDAR system, the 3-D camera, or the 3-D scanner. For example, when points in a view of the vehicle are captured they may be included in a point cloud, wherein the point cloud includes the captured points and associated motion information corresponding to a state of the vehicle when the points were captured.

In some embodiments, the one or more patch images may comprise attribute and/or spatial information of the point cloud projected onto the patch image using one or more projections. For example, projections may include cylindrical or spherical projections, wherein the point cloud is projected onto a cylinder or sphere. Also, in some embodiments, multiple parallel projections of the point cloud may be used to generate patch images for the point cloud, wherein the multiple projections are known by or signaled to a decoder.

In some embodiments, the encoder may further encode a "mask" that indicates active/available points or regions and non-active/non-available points or regions of an image frame comprising the respective projections. For example the active/available points or regions may correspond to patches packed in the image frame and non-active/non-available regions could correspond to padding areas between or around the patches. For example, the encoder may be configured to encode the one or more image frames and encode information indicating regions of the one or more image frames that correspond to active regions or non-active regions of the one or more image frames, wherein regions that are covered by the padding are indicated as non-active regions. In some embodiments, the encoder may vary an amount of encoding resources budgeted to encode portions of the one or more image frames, based, at least in part, on whether the portions of the one or more image frames comprise active or non-active regions or points. In some embodiments, padded spaces may be considered non-action regions of the one or more image frames. Also, in some embodiments, points of a point cloud being compressed that are not visible from a particular point of view may be considered non-active points of the point cloud, and an encoder may indicate that the points are non-active in the particular point of view. Also, a decoder may budget fewer or no resources to decoding the non-active points when the point cloud is being viewed from the particular point of view.

In some embodiments, a decoder may be configured to receive one or more encoded image frames comprising patch images for a compressed point cloud and padding in portions of the or more images that is not occupied by the patch images and decode the one or more encoded image frames, wherein less decoding resources are allocated to decoding the padded portions of the one or more images than are allocated to decoding the patch image portions of the one or more image frames.

In some embodiments, a method includes receiving one or more encoded image frames comprising patch images for a compressed point cloud and padding in portions of the one or more images that are not occupied by patch images and decoding the one or more encoded image frames, wherein less decoding resources are allocated to decoding the padded portions of the one or more images than are allocated to decoding the patch image portions of the one or more image frames. The method further includes generating a decompressed version of the compressed point cloud based, at least in part, on the decoded patch images.

In some embodiments, a method for compressing attribute and/or spatial information for a point cloud includes projecting the point cloud onto multiple projections and encoding the projections. For example, projections may include cylindrical or spherical projections, wherein the point cloud is projected onto a cylinder or sphere. Also, in some embodiments, multiple parallel projections of the point cloud may be encoded, wherein the multiple projections are known by or signaled to a decoder. In some embodiments, the method may further include determining one or more "masks" that indicate active/available points or regions and non-active/non-available points or regions in the respective projections. The method may further comprise encoding data indicating the one or more masks.

In some embodiments, a non-transitory computer-readable medium stores program instructions that, when executed by one or more processors, cause the one or more processors to project a point cloud onto multiple projections and encode the projections. The program instructions may further cause the one or more processors to determine one or more masks that indicate active/available points or regions and non-active/non-available points or regions in the respective projections and encode data indicating the one or more masks. For example, in some embodiments, a non-transitory computer-readable medium may store program instructions that, when executed by one or more processors, cause the one or more processors to implement an encoder or decoder as described herein.

In some embodiments, points of a point cloud may be in a same or nearly same location when projected onto a patch plane. For example, the point cloud might have a depth such that some points are in the same location relative to the patch plane, but at different depths. In such embodiments, multiple patches may be generated for different layers of the point cloud. In some embodiments, subsequent layered patches may encode differences between a previous patch layer, such that the subsequent patch layers do not repeat the full amount of data encoded in the previous patch layer(s). Thus, subsequent patch layers may have significantly smaller sizes than initial patch layers.

In some embodiments, colors of patch images packed into image frames may be converted into a different color space or may be sub-sampled to further compress the image frames. For example, in some embodiments an image frame in a 4:4:4 R'G'B' color space may be converted into a 4:2:0 YCbCr color representation. Additionally, a color conversion process may determine an optimal luma value and corresponding chroma values for converting image frames between color spaces. For example, an optimal luma value may be selected that reduces a converted size of the image frame while minimizing distortion of the decompressed point cloud colors as compared to an original non-compressed point cloud. In some embodiments, an iterative approach may be used to determine an optimal luma value. In other embodiments, one or more optimization equations may be applied to determine an optimal luma and corresponding chroma values.

Such a system may further account for distortion caused by projecting a point cloud onto patches and packing the patches into image frames. Additionally, such a system may account for distortion caused by video encoding and/or decoding the image frames comprising packed patches. To do this, a closed-loop color conversion module may take as an input a reference point cloud original color and a video compressed image frame comprising packed patches, wherein the packed patches of the image frame have been converted from a first color space to a second color space. The closed-loop color conversion module may decompress the compressed image frame using a video decoder and furthermore reconstruct the original point cloud using the decompressed image frames. The closed-loop color conversion module may then determine color values for points of the decompressed point cloud based on attribute and/or texture information included in the decompressed patches of the decompressed image frames (in the converted color space). The closed-loop color conversion module may then compare the down sampled and up sampled colors of the reconstructed point cloud to the colors of the original non-compressed point cloud. Based on this comparison, the closed-loop color conversion module may then adjust one or more parameters used to convert the image frames from the original color space to the second color space, wherein the one or more parameters are adjusted to improve quality of the final decompressed point cloud colors and to reduce the size of the compressed point cloud.

Example System Arrangement

FIG. 1 illustrates a system comprising a sensor that captures information for points of a point cloud and an encoder that compresses attribute information of the point cloud, where the compressed attribute information is sent to a decoder, according to some embodiments.

System 100 includes sensor 102 and encoder 104. Sensor 102 captures a point cloud 110 comprising points representing structure 106 in view 108 of sensor 102. For example, in some embodiments, structure 106 may be a mountain range, a building, a sign, an environment surrounding a street, or any other type of structure. In some embodiments, a captured point cloud, such as captured point cloud 110, may include spatial and attribute information for the points included in the point cloud. For example, point A of captured point cloud 110 comprises X, Y, Z coordinates and attributes 1, 2, and 3. In some embodiments, attributes of a point may include attributes such as R, G, B color values, a velocity at the point, an acceleration at the point, a reflectance of the structure at the point, a time stamp indicating when the point was captured, a string-value indicating a modality when the point was captured, for example "walking", or other attributes. The captured point cloud 110 may be provided to encoder 104, wherein encoder 104 generates a compressed version of the point cloud (compressed attribute information 112) that is transmitted via network 114 to decoder 116. In some embodiments, a compressed version of the point cloud, such as compressed attribute information 112, may be included in a common compressed point cloud that also includes compressed spatial information for the points of the point cloud or, in some embodiments, compressed spatial information and compressed attribute information may be communicated as separate sets of data.

In some embodiments, encoder 104 may be integrated with sensor 102. For example, encoder 104 may be implemented in hardware or software included in a sensor device, such as sensor 102. In other embodiments, encoder 104 may be implemented on a separate computing device that is proximate to sensor 102.

Example Intra-Frame Encoder

Figure 2A:
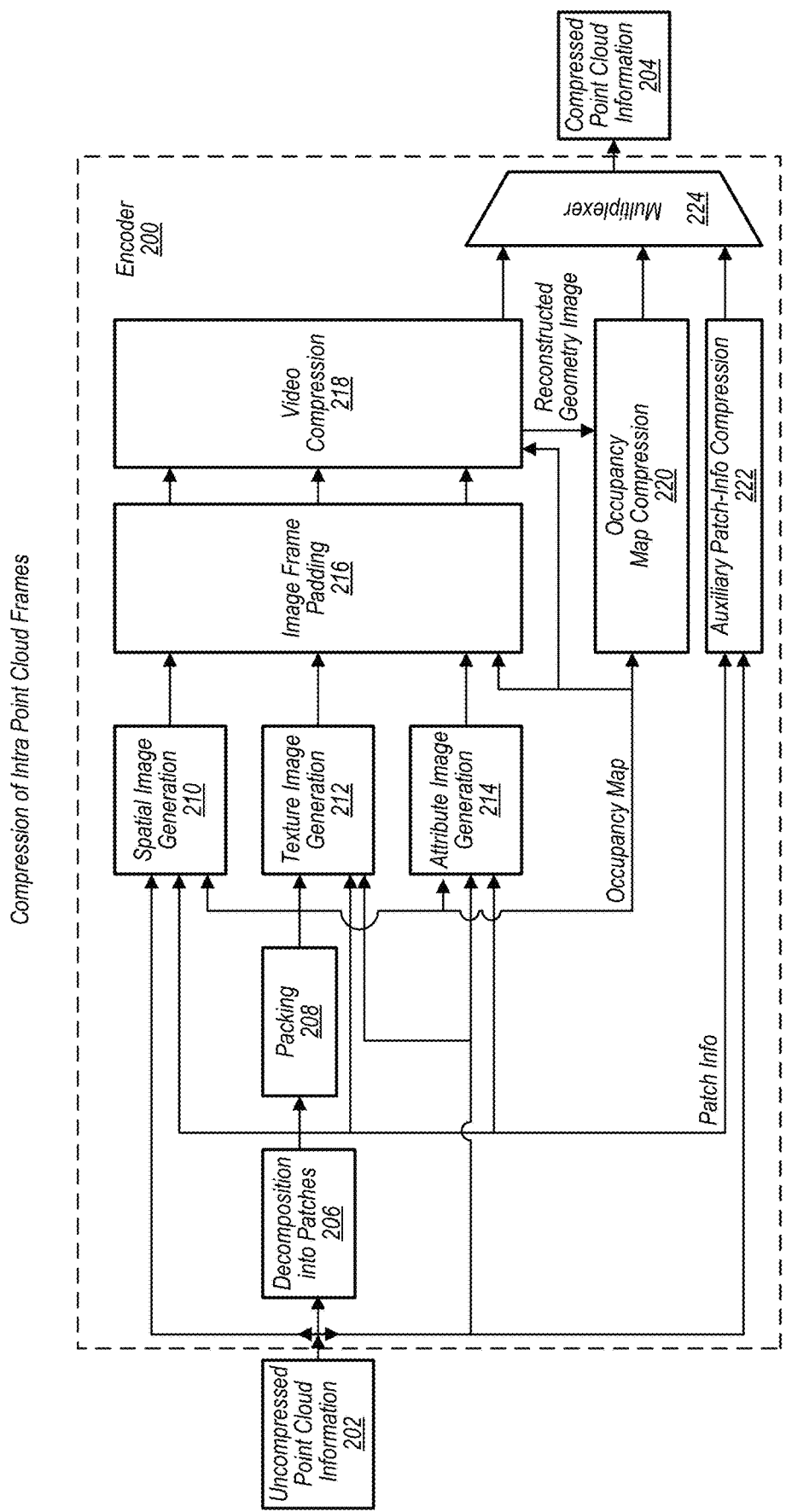
FIG. 2A illustrates components of an encoder for encoding intra point cloud frames, according to some embodiments.

FIG. 2A illustrates components of an encoder for encoding intra point cloud frames, according to some embodiments. In some embodiments, the encoder described above in regard to FIG. 1 may operate in a similar manner as encoder 200 described in FIG. 2A and encoder 250 described in FIG. 2C.

The encoder 200 receives uncompressed point cloud 202 and generates compressed point cloud information 204. In some embodiments, an encoder, such as encoder 200, may receive the uncompressed point cloud 202 from a sensor, such as sensor 102 illustrated in FIG. 1, or, in some embodiments, may receive the uncompressed point cloud 202 from another source, such as a graphics generation component that generates the uncompressed point cloud in software, as an example.

In some embodiments, an encoder, such as encoder 200, includes decomposition into patches module 206, packing module 208, spatial image generation module 210, texture image generation module 212, and attribute information generation module 214. In some embodiments, an encoder, such as encoder 200, also includes image frame padding module 216, video compression module 218 and multiplexer 224. In addition, in some embodiments an encoder, such as encoder 200, may include an occupancy map compression module, such as occupancy map compression module 220, and an auxiliary patch information compression module, such as auxiliary patch information compression module 222. In some embodiments, an encoder, such as encoder 200, converts a 3D point cloud into an image-based representation along with some meta data (e.g., occupancy map and patch info) necessary to convert the compressed point cloud back into a decompressed point cloud.

In some embodiments, the conversion process decomposes the point cloud into a set of patches (e.g., a patch is defined as a contiguous subset of the surface described by the point cloud), which may be overlapping or not, such that each patch may be described by a depth field with respect to a plane in 2D space. More details about the patch decomposition process are provided above with regard to FIGS. 3A-3C.

After or in conjunction with the patches being determined for the point cloud being compressed, a 2D sampling process is performed in planes associated with the patches. The 2D sampling process may be applied in order to approximate each patch with a uniformly sampled point cloud, which may be stored as a set of 2D patch images describing the geometry/texture/attributes of the point cloud at the patch location. The "Packing" module 208 may store the 2D patch images associated with the patches in a single (or multiple) 2D images, referred to herein as "image frames." In some embodiments, a packing module, such as packing module 208, may pack the 2D patch images such that the packed 2D patch images do not overlap (even though an outer bounding box for one patch image may overlap an outer bounding box for another patch image). Also, the packing module may pack the 2D patch images in a way that minimizes non-used images pixels of the image frame.

In some embodiments, "Geometry/Texture/Attribute generation" modules, such as modules 210, 212, and 214, generate 2D patch images associated with the geometry/texture/attributes, respectively, of the point cloud at a given patch location. As noted before, a packing process, such as performed by packing module 208, may leave some empty spaces between 2D patch images packed in an image frame. Also, a padding module, such as image frame padding module 216, may fill in such areas in order to generate an image frame that may be suited for 2D video and image codecs.

In some embodiments, an occupancy map (e.g., binary information describing for each pixel or block of pixels whether the pixel or block of pixels are padded or not) may be generated and compressed, for example by occupancy map compression module 220. The occupancy map may be sent to a decoder to enable the decoder to distinguish between padded and non-padded pixels of an image frame.

Note that other metadata associated with patches may also be sent to a decoder for use in the decompression process. For example, patch information indicating sizes and shapes of patches determined for the point cloud and packed in an image frame may be generated and/or encoded by an auxiliary patch-information compression module, such as auxiliary patch-information compression module 222. In some embodiments one or more image frames may be encoded by a video encoder, such as video compression module 218. In some embodiments, a video encoder, such as video compression module 218, may operate in accordance with the High Efficiency Video Coding (HEVC) standard or other suitable video encoding standard. In some embodiments, encoded video images, encoded occupancy map information, and encoded auxiliary patch information may be multiplexed by a multiplexer, such as multiplexer 224, and provided to a recipient as compressed point cloud information, such as compressed point cloud information 204.

In some embodiments, an occupancy map may be encoded and decoded by a video compression module, such as video compression module 218. This may be done at an encoder, such as encoder 200, such that the encoder has an accurate representation of what the occupancy map will look like when decoded by a decoder. Also, variations in image frames due to lossy compression and decompression may be accounted for by an occupancy map compression module, such as occupancy map compression module 220, when determining an occupancy map for an image frame. In some embodiments, various techniques may be used to further compress an occupancy map, such as described in FIGS. 12A-12M.

Example Intra-Frame Decoder

Figure 2B:
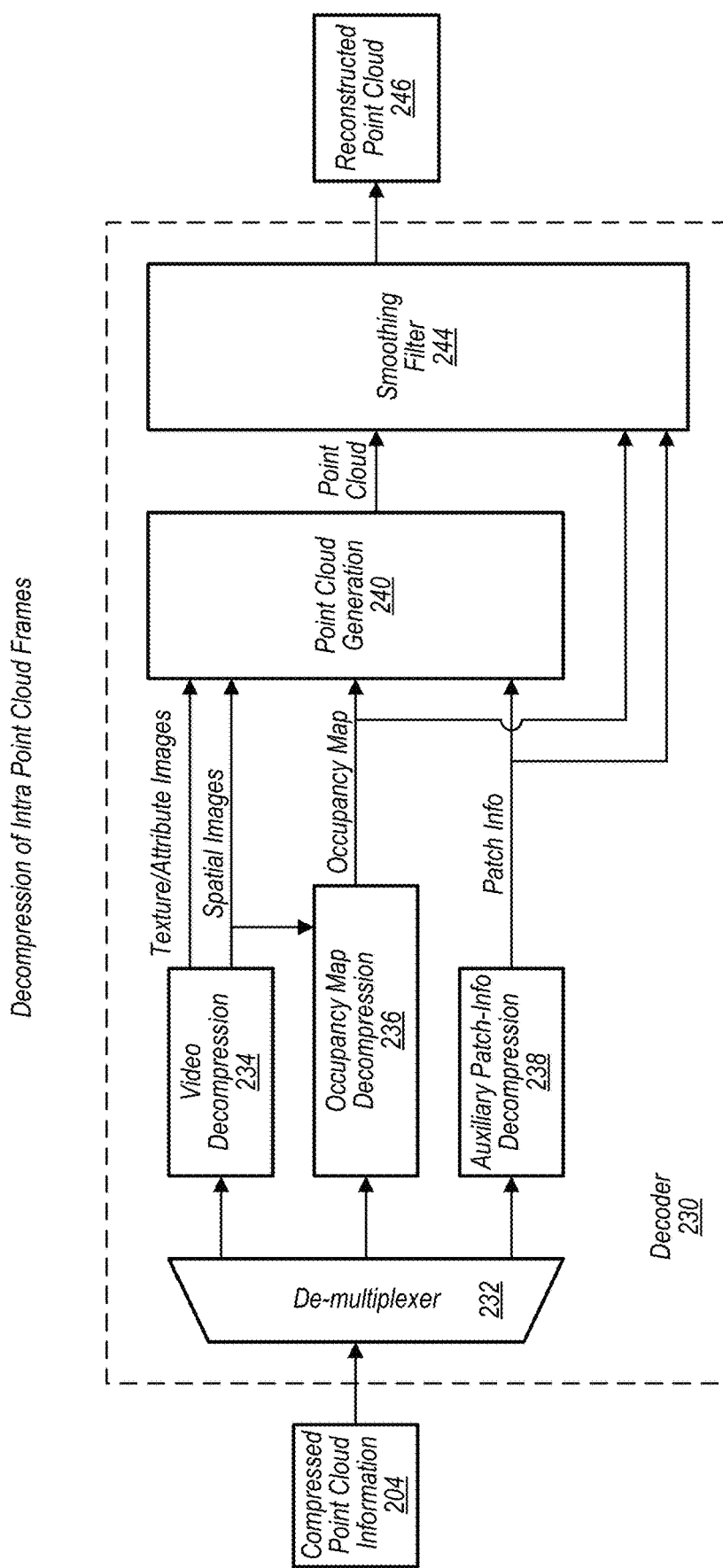
FIG. 2B illustrates components of a decoder for decoding intra point cloud frames, according to some embodiments.

FIG. 2B illustrates components of a decoder for decoding intra point cloud frames, according to some embodiments. Decoder 230 receives compressed point cloud information 204, which may be the same compressed point cloud information 204 generated by encoder 200. Decoder 230 generates reconstructed point cloud 246 based on receiving the compressed point cloud information 204.

In some embodiments, a decoder, such as decoder 230, includes a de-multiplexer 232, a video decompression module 234, an occupancy map decompression module 236, and an auxiliary patch-information decompression module 238. Additionally a decoder, such as decoder 230 includes a point cloud generation module 240, which reconstructs a point cloud based on patch images included in one or more image frames included in the received compressed point cloud information, such as compressed point cloud information 204. In some embodiments, a decoder, such as decoder 203, further comprises a smoothing filter, such as smoothing filter 244. In some embodiments, a smoothing filter may smooth incongruences at edges of patches, wherein data included in patch images for the patches has been used by the point cloud generation module to recreate a point cloud from the patch images for the patches. In some embodiments, a smoothing filter may be applied to the pixels located on the patch boundaries to alleviate the distortions that may be caused by the compression/decompression process.

Example Inter-Frame Encoder

Figure 2C:
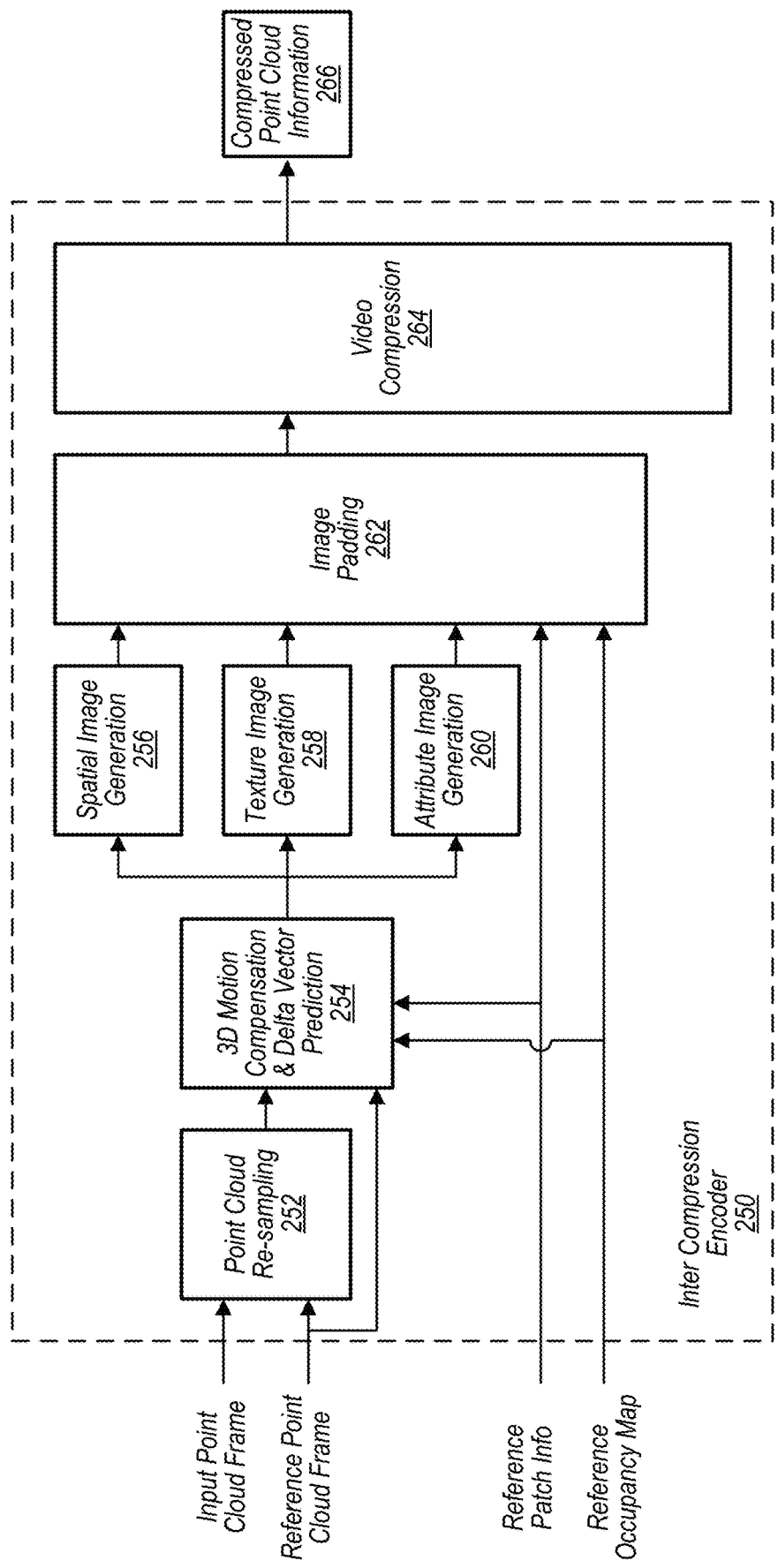
FIG. 2C illustrates components of an encoder for encoding inter point cloud frames, according to some embodiments.

FIG. 2C illustrates components of an encoder for encoding inter point cloud frames, according to some embodiments. An inter point cloud encoder, such as inter point cloud encoder 250, may encode an image frame, while considering one or more previously encoded/decoded image frames as references.

In some embodiments, an encoder for inter point cloud frames, such as encoder 250, includes a point cloud re-sampling module 252, a 3-D motion compensation and delta vector prediction module 254, a spatial image generation module 256, a texture image generation module 258, and an attribute image generation module 260. In some embodiments, an encoder for inter point cloud frames, such as encoder 250, may also include an image padding module 262 and a video compression module 264. An encoder for inter point cloud frames, such as encoder 250, may generate compressed point cloud information, such as compressed point cloud information 266. In some embodiments, the compressed point cloud information may reference point cloud information previously encoded by the encoder, such as information from or derived from one or more reference image frames. In this way an encoder for inter point cloud frames, such as encoder 250, may generate more compact compressed point cloud information by not repeating information included in a reference image frame, and instead communicating differences between the reference frames and a current state of the point cloud.

In some embodiments, an encoder, such as encoder 250, may be combined with or share modules with an intra point cloud frame encoder, such as encoder 200. In some embodiments, a point cloud re-sampling module, such as point cloud re-sampling module 252, may resample points in an input point cloud image frame in order to determine a one-to-one mapping between points in patches of the current image frame and points in patches of a reference image frame for the point cloud. In some embodiments, a 3D motion compensation & delta vector prediction module, such as a 3D motion compensation & delta vector prediction module 254, may apply a temporal prediction to the geometry/texture/attributes of the resampled points of the patches. The prediction residuals may be stored into images, which may be padded and compressed by using video/image codecs. In regard to spatial changes for points of the patches between the reference frame and a current frame, a 3D motion compensation & delta vector prediction module 254, may determine respective vectors for each of the points indicating how the points moved from the reference frame to the current frame. A 3D motion compensation & delta vector prediction module 254, may then encode the motion vectors using different image parameters. For example, changes in the X direction for a point may be represented by an amount of red included at the point in a patch image that includes the point. In a similar manner, changes in the Y direction for a point may be represented by an amount of blue included at the point in a patch image that includes the point. Also, in a similar manner, changes in the Z direction for a point may be represented by an amount of green included at the point in a patch image that includes the point. In some embodiments, other characteristics of an image included in a patch image may be adjusted to indicate motion of points included in the patch between a reference frame for the patch and a current frame for the patch.

Example Inter-Frame Decoder

Figure 2D:
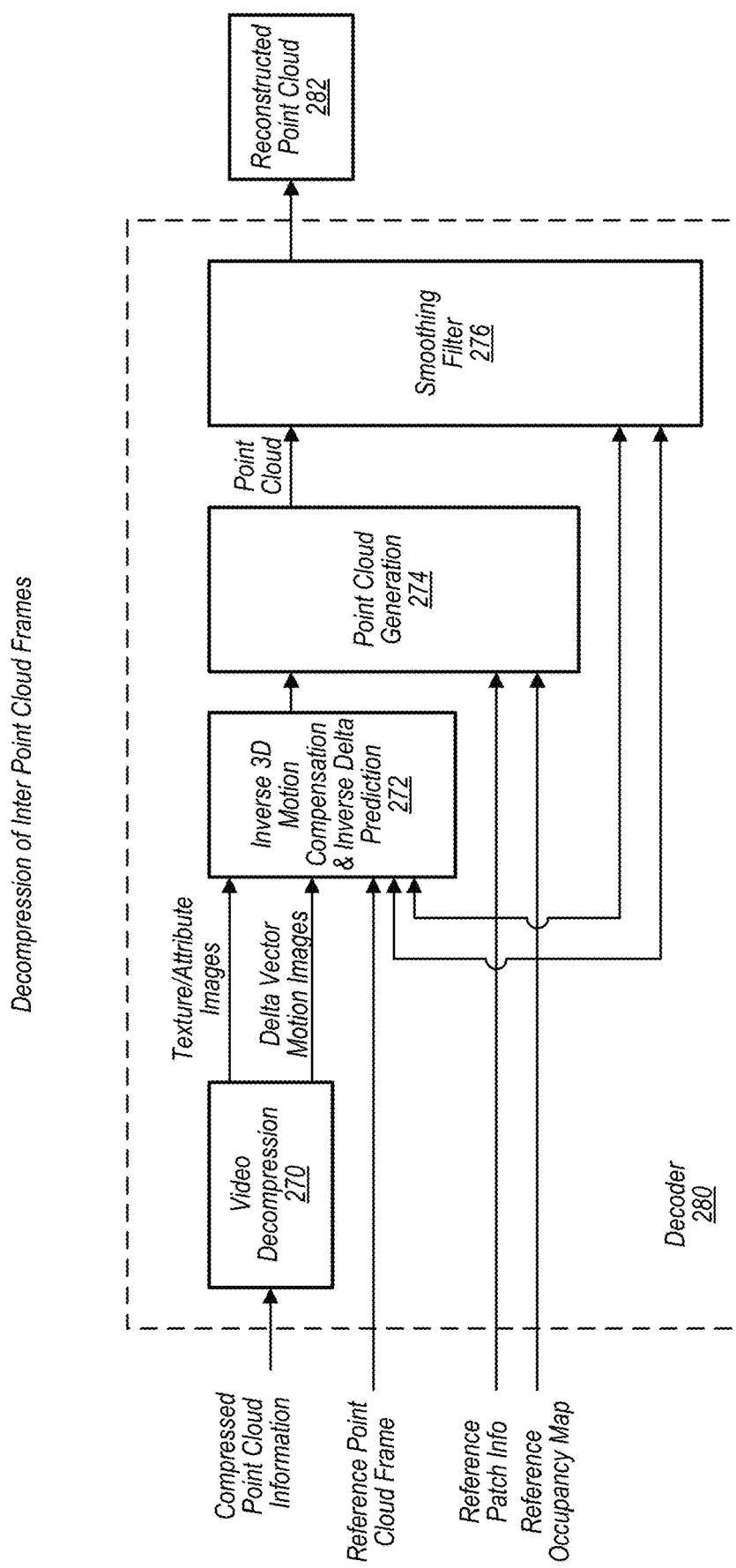
FIG. 2D illustrates components of a decoder for decoding inter point cloud frames, according to some embodiments.

FIG. 2D illustrates components of a decoder for decoding inter point cloud frames, according to some embodiments. In some embodiments, a decoder, such as decoder 280, includes a video decompression module 270, an inverse 3D motion compensation and inverse delta prediction module 272, a point cloud generation module 274, and a smoothing filter 276. In some embodiments, a decoder, such as decoder 280 may be combined with a decoder, such as decoder 230, or may share some components with the decoder, such as a video decompression module and/or smoothing filter. In decoder 280, the video/image streams are first decoded, then an inverse motion compensation and delta prediction procedure may be applied. The obtained images are then used in order to reconstruct a point cloud, which may be smoothed as described previously to generate a reconstructed point cloud 282.

Segmentation Process

Figure 3A:
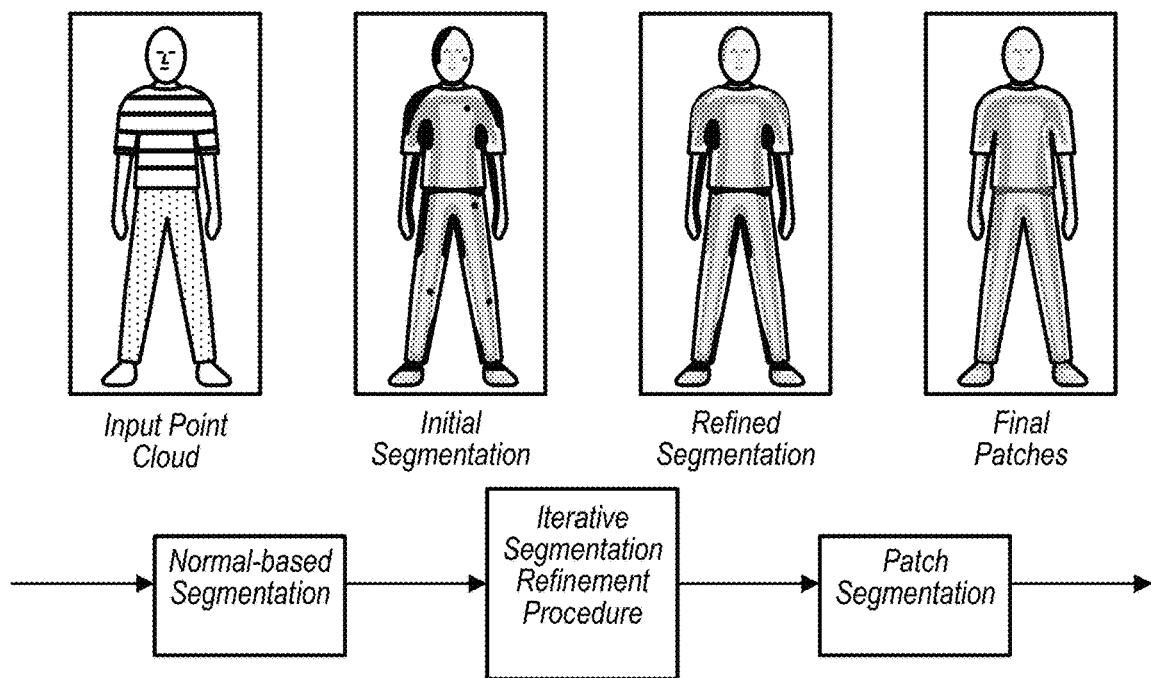
FIG. 3A illustrates an example patch segmentation process, according to some embodiments.

FIG. 3A illustrates an example segmentation process for determining patches for a point cloud, according to some embodiments. The segmentation process as described in FIG. 3A may be performed by a decomposition into patches module, such as decomposition into patches module 206. A segmentation process may decompose a point cloud into a minimum number of patches (e.g., a contiguous subset of the surface described by the point cloud), while making sure that the respective patches may be represented by a depth field with respect to a patch plane. This may be done without a significant loss of shape information.

In some embodiments, a segmentation process comprises:
Letting point cloud PC be the input point cloud to be partitioned into patches and {P(0), P(1) . . . , P(N−1)} be the positions of points of point cloud PC.

In some embodiments, a fixed set D={D(0), D(1), . . . , D(K−1)} of K 3D orientations is pre-defined. For instance, D may be chosen as follows D={(1.0, 0.0, 0.0), (0.0, 1.0, 0.0), (0.0, 0.0, 1.0), (−1.0, 0.0, 0.0), (0.0, −1.0, 0.0), (0.0, 0.0, −1.0)}

In some embodiments, the normal vector to the surface at every point P(i) is estimated. Any suitable algorithm may be used to determine the normal vector to the surface. For instance, a technique could include fetching the set H of the "N" nearest points of P(i), and fitting a plane Π(i) to H(i) by using principal component analysis techniques. The normal to P(i) may be estimated by taking the normal ∇(i) to Π(i). Note that "N" may be a user-defined parameter or may be found by applying an optimization procedure. "N" may also be fixed or adaptive. The normal values may then be oriented consistently by using a minimum-spanning tree approach.

Normal-based Segmentation: An initial segmentation S0 of the points of point cloud PC may be obtained by associating respective points with the direction D(k) which maximizes the score $\langle \nabla(i) | D(k) \rangle$, where $\langle \cdot | \cdot \rangle$ is the canonical dot product of R3. Pseudo code is provided below.

```
for (i = 0; i < pointCount; ++i) {
    clusterIndex = 0;
    bestScore = 〈 ∇(i)|D(0) 〉;
    for(j = 1; j < K; ++j) {
        score = 〈 ∇(i)|D(j) 〉;
        if (score > bestScore) {
            bestScore = score;
            clusterIndex = j;
        }
    }
    partition[i] = clusterIndex;
}
```

Iterative segmentation refinement: Note that segmentation S0 associates respective points with the plane Π(i) that best preserves the geometry of its neighborhood (e.g. the neighborhood of the segment). In some circumstances, segmentation S0 may generate too many small connected components with irregular boundaries, which may result in poor compression performance. In order to avoid such issues, the following iterative segmentation refinement procedure may be applied:

1. An adjacency graph A may be built by associating a vertex V(i) to respective points P(i) of point cloud PC and by adding R edges {E(i,j(0)), . . . , E(i,j(R−1)} connecting vertex V(i) to its nearest neighbors {V(j(0)), V(j(1)), . . . , V(j(R−1))}. More precisely, {V(j(0)), V(j(1)), . . . , V(j(R−1))} may be the vertices associated with the points {P(j(0)), P(j(1)), . . . , P(j(R−1))}, which may be the nearest neighbors of P(i). Note that R may be a user-defined parameter or may be found by applying an optimization procedure. It may also be fixed or adaptive.

2. At each iteration, the points of point cloud PC may be traversed and every vertex may be associated with the direction D (k) that maximizes $$\left( \langle \nabla(i) | D(k) \rangle + \frac{\lambda}{R} \left| \zeta(i) \right| \right),$$

where |ζ(i)| is the number of the R-nearest neighbors of V(i) belonging to the same cluster and A is a parameter controlling the regularity of the produced patches. Note that the parameters A and R may be defined by the user or may be determined by applying an optimization procedure. They may also be fixed or adaptive. In some embodiments, a "user" as referred to herein may be an engineer who configured a point cloud compression technique as described herein to one or more applications.

3. An example of pseudo code is provided below

```
for(I = 0; I < iterationCount; ++I) {
    for(i = 0; i < pointCount; ++i) {
        clusterIndex = partition[i];
        bestScore = 0.0;
        for(k = 0; k < K; ++k) {
            score = 〈∇(i)|D(k)〉;
            for(j ∈ {j(0), j(1), . . . , j(R − 1)}) {
                if (k == partition[j]) { score += λ/R;

}
            }
            if (score > bestScore) {
                bestScore = score;
                clusterIndex = k;
            }
        }
        partition[i] = clusterIndex;
    }
}
```

*In some embodiments, the pseudo code shown above may further include an early termination step. For example, if a score that is a particular value is reached, or if a difference between a score that is reached and a best score only changes by a certain amount or less, the search could be terminated early. Also, the search could be terminated if after a certain number of iterations (l=m), the clusterindex does not change.

Patch segmentation: In some embodiments, the patch segmentation procedure further segments the clusters detected in the previous steps into patches, which may be represented with a depth field with respect to a projection plane. The approach proceeds as follows, according to some embodiments:

1. First, a cluster-based adjacency graph with a number of neighbors R' is built, while considering as neighbors only the points that belong to the same cluster. Note that R' may be different from the number of neighbors R used in the previous steps.

2. Next, the different connected components of the cluster-based adjacency graph are extracted. Only connected components with a number of points higher than a parameter α are considered. Let CC={CC(0), CC(1), . . . , CC(M−1)} be the set of the extracted connected components.

3. Respective connected component CC(m) inherits the orientation D(m) of the cluster it belongs to. The points of CC(m) are then projected on a projection plane having as normal the orientation D(m), while updating a depth map, which records for every pixel the depth of the nearest point to the projection plane.

4. An approximated version of CC(m), denoted C'(m), is then built by associating respective updated pixels of the depth map with a 3D point having the same depth. Let PC' be the point cloud obtained by the union of reconstructed connected components {CC'(0), CC'(1), . . . , CC'(M−1)}

5. Note that the projection reconstruction process may be lossy and some points may be missing. In order, to detect such points, every point P(i) of point cloud PC may be checked to make sure it is within a distance lower than a parameter δ from a point of PC'. If this is not the case, then P(i) may be marked as a missed point and added to a set of missed points denoted MP.

6. The steps 2-5 are then applied to the missed points MP. The process is repeated until MP is empty or CC is empty. Note that the parameters δ and α may be defined by the user or may be determined by applying an optimization procedure. They may also be fixed or adaptive.

7. A filtering procedure may be applied to the detected patches in order to make them better suited for compression. Example filter procedures may include:
   a. A smoothing filter based on the geometry/texture/attributes of the points of the patches (e.g., median filtering), which takes into account both spatial and temporal aspects.
   b. Discarding small and isolated patches.
   c. User-guided filtering.
   d. Other suitable smoothing filter techniques.

Layers

The image generation process described above consists of projecting the points belonging to each patch onto its associated projection plane to generate a patch image. This process could be generalized to handle the situation where multiple points are projected onto the same pixel as follows:
   Let H(u, v) be the set of points of the current patch that get projected to the same pixel (u,v). Note that H(u, v) may be empty, may have one point or multiple points.
   If H(u, v) is empty then the pixel is marked as unoccupied.
   If the H(u, v) has a single element, then the pixel is filled with the associated geometry/texture/attribute value.
   If H(u,v), has multiple elements, then different strategies are possible:
      Keep only the nearest point P0(u,v) for the pixel (u,v)
      Take the average or a linear combination of a group of points that are within a distance d from P0(u,v), where d is a user-defined parameter needed only on the encoder side.
      Store two images: one for P0(u,v) and one to store the furthest point P1(u, v) of H(u, v) that is within a distance d from P0(u,v)
      Store N patch images containing a subset of H(u, v)

The generated patch images for point clouds with points at the same patch location, but different depths may be referred to as layers herein. In some embodiments, scaling/up-sampling/down-sampling could be applied to the produced patch images/layers in order to control the number of points in the reconstructed point cloud.

Guided up-sampling strategies may be performed on the layers that were down-sampled given the full resolution image from another "primary" layer that was not down-sampled.

Down-sampling could leverage the closed loop techniques as described below in regard to closed-loop color conversion, while exploiting a guided up-sampling strategy. For example, a generated layer may be encoded independently, which allows for parallel decoding and error resilience. Also encoding strategies, such as those specified by the scalable-HEVC standard, may be leveraged in order to support advanced functionalities such as spatial, SNR (signal to noise ratio), and color gamut scalability.

In some embodiments, a delta prediction between layers could be adaptively applied based on a rate-distortion optimization. This choice may be explicitly signaled in the bit stream.

In some embodiments, the generated layers may be encoded with different precisions. The precision of each layer may be adaptively controlled by using a shift+scale or a more general linear or non-linear transformation.

In some embodiments, an encoder may make decisions on a scaling strategy and parameters, which are explicitly encoded in the bit stream. The decoder may read the information from the bit stream and apply the right scaling process with the parameters signaled by the encoder.

In some embodiments, a video encoding motion estimation process may be guided by providing a motion vector map to the video encoder indicating for each block of the image frame, a 2D search center or motion vector candidates for the refinement search. Such information, may be trivial to compute since the mapping between the 3D frames and the 2D image frames is available to the point cloud encoder and a coarse mapping between the 2D image frames could be computed by using a nearest neighbor search in 3D.

The video motion estimation/mode decision/intra-prediction could be accelerated/improved by providing a search center map, which may provide guidance on where to search and which modes to choose from for each N×N pixel block.

Hidden/non-displayed pictures could be used in codecs such as AV1 and HEVC. In particular, synthesized patches could be created and encoded (but not displayed) in order to improve prediction efficiency. This could be achieved by re-using a subset of the padded pixels to store synthesized patches.

The patch re-sampling (e.g., packing and patch segmentation) process described above exploits solely the geometry information. A more comprehensive approach may take into account the distortions in terms of geometry, texture, and other attributes and may improve the quality of the re-sampled point clouds.

Instead of first deriving the geometry image and optimizing the texture image given said geometry, a joint optimization of geometry and texture could be performed. For example, the geometry patches could be selected in a manner that results in minimum distortion for both geometry and texture. This could be done by immediately associating each possible geometry patch with its corresponding texture patch and computing their corresponding distortion information. Rate-distortion optimization could also be considered if the target compression ratio is known.

In some embodiments, a point cloud resampling process described above may additionally consider texture and attributes information, instead of relying only on geometry.

Also, a projection-based transformation that maps 3D points to 2D pixels could be generalized to support arbitrary 3D to 2D mapping as follows:
   Store the 3D to 2D transform parameters or the pixel coordinates associated with each point
   Store X, Y, Z coordinates in the geometry images instead of or in addition to the depth information Packing In some embodiments, depth maps associated with patches, also referred to herein as "depth patch images," such as those described above, may be packed into a 2D image frame. For example, a packing module, such as packing module 208, may pack depth patch images generated by a spatial image generation module, such as spatial image generation module 210. The depth maps, or depth patch images, may be packed such that (A) no non-overlapping block of T×T pixels contains depth information from two different patches and such that (B) a size of the generated image frame is minimized.

In some embodiments, packing comprises the following steps:
 a. The patches are sorted by height and then by width. The patches are then inserted in image frame (I) one after the other in that order. At each step, the pixels of image frame (I) are traversed in raster order, while checking if the current patch could be inserted under the two conditions (A) and (B) described above. If it is not possible then the height of (I) is doubled.
 b. This process is iterated until all the patches are inserted.

In some embodiments, the packing process described above may be applied to pack a subset of the patches inside multiples tiles of an image frame or multiple image frames. This may allow patches with similar/close orientations based on visibility according to the rendering camera position to be stored in the same image frame/tile, to enable view-dependent streaming and/or decoding. This may also allow parallel encoding/decoding.

In some embodiments, the packing process can be considered a bin-packing problem and a first decreasing strategy as described above may be applied to solve the bin-packing problem. In other embodiments, other methods such as the modified first fit decreasing (MFFD) strategy may be applied in the packing process.

In some embodiments, if temporal prediction is used, such as described for inter compression encoder 250, such an optimization may be performed with temporal prediction/encoding in addition to spatial prediction/encoding. Such consideration may be made for the entire video sequence or per group of pictures (GOP). In the latter case additional constraints may be specified. For example, a constraint may be that the resolution of the image frames should not exceed a threshold amount. In some embodiments, additional temporal constraints may be imposed, even if temporal prediction is not used, for example such as that a patch corresponding to a particular object view is not moved more than x number of pixels from previous instantiations.

Figure 3B:
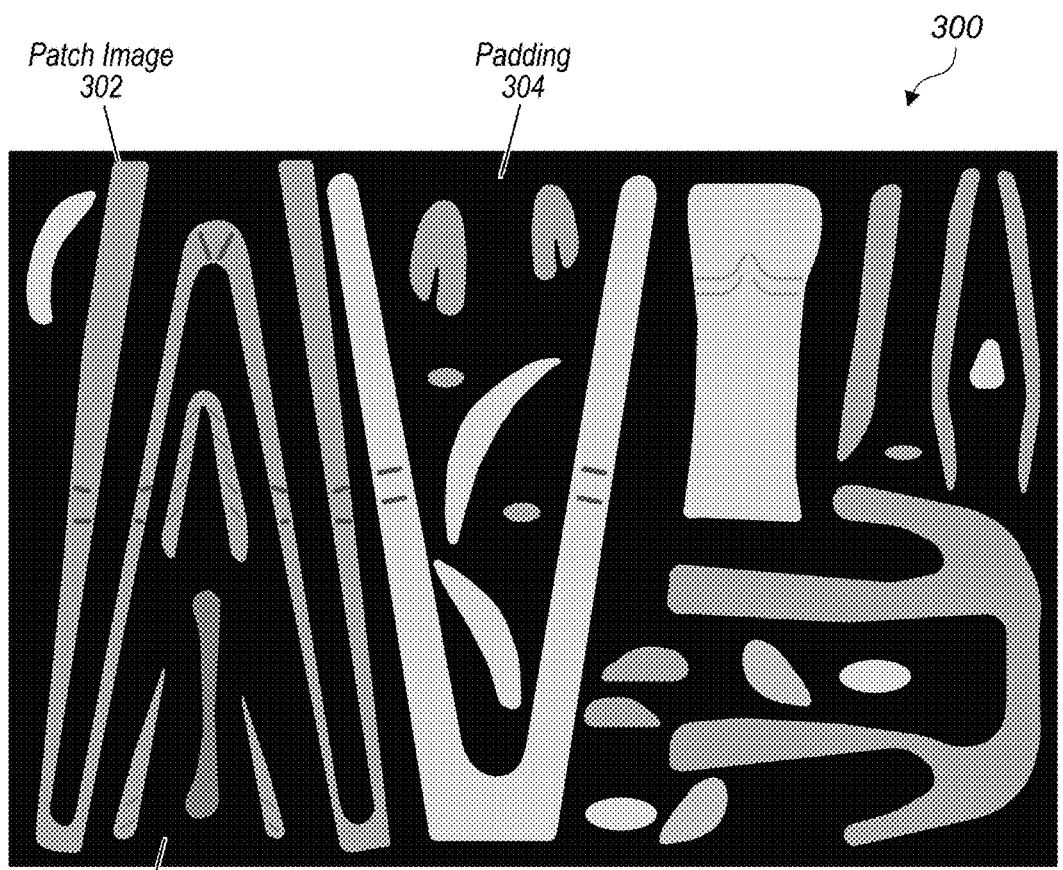
FIG. 3B illustrates an example image frame comprising packed patch images and padded portions, according to some embodiments.

FIG. 3B illustrates an example image frame comprising packed patch images and padded portions, according to some embodiments. Image frame 300 includes patch images 302 packed into image frame 300 and also includes padding 304 in space of image frame 300 not occupied by patch images. In some embodiments, padding, such as padding 304, may be determined so as to minimize incongruences between a patch image and the padding. For example, in some embodiments, padding may construct new pixel blocks that are replicas of, or are to some degree similar to, pixel blocks that are on the edges of patch images. Because an image and/or video encoder may encode based on differences between adjacent pixels, such an approach may reduce the number of bytes required to encode an image frame comprising of patch images and padding, in some embodiments.

In some embodiments, the patch information may be stored in the same order as the order used during the packing, which makes it possible to handle overlapping 2D bounding boxes of patches. Thus a decoder receiving the patch information can extract patch images from the image frame in the same order in which the patch images were packed into the image frame. Also, because the order is known by the decoder, the decoder can resolve patch image bounding boxes that overlap.

Figure 3C:
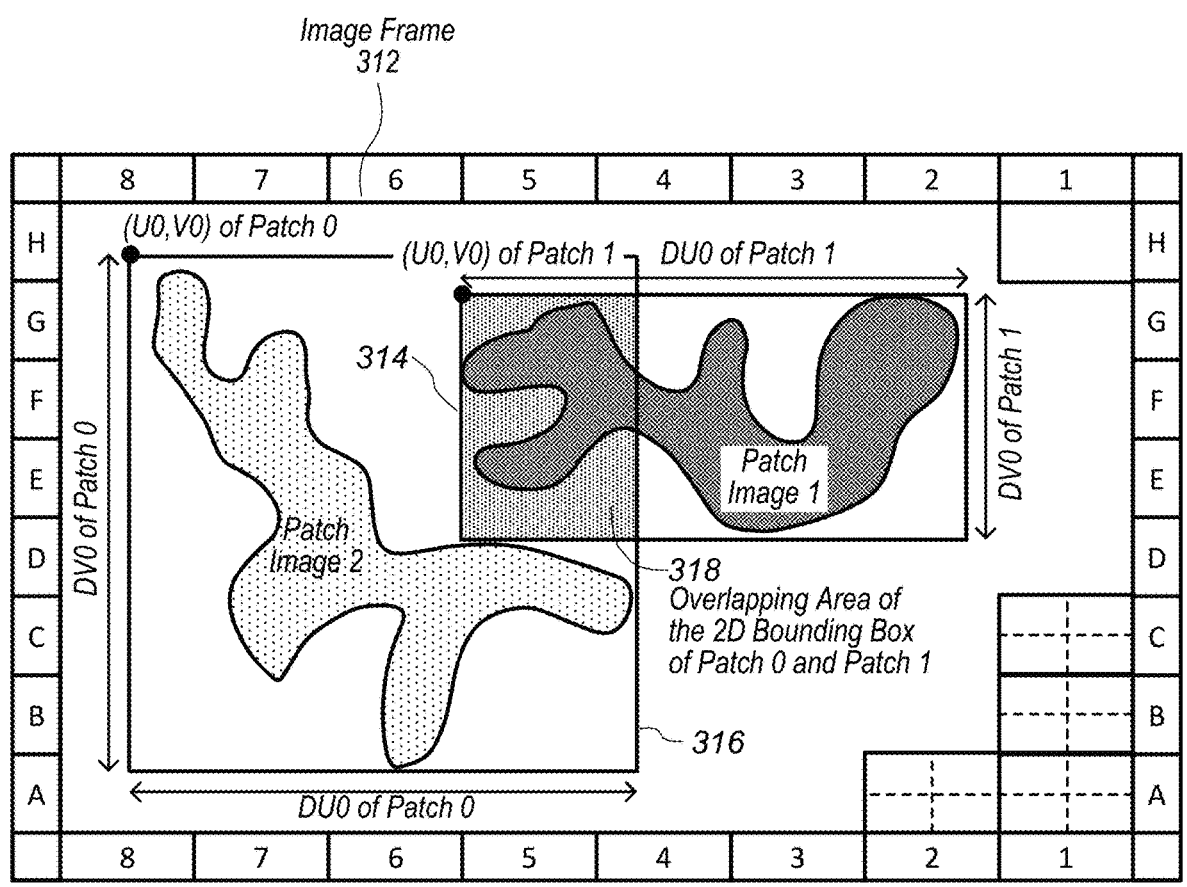
FIG. 3C illustrates an example image frame comprising patch portions and padded portions, according to some embodiments.

FIG. 3C illustrates an example image frame 312 with overlapping patches, according to some embodiments. FIG. 3C shows an example with two patches (patch image 1 and patch image 2) having overlapping 2D bounding boxes 314 and 316 that overlap at area 318. In order to determine to which patch the T×T blocks in the area 318 belong, the order of the patches may be considered. For example, the T×T block 314 may belong to the last decoded patch. This may be because in the case of an overlapping patch, a later placed patch is placed such that it overlaps with a previously placed patch. By knowing the placement order it can be resolved that areas of overlapping bounding boxes go with the latest placed patch. In some embodiments, the patch information is predicted and encoded (e.g., with an entropy/arithmetic encoder). Also, in some embodiments, U0, V0, DU0 and DV0 are encoded as multiples of T, where T is the block size used during the padding phase.

FIG. 3C also illustrates blocks of an image frame 312, wherein the blocks may be further divided into sub-blocks. For example block A1, B1, C1, A2, etc. may be divided into multiple sub-blocks, and, in some embodiments, the sub-blocks may be further divided into smaller blocks. In some embodiments, a video compression module of an encoder, such as video compression module 218 or video compression module 264, may determine whether a block comprises active pixels, non-active pixels, or a mix of active and non-active pixels. The video compression module may budget fewer resources to compress blocks comprising non-active pixels than an amount of resources that are budgeted for encoding blocks comprising active pixels. In some embodiments, active pixels may be pixels that include data for a patch image and non-active pixels may be pixels that include padding. In some embodiments, a video compression module may sub-divide blocks comprising both active and non-active pixels, and budget resources based on whether sub-blocks of the blocks comprise active or non-active pixels. For example, blocks A1, B1, C1, A2 may comprise non-active pixels. As another example block E3 may comprise active pixels, and block B6, as an example, may include a mix of active and non-active pixels.

In some embodiments, a patch image may be determined based on projections, such as projecting a point cloud onto a cube, cylinder, sphere, etc. In some embodiments, a patch image may comprise a projection that occupies a full image frame without padding. For example, in a cubic projection each of the six cubic faces may be a patch image that occupies a full image frame.

Figure 3D:
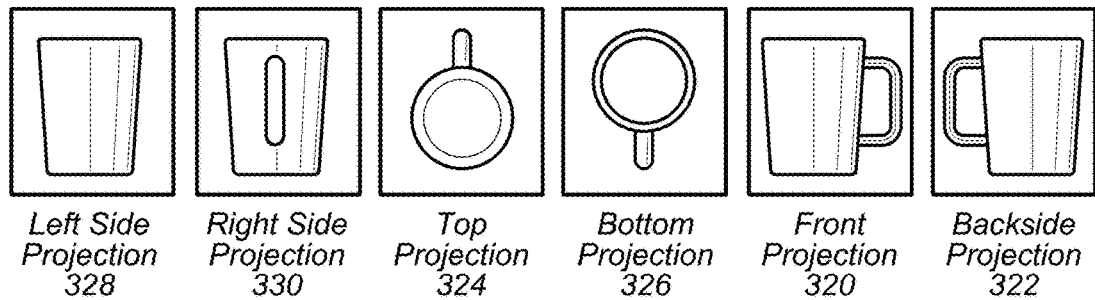
FIG. 3D illustrates a point cloud being projected onto multiple projections, according to some embodiments.

For example, FIG. 3D illustrates a point cloud being projected onto multiple projections, according to some embodiments.

In some embodiments, a representation of a point cloud is encoded using multiple projections. For example, instead of determining patches for a segment of the point cloud projected on a plane perpendicular to a normal to the segment, the point cloud may be projected onto multiple arbitrary planes or surfaces. For example, a point cloud may be projected onto the sides of a cube, cylinder, sphere, etc. Also multiple projections intersecting a point cloud may be used. In some embodiments, the projections may be encoded using conventional video compression methods, such as via a video compression module 218 or video compression module 264. In particular, the point cloud representation may be first projected onto a shape, such as a cube, and the different projections/faces projected onto that shape (i.e. front (320), back (322), top (324), bottom (326), left (328), right (330)) may all be packed onto a single image frame or multiple image frames. This information, as well as depth information may be encoded separately or with coding tools such as the ones provided in the 3D extension of the HEVC (3D-HEVC) standard. The information may provide a representation of the point cloud since the projection images can provide the (x,y) geometry coordinates of all projected points of the point cloud. Additionally, depth information that provides the z coordinates may be encoded. In some embodiments, the depth information may be determined by comparing different ones of the projections, slicing through the point cloud at different depths. When projecting a point cloud onto a cube, the projections might not cover all point cloud points, e.g. due to occlusions. Therefore additional information may be encoded to provide for these missing points and updates may be provided for the missing points.

In some embodiments, adjustments to a cubic projection can be performed that further improve upon such projections. For example, adjustments may be applied at the encoder only (non-normative) or applied to both the encoder and the decoder (normative).

More specifically, in some embodiments alternative projections may be used. For example, instead of using a cubic projection, a cylindrical or spherical type of a projection method may be used. Such methods may reduce, if not eliminate, redundancies that may exist in the cubic projection and reduce the number or the effect of "seams" that may exist in cubic projections. Such seams may create artifacts at object boundaries, for example. Eliminating or reducing the number or effect of such seams may result in improved compression/subjective quality as compared to cubic projection methods. For a spherical projection case, a variety of sub-projections may be used, such as the equirectangular, equiangular, and authagraph projection among others. These projections may permit the projection of a sphere onto a 2D plane. In some embodiments, the effects of seams may be de-emphasized by overlapping projections, wherein multiple projections are made of a point cloud, and the projections overlap with one another at the edges, such that there is overlapping information at the seams. A blending effect could be employed at the overlapping seams to reduce the effects of the seams, thus making them less visible.

In addition to, or instead of, considering a different projection method (such as cylindrical or spherical projections), in some embodiments multiple parallel projections may be used. The multiple parallel projections may provide additional information and may reduce a number of occluded points. The projections may be known at the decoder or signaled to the decoder. Such projections may be defined on planes or surfaces that are at different distances from a point cloud object. Also, in some embodiments the projections may be of different shapes, and may also overlap or cross through the point cloud object itself. These projections may permit capturing some characteristics of a point cloud object that may have been occluded through a single projection method or a patch segmentation method as described above.

Figure 3E:
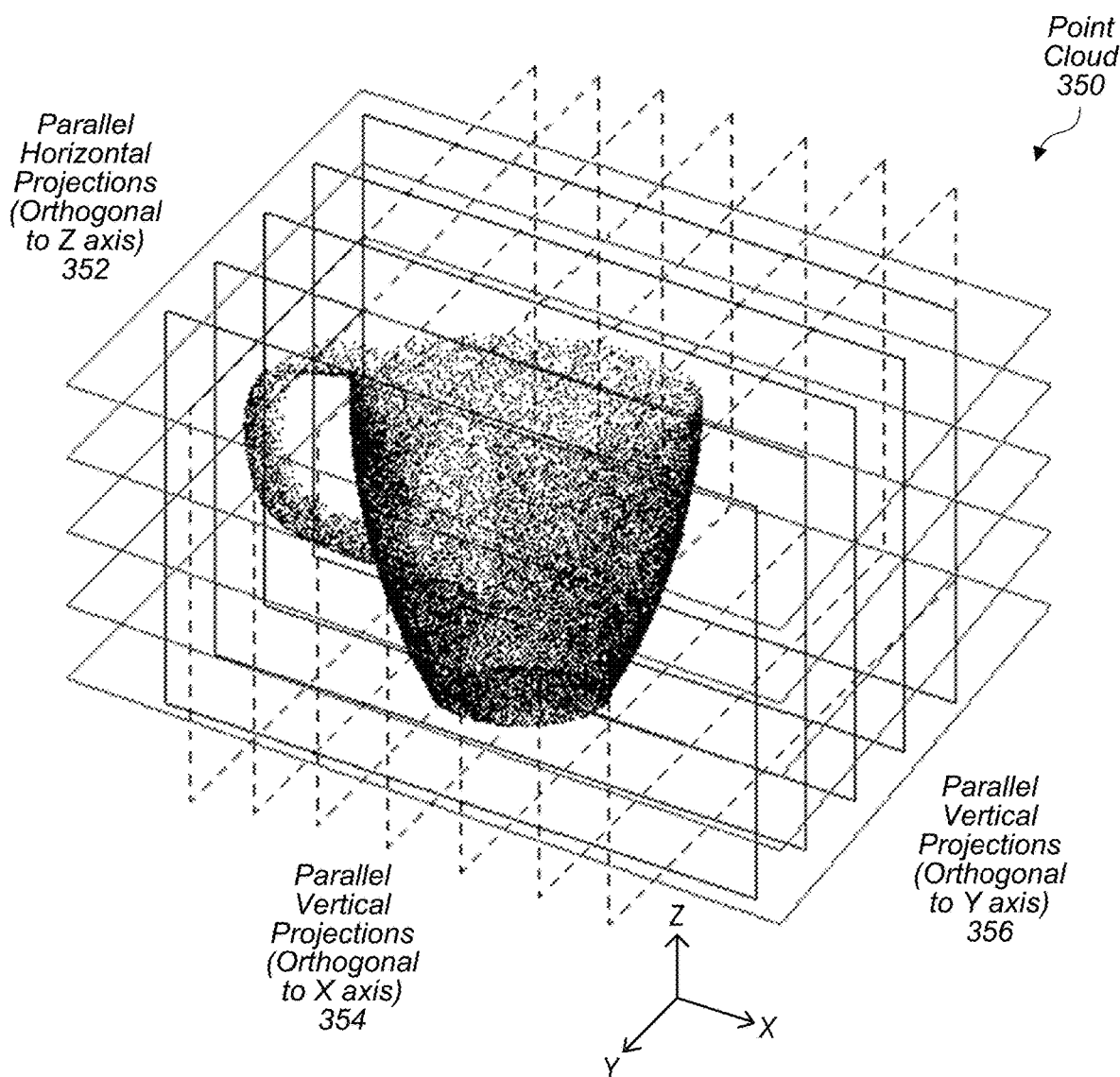
FIG. 3E illustrates a point cloud being projected onto multiple parallel projections, according to some embodiments.

For example, FIG. 3E illustrates a point cloud being projected onto multiple parallel projections, according to some embodiments. Point cloud 350 which includes points representing a coffee mug is projected onto parallel horizontal projections 352 that comprise planes orthogonal to the Z axis. Point cloud 350 is also projected onto vertical projections 354 that comprise planes orthogonal to the X axis, and is projected onto vertical projections 356 that comprise planes orthogonal to the Y axis. In some embodiments, instead of planes, multiple projections may comprise projections having other shapes, such as multiple cylinders or spheres.

Generating Images Having Depth

In some embodiments, only a subset of the pixels of an image frame will be occupied and may correspond to a subset of 3D points of a point cloud. Mapping of patch images may be used to generate geometry, texture, and attribute images, by storing for each occupied pixel the depth/texture/attribute value of its associated point.

In some embodiments, spatial information may be stored with various variations, for example spatial information may:
  a. Store depth as a monochrome image.
  b. Store depth as Y and keep U and V empty (where YUV is a color space, also RGB color space may be used).
  c. Store depth information for different patches in different color planes Y, U and V, in order to avoid inter-patch contamination during compression and/or improve compression efficiency (e.g., have correlated patches in the same color plane). Also, hardware codec capabilities may be utilized, which may spend the same encoding\decoding time independently of the content of the frame.
  d. Store depth patch images on multiple images or tiles that could be encoded and decoded in parallel. One advantage is to store depth patch images with similar/close orientations or based on visibility according to the rendering camera position in the same image/tile, to enable view-dependent streaming and/or decoding.
  e. Store depth as Y and store a redundant version of depth in U and V.
  f. Store X, Y, Z coordinates in Y, U, and V
  g. Different bit depth (e.g., 8, 10 or 12-bit) and sampling (e.g., 420, 422, 444 . . . ) may be used. Note that different bit depth may be used for the different color planes.

Padding

In some embodiments, padding may be performed to fill the non-occupied pixels with values such that the resulting image is suited for video/image compression. For example, image frame padding module 216 or image padding module 262 may perform padding as described below.

In some embodiments, padding is applied on pixels blocks, while favoring the intra-prediction modes used by existing video codecs. More precisely, for each block of size B×B to be padded, the intra prediction modes available at the video encoder side are assessed and the one that produces the lowest prediction errors on the occupied pixels is retained. This may take advantage of the fact that video/image codecs commonly operate on pixel blocks with pre-defined sizes (e.g., 64×64, 32×32, 16×16 . . . ). In some embodiments, other padding techniques may include linear extrapolation, in-painting techniques, or other suitable techniques.

Video Compression

In some embodiments, a video compression module, such as video compression module 218 or video compression module 264, may perform video compression as described below.

In some embodiments, a video encoder may leverage an occupancy map, which describes for each pixel of an image whether it stores information belonging to the point cloud or padded pixels. In some embodiments, such information may permit enabling various features adaptively, such as de-blocking, adaptive loop filtering (ALF), or shape adaptive offset (SAO) filtering. Also, such information may allow a rate control module to adapt and assign different, e.g. lower, quantization parameters (QPs), and in an essence a different amount of bits, to the blocks containing the occupancy map edges. Coding parameters, such as lagrangian multipliers, quantization thresholding, quantization matrices, etc. may also be adjusted according to the characteristics of the point cloud projected blocks. In some embodiments, such information may also enable rate distortion optimization (RDO) and rate control/allocation to leverage the occupancy map to consider distortions based on non-padded pixels. In a more general form, weighting of distortion may be based on the "importance" of each pixel to the point cloud geometry. Importance may be based on a variety of aspects, e.g. on proximity to other point cloud samples, directionality/orientation/position of the samples, etc. Facing forward samples, for example, may receive a higher weighting in the distortion computation than backward facing samples. Distortion may be computed using metrics such as Mean Square or Absolute Error, but different distortion metrics may also be considered, such as SSIM, VQM, VDP, Hausdorff distance, and others.

Occupancy Map Compression

In some embodiments, an occupancy map compression module, such as occupancy map compression module 220, may compress an occupancy map as described below Example Occupancy Map Compression Techniques In some embodiments, an occupancy map may be encoded in a hierarchical mode. Such a process may comprise:

1. A binary information for each B1×B2 pixel block (e.g., a rectangle that covers the entire image, or smaller blocks of different sizes such as 64×64, 64×32, 32×32 block, etc.) being encoded indicating whether the block is empty (e.g., has only padded pixels) or non-empty (e.g., has non-padded pixels).
2. If the block is non-empty, then a second binary information may be encoded to indicate whether the block is full (e.g., all the pixels are non-padded) or not.
3. The non-empty and non-full blocks may then be refined by considering their (B1/2)×(B2/2) sub-blocks.
4. The steps 1-3 may be repeated until the size of the block reaches a certain block size B3×B4 (e.g., of size 4×4). At this level only the empty/non-empty information may be encoded.
5. An entropy-based codec may be used to encode the binary information in steps 1 and 2. For instance, context adaptive binary arithmetic encoders may be used.
6. The reconstructed geometry image may be leveraged to better encode the occupancy map. More precisely, the residual prediction errors may be used to predict whether a block is empty or not or full or not. Such an information may be incorporated by using a different context based on the predicted case or simply by encoding the binary value XORed with the predicted value.

In some embodiments, mesh-based codecs may be an alternative to the approach described above.

Additional Example Occupancy Map Compression Technique

In some embodiments, auxiliary information and the patch encoding order may be leveraged in order to efficiently compress a mapping information indicating for each T×T block (e.g., 16×16 block) to which patch it belongs to. This mapping may be explicitly encoded in the bit stream as follows:

A list of candidate patches is created for each T×T block by considering all the patches that overlap with that block.

The list of candidates is sorted in the reverse order of the patches.

For each block, the index of the patch in this list is encoded by using an arithmetic or other form of an entropy encoder (e.g. UVLC or Huffman based).

Note that empty blocks are assigned a special index, such as zero.

The mapping information described above makes it possible to detect empty T×T blocks (e.g., blocks that contain only padded pixels). The occupancy information is encoded only for the non-empty T×T blocks (e.g., the blocks that contain at least one non-padded pixel).

The occupancy map is encoded with a precision of a B0×B0 blocks. In order to achieve lossless encoding B0 is chosen to be 1. In some embodiments B0=2 or B0=4, which may result in visually acceptable results, while significantly reducing the number of bits required to encode the occupancy map.

Binary values are associated with B0×B0 sub-blocks belonging to the same T×T block. Different strategies are possible. For instance, one could associate a value of 1 if the sub-block contains at least some non-padded pixels and 0 otherwise. If a sub-block has a value of 1 it is said to be full, otherwise it is an empty sub-block.

If all the sub-blocks of a T×T block are full (e.g., have value 1). The block is said to be full. Otherwise, the block is said to be non-full.

A binary information is encoded for each T×T block to indicate whether it is full or not. Various encoding strategies could be used. For instance, a context adaptive binary arithmetic encoder could be used.

If the block is non-full, an extra information is encoded indicating the location of the full/empty sub-blocks. More precisely, the process may proceed as follows:

Different traversal orders are defined for the sub-blocks. FIG. 12B, shows some examples. The traversal orders are predetermined and known to both the encoder and decoder.

The encoder chooses one of the traversal orders and explicitly signals its index in the bit stream.

The binary values associated with the sub-blocks are encoded by using a run-length encoding strategy.

The binary value of the initial sub-block is encoded. Various encoding strategies could be used. For instance, fixed length coding or a context adaptive binary arithmetic encoder could be used.

Continuous runs of 0s and 1s are detected, while following the traversal order selected by the encoder.

The number of detected runs is encoded. Various encoding strategies could be used. For instance, fixed length coding or a context adaptive binary arithmetic encoder, or a universal variable length encoder (UVLC) could be used.

The length of each run, except of the last one, is then encoded. Various encoding strategies could be used. For instance, fixed length coding, a context adaptive binary arithmetic encoder, or a universal variable length encoder could be used.

Note that the symbol probabilities used during the arithmetic encoding could be initialized by using values explicitly signaled in the bit stream by the encoder in order to improve compression efficiency. Such information could be signaled at frame, slice, row(s) of blocks, or block level, or using a non-fixed interval. In that case, a system may have the ability to signal the initialization interval, or the interval adaptation could be predefined between encoder and decoder. For example, the interval could start with one block, and then increment by one block afterwards (e.g. using an adaptation positions of {1, 2, 3 . . . N–1 . . . } blocks.

The choice of the traversal order may have a direct impact on the compression efficiency. Different strategies are possible. For instance, the encoder could choose the traversal order, which would result in the lowest number of bits or the lowest number of runs. In some embodiments, hierarchical sub-blocks with variable sizes may be used.

In some embodiments, temporal prediction may be used for encoding/compressing occupancy maps as follows:

a. The occupancy map of the current frame may be predicted from the occupancy map of a reference frame (e.g. through a difference process assuming zero motion). The prediction could be done at the frame level, but could also be done at a sub-block level, e.g. signal 1 bit whether a block will be predicted temporally, or the original map for a block will be used instead.

b. Prediction could be enhanced by using motion compensation and by associating a motion vector with each T×T block.

c. The values of the current block may be XOR-ed with the values of the block referenced by the motion vector or the co-located block. If no prediction is used, the current block may be coded as is.

d. Motion vectors could be integer, integer multiples, or can have sub-pixel precision.

e. The encoding strategy described above may be applied to the results.

f. The motion vectors of the current block may be predicted based on the motion vectors of the previously encoded blocks. For example, a list of candidate predicted motion vectors may be computed based on the motion vectors of spatially and/or temporally neighboring blocks that have already been encoded. The index of the best candidate to be used as a predictor and the difference can be explicitly encoded in the bit stream. The process may be similar to the process used in codecs such as AVC and HEVC among others. A reduction in temporal candidates may be performed similar to what is done in HEVC to reduce memory requirements. The residual motion vector can then be encoded using a technique such as context adaptive arithmetic encoding or UVLC.

g. A skip mode may also be supported to indicate that the predicted block matches exactly the reference block. In that case, no residual motion vector is needed.

h. Different block sizes could be used instead of sticking with T×T blocks.

i. The choice of the block size and the motion vectors could be achieved by minimizing the number of bits required to encode the occupancy map.

j. The process could also consider multiple references.

In some embodiments, additional techniques for encoding/compression of an occupancy map may include:

Using clues included in the video picture to help encode the occupancy map, such as:
   Use high quantization parameters QPs (e.g., 51) or use skip mode for blocks composed of padded pixels only.
   The arithmetic encoding contexts could be adaptively adjusted based on information extracted from the video bit streams associated with the texture/geometry/motion frames.
Group the binary values associated with pixels into 8-bit or 10-bit words and encode them with dictionary-based approaches such as the DEFLATE algorithm.
Pixels could be grouped 4×2/5×2 blocks or by leveraging a zig zag scan.
Only the pixels belonging to non-empty T×T blocks may be encoded.
The mapping information indicating for each T×T block to which patch it belongs may encoded.

Auxiliary Patch-Information Compression

In some embodiments, for each patch, the following information may be encoded. For example, by auxiliary patch-info compression module 222.
   Its location (U0, V0) in the packed image frame and the extent of its 2D bounding box (DU0, DV0).
   Minimum/maximum/average/median depth value.
   Index of the projection direction.

Video-Based Occupancy Map and/or Auxiliary Patch-Information Compression

As described above, in some embodiments, the occupancy map is a binary information that indicates for each pixel in the image frame whether the pixel should be interpreted as an actual point in the point cloud or not, e.g. the pixel is a padded pixel or not. Also, as described above, the auxiliary patch-information indicates for each T×T block to which patch it belongs. Whereas it was described above to encode an index of patches for a block and to use the index to generate the occupancy map, where blocks that did not have associated patches had null or zero values for the respective index of the block. In another embodiment, an occupancy map may be first encoded and then used to generate an index of patches that are associated with blocks. In some embodiments, a compression process follows the following procedure that leverages existing video codecs to compress an occupancy map.

The occupancy map could be encoded with a precision of B0×B1 blocks. In order to achieve lossless encoding B0 and B1 may be chosen to be equal to 1. In practice B0=B1=2 or B0=B1=4 may result in visually acceptable results, while significantly reducing the number of bits required to encode the occupancy map.

In some embodiments, a single binary is associated with each B0×B1 sub-block. Different strategies are possible. For instance, one could associate a value of 1 with the rule that the sub-block contains at least one non-padded pixel and the value of 0 if not. In order to reduce computational complexity, the binary values of multiple B0×B1 blocks could be grouped together in a single pixel value.

A binary video frame may be generated by storing the value of each B0×B1 block in a pixel. The obtained video frame could be compressed by using a lossless video codec. For example the HEVC video codec could be utilized and its main, screen context coding (scc) main or other profiles could be used.

In some embodiments, the occupancy map could be packed in a 4:4:4 or 4:2:0 chroma format, where the chroma information could contain fixed values, e.g. the values 0 or 128 for an 8 bit codec. The occupancy map could also be coded using a codec supporting a monochrome representation. The occupancy map could be replicated in all color components and encoded using a 4:4:4 representation. Other rearrangements of the occupancy map could be used so as to fit the data in a 4:4:4, 4:2:2, or 4:2:0 representation, while preserving the lossless nature of the signal and at the same time preserving the lossless characteristics of the occupancy map. For example, the occupancy map could be segmented to even horizontal and odd horizontal position sub-maps, and those sub-maps could be embedded into a 4:4:4 signal, the odd position samples in the Y plane and the even position samples in the U plane, and then encoded. This could provide savings in complexity since a reduced resolution (by half) image would be encoded. Other such arrangements could be used.

The occupancy map is used to detect non-empty T×T blocks and only for those blocks a patch index is encoded by proceeding as follows:

1) A list of candidate patches is created for each T×T block by considering all the patches that contain that block.
2) The list of candidates is sorted in the reverse order of the patches.
3) For each block, the index of the patch in this list is encoded by using an entropy encoder, e.g. an arithmetic encoder or other suitable encoder.

Point Cloud Resampling

In some embodiments, a point cloud resampling module, such as point cloud resampling module 252, may resample a point cloud as described below.

In some embodiments, dynamic point clouds may have a different number of points from one frame to another. Efficient temporal prediction may require mapping the points of the current frame, denoted CF, to the points of a reference frame, denoted RF. Signaling such a mapping in a bit stream may require a high number of bits and thus may be inefficient. Instead, re-sampling of a current frame CF may be performed so that the current frame CF has the same number of points as reference frame RF. More precisely, the points of reference frame RF may be displaced such that its shape matches the shape of current frame CF. As a second step, the color and attributes of current frame CF may be transferred to the deformed version of reference frame RF. The obtained frame CF' may be considered as the re-sampled version of the current frame. The decision to compress the approximation CF' of CF may be made by comparing the rate distortion costs of both options (e.g., encoding CF' as inter-frame vs. encoding CF as intra-frame). In some embodiments, pre-adjusting RF may be performed in an effort to make it a better reference for future CF images. Resampling may comprise the following:

a. First, normals of the points associated with current frame CF and reference frame RF may be estimated and oriented consistently. For every point P belonging to current frame CF (resp. Q belonging to RF), let $\alpha(P)$ (resp., $\alpha(Q)$) be its position and $\nabla(P)$ (resp., $\nabla(Q)$) its normal. A 6D vector, denoted $\upsilon(P)$ (resp., $\upsilon(Q)$) is then associated with every point by combining its position and a weighted version of its normal in the same vector.

$$v(P) = \begin{bmatrix} \alpha(P) \\ \varepsilon \nabla(P) \end{bmatrix} v(Q) = \begin{bmatrix} \alpha(Q) \\ \varepsilon \nabla(Q) \end{bmatrix},$$

where $\varepsilon$ is a parameter controlling the importance of normal for positions. E could be defined by the user or could be determined by applying an optimization procedure. They could also be fixed of adaptive.

b. Two mappings from reference frame RF to current frame CF and from current frame CF to reference frame RF are computed as follows:
  i. Every point Q of reference frame RF is mapped to the point P(Q) of current frame CF that has the minimum distance to Q in the 6D space defined in the previous step.
  ii. Every point P of current frame CF is mapped to the point Q(P) of reference frame RF that has the minimum distance to P in the 6D space defined in the previous step. Let $\rho(Q)$ be the set of points of current frame CF that are mapped to the same point Q.

c. At each iteration
  i. The positions of the points of reference frame RF are updated as follows:

$$\alpha'(Q) = w \cdot \alpha(P(Q)) + \frac{(1-w)}{|\rho(Q)|} \sum_{P \in \rho(Q)} \alpha(P),$$

where $|\rho(Q)|$ is the number of elements of $\rho(Q)$. The parameter w could be defined by the user or could be determined by applying an optimization procedure. It could also be fixed or adaptive.

ii. The previous updated step results usually in an irregular repartition of the points. In order to overcome such limitations, a Laplacian-based smoothing procedure is applied. The idea is to update the positions of the points such that they stay as close as possible to $\{\alpha'(Q)\}$, while favoring a repartition as close as possible to the original point repartition in reference frame RF. More precisely, the following sparse linear system may be solved:

$$\{\alpha^*(Q)\} = \mathrm{argmin}_{\{\alpha'(Q)\}}\Big\{\sum_{Q \in RF} \|\alpha''(Q) - \alpha'(Q)\|^2 + \gamma$$

$$\sum_{Q \in RF} \left\| \alpha''(Q) - \frac{1}{R}\sum_{Q' \in N(Q)} \alpha''(Q') - \alpha(Q) - \frac{1}{R}\sum_{Q' \in N(Q)} \alpha(Q') \right\|^2 \Big\},$$

where N(Q) is the set of the R nearest neighbors of Q in reference frame RF.

iii. The mappings between the updated RF' point cloud and current frame CF are then updated as follows
    1. Every point Q of RF' is mapped to the point P(Q) of current frame CF that has the minimum distance to Q in the 3D space of positions.
    2. Every point P of current frame CF is mapped to the point Q(P) of reference frame RF that has the minimum distance to P in the 3D space of positions. Let $\rho(Q)$ be the set of points of current frame CF that are mapped to the same point Q.

d. This process is iterated until a pre-defined number of iterations is reached or there is no further change.

e. At this stage, the color and attribute information is transferred from current frame CF to RF' by exploiting the following formula $$A(Q) = w(A) \cdot A(P(Q)) + \frac{(1-w(A))}{|\rho(Q)|} \sum_{P \in \rho(Q)} A(P),$$

where A stands for the texture or attribute to be transferred, |ρ(Q)| is the number of elements of ρ(Q). The parameter w(A) could be defined by the user or could be determined by applying an optimization procedure. It could also be fixed of adaptive.

3D Motion Compensation

In some embodiments, the positions, attributes and texture information may be temporally predicted by taking the difference between the value at current resampled frame minus a corresponding value, e.g. motion compensated value, from the reference frame. These values may be fed to the image generation stage to be stored as images. For example, such techniques may be performed by 3D motion compensation and delta vector prediction module 254.

Smoothing Filter

In some embodiments, a smoothing filter of a decoder, such as smoothing filter 244 or smoothing filter 276 of decoder 230 or decoder 280, may perform smoothing as described below.

In some embodiments, a reconstructed point cloud may exhibit discontinuities at the patch boundaries, especially at very low bitrates. In order to alleviate such a problem, a smoothing filter may be applied to the reconstructed point cloud. Applying the smoothing filter may comprise:
  a. By exploiting the occupancy map, both the encoder and the decoder may be able to detect boundary points, which are defined as being points belonging to B0×B0 blocks encoded during the last iteration of the hierarchical occupancy map compression procedure described in previous sections above.
  b. The boundary points may have their positions/attribute/texture updated. More precisely, respective boundary points may be assigned a smoothed position based on its R nearest neighbors in the point cloud. The smoothed position may be the centroid/median of the nearest neighbors. Another option may comprise fitting a plane or any smooth surface the nearest neighbor and assigning as a smoothed position the projection of the point on that surface. The number of parameters and/or the smoothing strategy may be chosen by a user or determined by applying an optimization strategy. They may be fixed for all the points or chosen adaptively. These parameters may be signaled in the bit stream.
  c. In order to reduce the computational complexity of the smoothing stage, a subsampled version of the reconstructed point cloud may be considered when looking for the nearest neighbors. Such subsampled version could be efficiently derived by considering a sub-sampled version of the geometry image and the occupancy map.

Closed-Loop Color Conversion

Figure 4A:
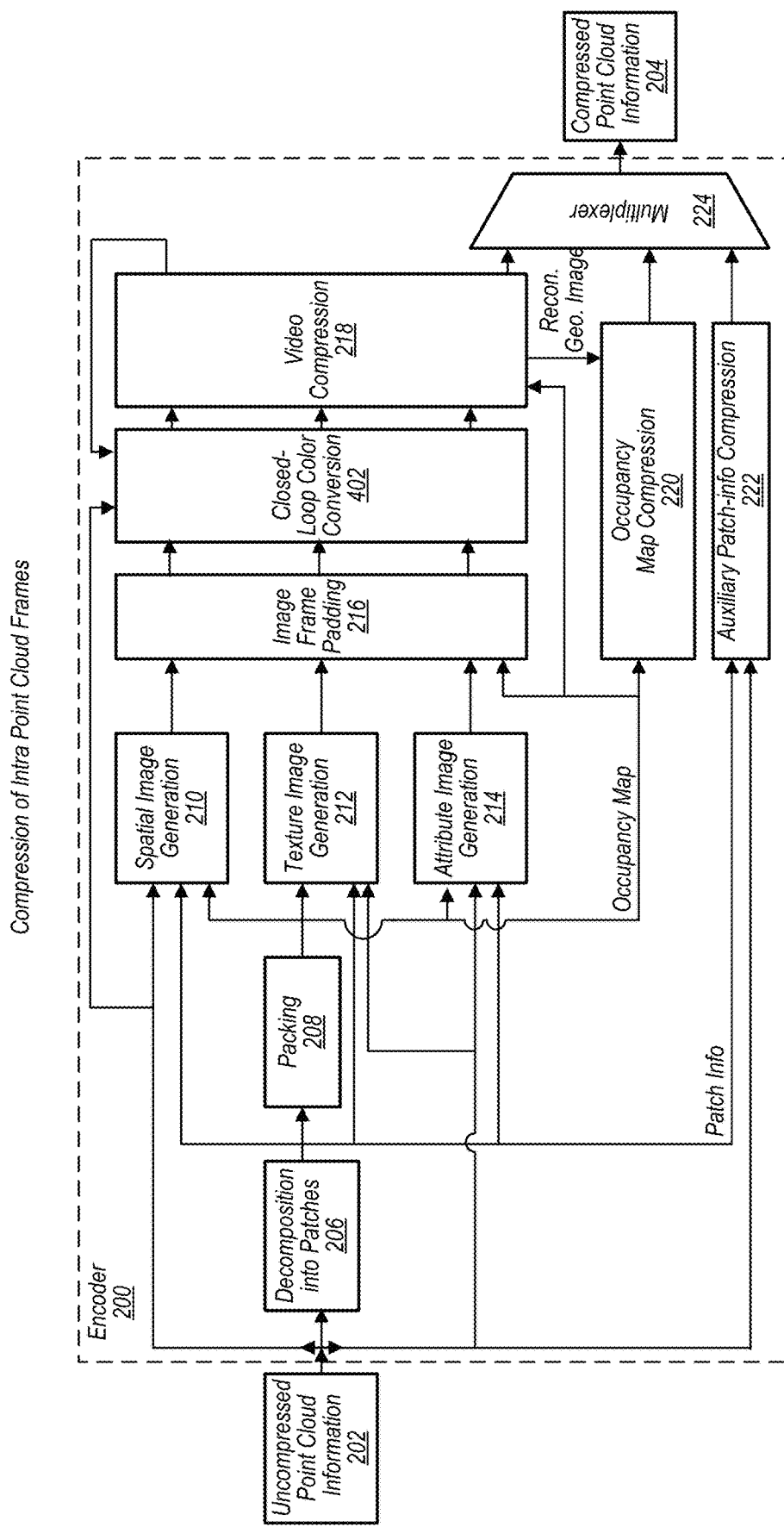
FIG. 4A illustrates components of an encoder for encoding intra point cloud frames with color conversion, according to some embodiments.
Figure 4B:
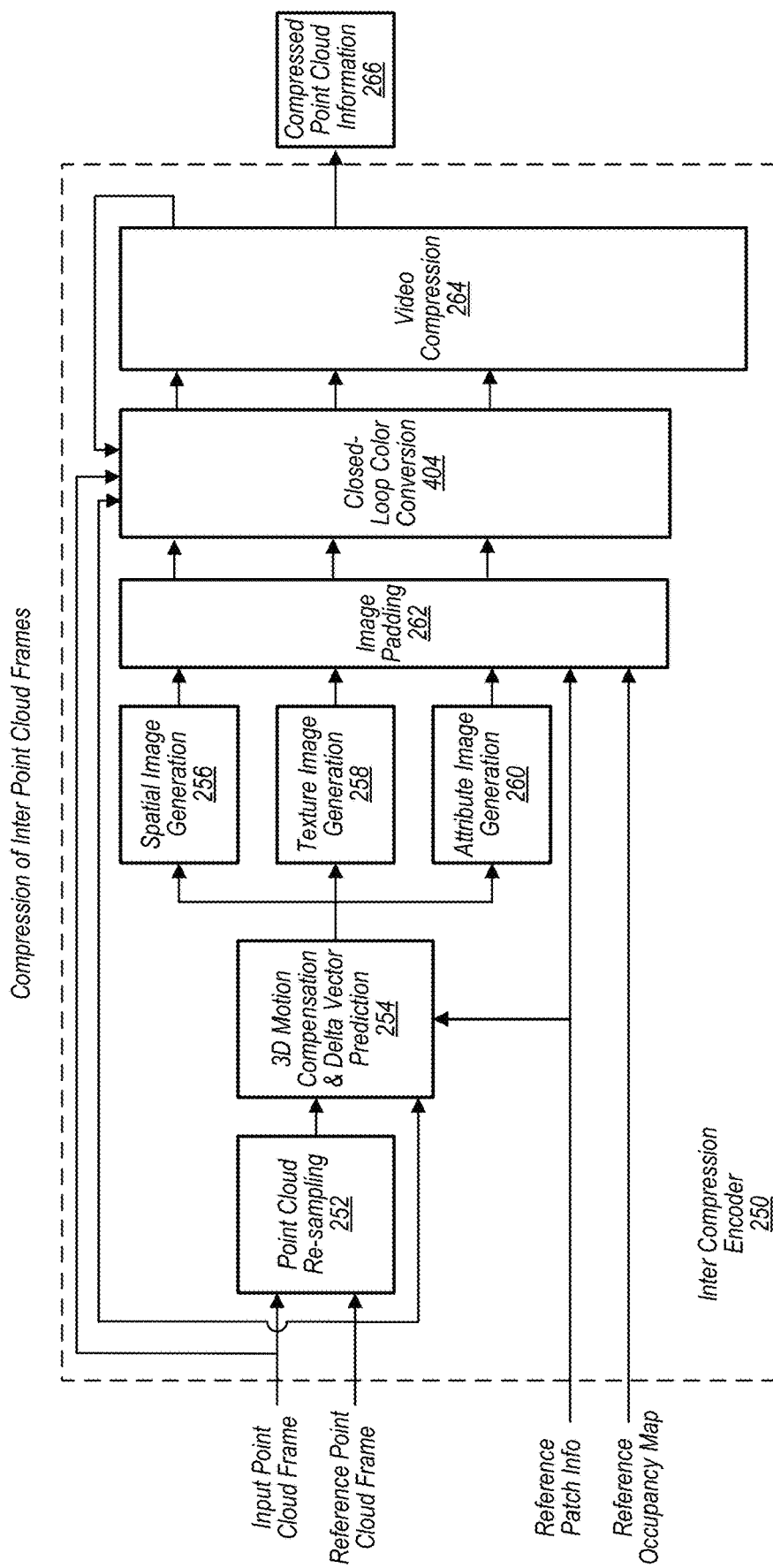
FIG. 4B illustrates components of an encoder for encoding inter point cloud frames with color conversion, according to some embodiments.

In some embodiments, an encoder and/or decoder for a point cloud may further include a color conversion module to convert color attributes of a point cloud from a first color space to a second color space. In some embodiments, color attribute information for a point cloud may be more efficiently compressed when converted to a second color space. For example, FIGS. 4A and 4B illustrates similar encoders as illustrated in FIGS. 2A and 2C, but that further include color conversion modules 402 and 404, respectively. While not illustrated, decoders such as the decoders illustrated in FIGS. 2B and 2D, may further include color conversion modules to convert color attributes of a decompressed point cloud back into an original color space, in some embodiments.

Figure 4C:
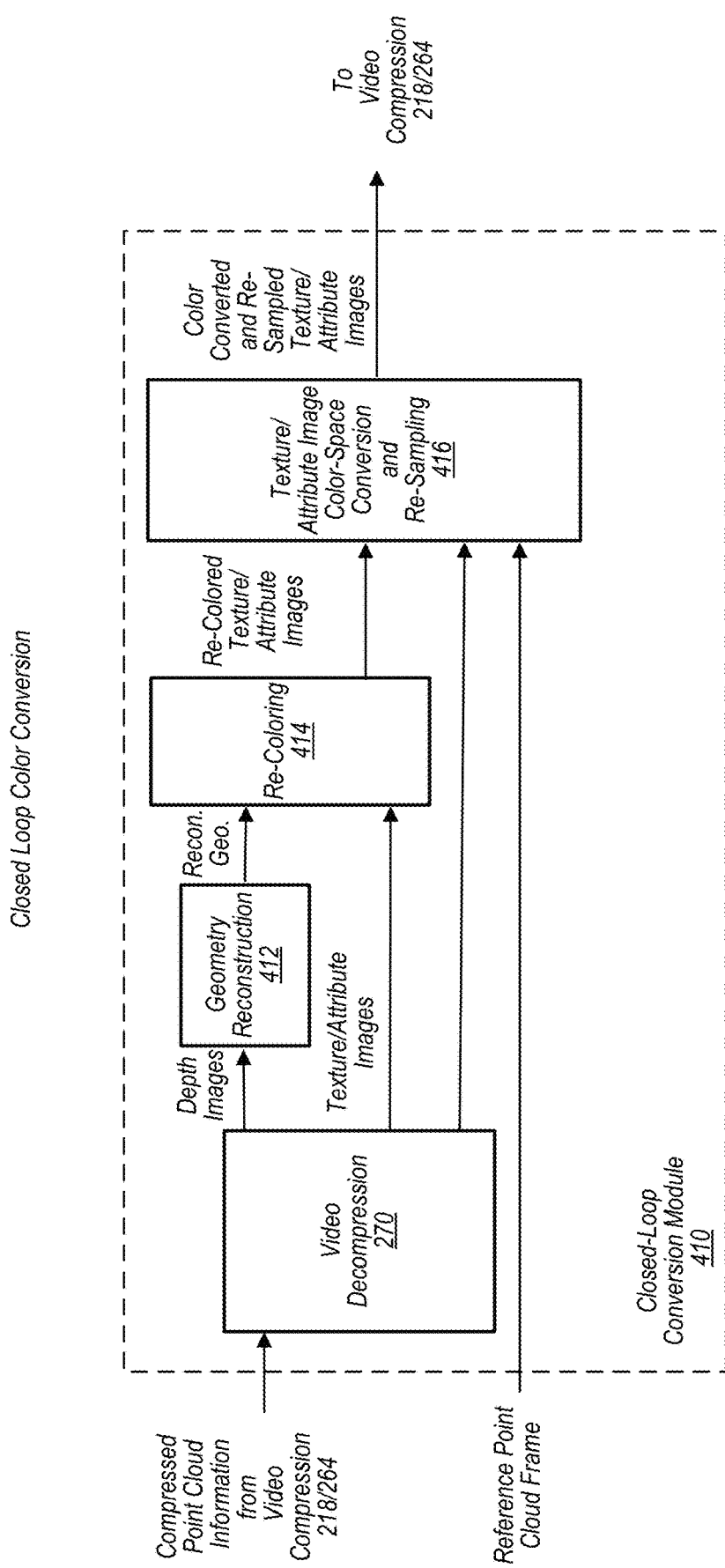
FIG. 4C illustrates components of a closed-loop color conversion module, according to some embodiments.

FIG. 4C illustrates components of a closed-loop color conversion module, according to some embodiments. The closed-loop color conversion module 410 illustrated in FIG. 4C may be a similar closed-loop color conversion module as closed-loop color conversion modules 402 and 404 illustrated in FIGS. 4A and 4B.

In some embodiments, a closed-loop color conversion module, such as closed-loop color conversion module 410, receives a compressed point cloud from a video encoder, such as video compression module 218 illustrated in FIG. 4A or video compression module 264 illustrated in FIG. 4B. Additionally, a closed-loop color conversion module, such as closed-loop color conversion module 410, may receive attribute information about an original non-compressed point cloud, such as color values of points of the point cloud prior to being down-sampled, up-sampled, color converted, etc. Thus, a closed-loop color conversion module may receive a compressed version of a point cloud such as a decoder would receive and also a reference version of the point cloud before any distortion has been introduced into the point cloud due to sampling, compression, or color conversion.

In some embodiments, a closed-loop color conversion module, such as closed-loop color conversion module 410, may include a video decompression module, such as video decompression module 270, and a geometry reconstruction module, such as geometry reconstruction module 412. A video decompression module may decompress one or more video encoded image frames to result in decompressed image frames each comprising one or more patch images packed into the image frame. A geometry reconstruction module, such as geometry reconstruction module 412, may then generate a reconstructed point cloud geometry. A re-coloring module, such as re-coloring module 414, may then determine colors for points in the point cloud based on the determined reconstructed geometry. For example, in some embodiments, a nearest neighbor approach or other approach may be used to determine estimated color values for points of the point cloud based on sub-sampled color information, wherein a color value is not explicitly encoded for each point of the point cloud. Because there may be losses during the patching process, compression process, decompression process, and geometry reconstruction process, the geometry of the points in the reconstructed point cloud may not be identical to the geometry in the original point cloud. Due to this discrepancy, color compression techniques that rely on geometrical relationships between points to encode color values may result in colors that are slightly different when decoded and decompressed than the original colors. For example, if a color is to be determined based on color values of the nearest neighboring points, a change in geometry may cause a different nearest neighbor to be selected to determine the color value for the point at the decoder than was selected to encode a residual value at the encoder. Thus distortion may be added to the decoded decompressed point cloud.

If a color space conversion module does not account for this distortion that takes place when converting a point cloud into patches packed in an image frame and that takes place when encoding the image frames, the color space conversion module may select less than optimum color conversion parameters, such as luma and chroma values. For example, optimum color conversion parameters that cause a packed image frame in a first color space to closely match the packed image frame converted into a second color space may be different than optimum color conversion parameters when upstream and downstream distortions are accounted for.

In order to account for such distortions, a texture/attribute image color space conversion and re-sampling module, such as module 416, may take into account a difference between the "re-created" color values from re-coloring module 416 and the original color values from the original non-compressed reference point cloud when determining color conversion parameters for converting an image frame from a first color space, such as R'G'B' 4:4:4 to YCbCr 4:2:0, for example. Thus, the color-converted and re-sampled texture/attribute images provided to video encoder 218 and 264, as shown in FIG. 4C may take into account distortion introduced at any stage of compression and decompression of a point cloud, and may utilize optimum color conversion parameters taking into account such distortion.

Such methods may result in considerably reduced distortion when reconstructing the point cloud representation, while maintaining the high compressibility characteristics of the 4:2:0 signal.

In some embodiments, conversion from 4:4:4 R'G'B' to a 4:2:0 YCbCr representation is performed using a 3×3 matrix conversion of the form:

$$\begin{bmatrix} Y' \\ Cb \\ Cr \end{bmatrix} = \begin{bmatrix} a_{YR} & a_{YG} & a_{YB} \\ a_{CbR} & a_{CbG} & a_{CbB} \\ a_{CrR} & a_{CrG} & a_{CrB} \end{bmatrix} \begin{bmatrix} R' \\ G' \\ B' \end{bmatrix}$$

In the above matrix, Y' is the luma component and Cb and Cr are the chroma components. The values of R', G', and B' correspond to the red, green, and blue components respectively, after the application of a transfer function that is used to exploit the psycho-visual characteristics of the signal. The coefficients $a_{YR}$ through $a_{CrB}$ are selected according to the relationship of the red, green, and blue components to the CIE 1931 XYZ color space. Furthermore, the Cb and Cr components are also related to Y' in the following manner:

$$Cb = \frac{B' - Y'}{\text{alpha}} \text{ with alpha} = 2*(1 - a_{YB})$$

$$Cr = \frac{R' - Y'}{\text{beta}} \text{ with beta} = 2*(1 - a_{YR})$$

with also the following relationships:

$$a_{CbR} = -\frac{a_{YR}}{2*(1-a_{YB})}$$

$$a_{CbR} = -\frac{a_{YG}}{2*(1-a_{YB})}$$

$$a_{CbB} = 0.5$$

$$a_{CrR} = 0.5$$

$$a_{CrR} = -\frac{a_{YG}}{2*(1-a_{YR})}$$

$$a_{CrB} = -\frac{a_{YB}}{2*(1-a_{YR})}$$

The process described above is followed by a 2× downsampling horizontally and vertically of the chroma components, resulting in chroma components that are 4 times smaller, in terms of overall number of samples, 2× smaller horizontally and 2× smaller vertically, compared to those of luma. Such a process can help not only with compression but also with bandwidth and processing complexity of the YCbCr 4:2:0 signals.

In using such an approach quantization for the color components, as well as the down sampling and up sampling processes for the chroma components, may introduce distortion that could impact the quality of the reconstructed signals especially in the R'G'B' but also in the XYZ (CIE 1931 domains). However, a closed loop conversion process, where the chroma and luma values are generated while taking into account such distortions, may considerably improve quality.

In a luma adjustment process, for example, the chroma components may be converted using the above formulations, additionally a down sampling and up sampling may be performed given certain reference filtering mechanisms. Afterwards, using the reconstructed chroma samples, an appropriate luma value may be computed that would result in minimal distortion for the luminance Y component in the CIE 1931 XYZ space. Such luma value may be derived through a search process instead of a direct computation method as provided above. Refinements and simplifications of this method may include interpolative techniques to derive the luma value.

Projected point cloud images can also benefit from similar strategies for 4:2:0 conversion. For example, closed loop color conversion, including luma adjustment methods may be utilized in this context. That is, instead of converting point cloud data by directly using the 3×3 matrix above and averaging all neighboring chroma values to generate the 4:2:0 chroma representation for the projected image, one may first project point cloud data/patches using the R'G'B' representation on a 4:4:4 grid. For this new image one may then convert to the YCbCr 4:2:0 representation while using a closed loop optimization such as the luma adjustment method. Assuming that the transfer characteristics function is known, e.g. BT.709, ST 2084 (PQ), or some other transfer function as well as the color primaries of the signal, e.g. BT.709 or BT.2020, an estimate of the luminance component Y may be computed before the final conversion. Then the Cb and Cr components may be computed, down sampled and up sampled using more sophisticated filters. This may then be followed with the computation of the Y' value that would result in a luminance value Yrecon that would be as close as possible to Y. If distortion in the RGB domain is of higher distortion, a Y' value that minimizes the distortion for R', G', and B' jointly, could be considered instead.

For point cloud data, since geometry may also be altered due to lossy compression, texture distortion may also be impacted. In particular, overall texture distortion may be computed by first determining for each point in the original and reconstructed point clouds their closest point in the reconstructed and original point clouds respectively. Then the RGB distortion may be computed for those matched points and accumulated across the entire point cloud image. This means that if the geometry was altered due to lossy compression, the texture distortion would also be impacted. Given that the texture may have been distorted, it may be desirable to consider geometry during closed loop conversion of chroma.

In some embodiments, the geometry is modified so that the relative sampling density in a given region of the point cloud is adjusted to be similar to other regions of the point cloud. Here the relative sampling density is defined as density of original points relative to the uniform 2D sampling grid.

Because the relative sampling density can vary within a given patch, this information can be used to guide the patch decomposition process as described above in regard to occupancy maps and auxiliary information, where patch approximation is used to determine local geometry. Furthermore, this information can be used to guide encoding parameters to achieve more uniform quality after compression. If a local region has higher relative sampling density, the encoder may code that region better through a variety of means. The variety of means may include: variable block size decision, Quantization Parameters (QPs), quantization rounding, de-blocking, shape adaptive offset (SAO) filtering, etc.

In some embodiments, the geometry information is first compressed according to a target bitrate or quality, and then it is reconstructed before generating the texture projected image. Then, given the reconstructed geometry, the closest point in the reconstructed point cloud is determined that corresponds to each point in the original point cloud. The process may be repeated for all points in the reconstructed point cloud by determining their matched points in the original point cloud. It is possible that some points in the reconstructed point cloud may match multiple points in the original point cloud, which would have implications in the distortion computation. This information may be used in the closed loop/luma adjustment method so as to ensure a minimized texture distortion for the entire point cloud. That is, the distortion impact to the entire point cloud of a sample Pr at position (x,y,z) in the reconstructed point cloud can be computed (assuming the use of MSE on YCbCr data for the computation):

$D(Pr)=Doriginal(Pr)+Dreconstructed(Pr)$ $D(Pr)=\text{Sum\_matching}(((Y\_pr-Y\_or(i))^2+(Cb\_pr-Cb\_or(i))^2+(Cr\_pr-Cr\_or(i))^2)+\text{sqrt}((Y\_pr-Y\_or)^2+(Cb\_pr-Cb\_or)^2+(Cr\_pr-Cr\_or)^2)$ In the above equation, Y_pr, Cb_pr, and Cr_pr are the luma and chroma information of point Pr, Y_or(i), Cb_or(i), and Cr_or(i) correspond to the luma and chroma information of all the points that were found to match the geometry location of point Pr from the original image, and Y_or, Cb_or, and Cr_or is the point that matches the location of point Pr in the original as seen from the reconstructed image.

If the distortion computation in the context of closed loop conversion/luma adjustment utilizes D(Pr), then better performance may be achieved since it not only optimizes projected distortion, but also point cloud distortion. Such distortion may not only consider luma and chroma values, but may instead or additionally consider other color domain components such as R, G, or B, luminance Y, CIE 1931 x and y, CIE 1976 u' and v', YCoCg, and the ICtCp color space amongst others.

If geometry is recompressed a different optimal distortion point may be possible. In that case, it might be appropriate to redo the conversion process once again.

In some embodiments, texture distortion, as measured as described below, can be minimized as follows:

Let $(Q(j))_{i \in \{1, \ldots, N\}}$ and $(P_{rec}(i))_{i \in \{1, \ldots, N_{rec}\}}$ be the original and the reconstructed geometries, respectively.

Let N and $N_{rec}$ be the number of points in the original and the reconstructed point clouds, respectively.

For each point $P_{rec}(i)$ in the reconstructed point cloud, let $Q^*(i)$ be its nearest neighbor in the original point cloud and $R(Q^*(i))$, $G(Q^*(i))$, and $B(Q^*(i))$ the RGB values associated with $Q^*(i)$.

For each point $P_{rec}(i)$ in the reconstructed point cloud, let $\mathbb{Q}^+(i)=(Q^+(i,h))_{h \in \{1, \ldots, H(i)\}}$ be the set of point in the original point cloud that share $P_{rec}(i)$ as their nearest neighbor in the reconstructed point cloud. Note that $\mathbb{Q}^+(i)$ could be empty or could have one or multiple elements.

If $\mathbb{Q}^+(i)$ is empty, then the RGB values $R(Q^*(i))$, $G(Q^*(i))$, and $B(Q^*(i))$ are associated with the point $P_{rec}(i)$ If $\mathbb{Q}^+(i)$ is not empty, then proceed as follows:

Virtual RGB values, denoted $R(\mathbb{Q}^+(i))$, $G(\mathbb{Q}^+(i))$, and $B(\mathbb{Q}^+(i))$, are computed as follows:

$$R(\mathbb{Q}^+(i)) = \frac{1}{H(i)} \sum_{h=1}^{H(i)} R(Q^+(i,h))$$

$$G(\mathbb{Q}^+(i)) = \frac{1}{H(i)} \sum_{h=1}^{H(i)} G(Q^+(i,h))$$

$$B(\mathbb{Q}^+(i)) = \frac{1}{H(i)} \sum_{h=1}^{H(i)} B(Q^+(i,h))$$

Note that $R(\mathbb{Q}^+(i))$, $G(\mathbb{Q}^+(i))$, and $B(\mathbb{Q}^+(i))$ correspond to the average RGB values of the points of $\mathbb{Q}^+(i)$.

The final RGB values $R(P_{rec}(i))$, $G(P_{rec}(i))$, and $B(P_{rec}(i))$ are obtained by applying the following linear interpolation:

$R(P_{rec}(i))=w\ R(\mathbb{Q}^+(i))+(1-w)R(Q^*(i))$
$G(P_{rec}(i))=w\ R(\mathbb{Q}^+(i))+(1-w)G(Q^*(i))$
$B(P_{rec}(i))=w\ R(\mathbb{Q}^+(i))+(1-w)B(Q^*(i))$ The interpolation parameter w is chosen such that the following cost function C(i) is minimized $$C(i) = \max\left\{\frac{1}{N}\sum_{h=1}^{H(i)}\{(R(P_{rec}(i)) - R(\mathbb{Q}^+(i,h)))^2 + (G(P_{rec}(i)) - G(\mathbb{Q}^+(i,h)))^2 + (B(P_{rec}(i)) - B(\mathbb{Q}^+(i,h)))^2\}, \right.$$
$$\left. \frac{1}{N_{rec}}\{(R(P_{rec}(i)) - R(Q^*(i)))^2 + (G(P_{rec}(i)) - G(Q^*(i)))^2 + (B(P_{rec}(i)) - B(Q^*(i)))^2\}\right\}$$

Note that by minimizing the cost C(i), the distortion measure as described below is minimized.

Different search strategies may be used to find the parameter w

Use the closed form solution described below.

No search: use w=0.5.

Full search: choose a discrete set of values $(w_i)_{i=1 \ldots w}$ in the interval [0,1] and evaluate C(i) for these values in order to find the w*, which minimizes C(i).

Gradient descent search: start with w=0.5. Evaluate E1(i), E2(i) and C(i). Store C(i) and w as the lowest cost and its associated interpolation parameter w. If E1(i)>E2(i), update w based on the gradient of MO, else use the gradient of E2(i). Re-evaluate E1(i), E2(i), and C(i) at the new value of w. Compare the new cost C(i) to the lowest cost found so far. If new cost is higher than the lowest cost stop, else update the lowest cost and the associated value of w, and continue the gradient descent, where $R(P_{rec}(i))$, $G(P_{rec}(i))$, and $B(P_{rec}(i))$ are the three unknowns to be determined.

In some embodiments, the above process could be performed with other color spaces and not necessarily the RGB color space. For example, the CIE 1931 XYZ or xyY, CIE 1976 Yu'v', YCbCr, IPT, ICtCp, La*b*, or some other color model could be used instead. Furthermore, different weighting of the distortion of each component could be considered.

Weighting based on illumination could also be considered, e.g. weighting distortion in dark areas more than distortion in bright areas. Other types of distortion, that include neighborhood information, could also be considered. That is, visibility of errors in a more sparse area is likely to be higher than in a more dense region, depending on the intensity of the current and neighboring samples. Such information could be considered in how the optimization is performed.

Down sampling and up sampling of chroma information may also consider geometry information, if available. That is, instead of down sampling and up sampling chroma information without consideration to geometry, the shape and characteristics of the point cloud around the neighborhood of the projected sample may be considered, and appropriately consider or exclude neighboring samples during these processes. In particular, neighboring samples for down sampling or interpolating may be considered that have a normal that is as similar as possible to the normal of the current sample. Weighting during filtering according to the normal difference as well as distance to the point may also be considered. This may help improve the performance of the down sampling and up sampling processes.

It should be noted that for some systems, up sampling of the Cb/Cr information may have to go through existing architectures, e.g. an existing color format converter, and it might not be possible to perform such guided up sampling. In those cases, only considerations for down sampling may be possible.

In some embodiments, it may be possible to indicate in the bit stream syntax the preferred method for up sampling the chroma information. A decoder (included in an encoder), in such a case, may try a variety of up sampling filters or methods, find the best performing one and indicate that in the bit stream syntax. On the decoder side, the decoder may know which up sampling method would perform best for reconstructing the full resolution YCbCr and consequently RGB data. Such method could be mandatory, but could also be optional in some architectures.

Clipping as well as other considerations for color conversion, may also apply to point cloud data and may be considered to further improve the performance of the point cloud compression system. Such methods may also apply to other color representations and not necessarily YCbCr data, such as the YCoCg and ICtCp representation. For such representations different optimization may be required due to the nature of the color transform.

Example Objective Evaluation Method

A point cloud consists of a set of points represented by (x,y,z) and various attributes of which color components (y,u,v) are of importance. First, define the point v. It has as a mandatory position in a 3D space (x,y,z) and an optional color attribute c that has components r,g,b or y,u,v and optional other attributes possibly representing normal or texture mappings.

$$\text{point } v=(((x,y,z),[c],[a_0 \ldots a_A]):x,y,z \in R, [c \in (r,g,b) | r,g,b \in N], [a_i \in [0,1]]) \quad \text{(def. 1)}$$

The point cloud is then a set of K points without a strict ordering:

$$\text{Original Point Cloud } V_{or}=\{(v_i):i=0 \ldots K-1\} \quad \text{(def. 2)}$$

The point cloud comprises a set of (x,y,z) coordinates and attributes that can be attached to the points. The original point cloud Vor will act as the reference for determining the quality of a second degraded point cloud Vdeg. Vdeg consists of N points, where N does not necessarily=K. Vdeg is a version of the point cloud with a lower quality possibly resulting from lossy encoding and decoding of Vor. This can result in a different point count N.

$$\text{Degraded Point Cloud } V_{deg}=\{(v_i):i=0 \ldots N-1\} \quad \text{(def. 3)}$$

Figure 4D:
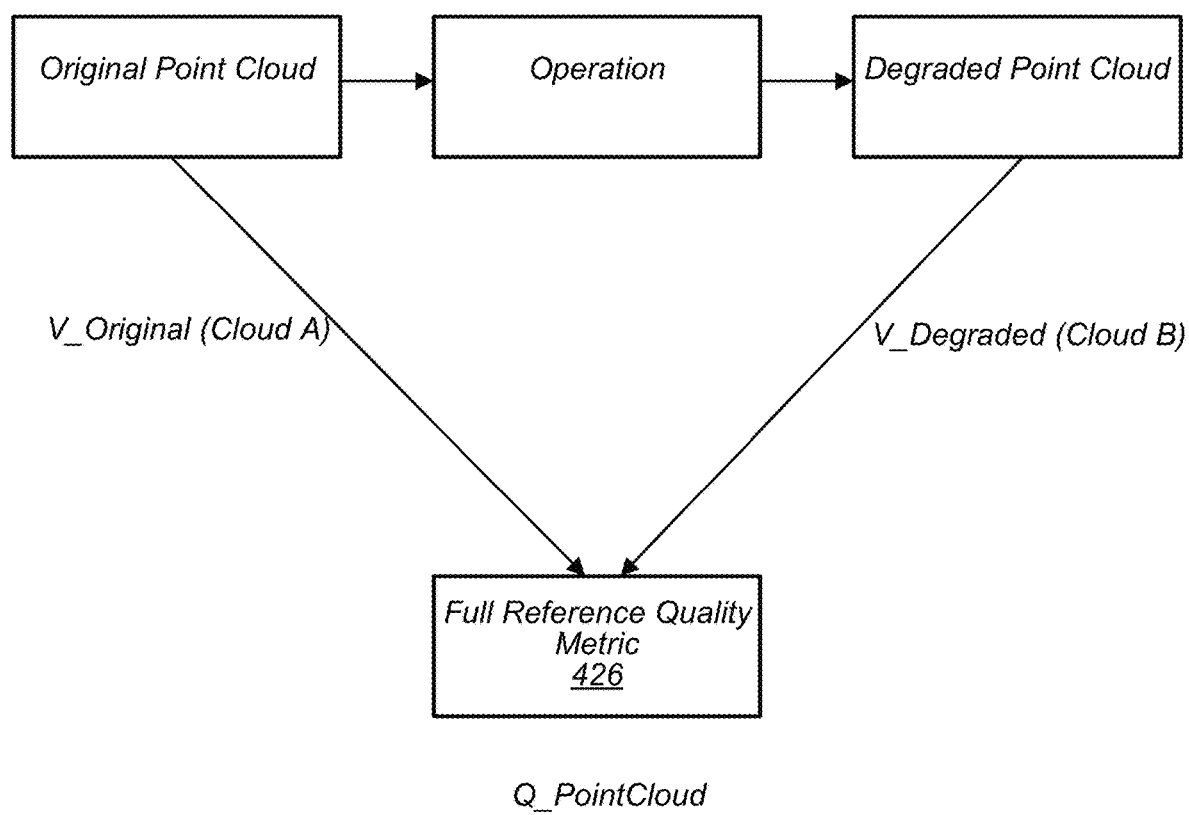
FIG. 4D illustrates an example process for determining a quality metric for a point cloud upon which an operation has been performed, according to some embodiments.

The quality metric Q_(point cloud) is computed from Vor and Vdeg and used for assessment as shown in FIG. 4D.

Table 1, below, outlines the metrics used for the assessment of the quality of a point cloud, in some embodiments. The geometric distortion metrics are similar as ones used for meshes based on haussdorf (Linf) and root mean square (L2), instead of distance to surface. This approach takes the distance to the closest/most nearby point in the point cloud (see definitions 4, 5, 6, and 7) into account. Peak signal to noise ratio (PSNR) is defined as the peak signal of the geometry over the symmetric Root Mean Square (RMS/rms) distortion (def 8.). For colors, a similar metric is defined; the color of the original cloud is compared to the most nearby color in the degraded cloud and peak signal to noise ratio (PSNR) is computed per YUV/YCbCr component in the YUV color space (def. 10). An advantage of this metric is that it corresponds to peak signal to noise ratio (PSNR) in Video Coding. The quality metric is supported in the 3DG PCC software.

TABLE 1

Assessment criteria for assessment of the point cloud quality of Vdeg, $Q_{point\_cloud}$

| | | |
|---|---|---|
| d_symmetric_rms | Symmetric rms distance between the point clouds | (def. 5.) |
| d_symmetric_haussdorf | Symmetric haussdorf distance between the clouds | (def. 7.) |
| psnr_geom | Peak signal to noise ratio geometry (vertex positions) | (def. 8.) |
| psnr_y | Peak signal to noise ratio geometry (colors Y) | (def. 10) |
| psnr_u | Peak signal to noise ratio geometry (colors U) | (as def. 10 rep. y for u) |
| psnr_v | Peak signal to noise ratio geometry (colors V) | (as def. 10 rep. y for v) |

$$d_{rms}(V_{or}, V_{deg}) = \sqrt{\frac{1}{K}\sum\nolimits_{vo \in Vor} \|vo - vd\_nearest\_neighbour\|^2} \quad \text{(def. 4)}$$

$$d_{symmetric\_rms}(V_{or}, V_{deg}) = \max\,(d_{rms}(V_{or},V_{deg}),\, d_{rms}(V_{deg},V_{or})) \quad \text{(def. 5)}$$

$$d_{haussdorf}(V_{or}, V_{deg}) = \max\nolimits_{v_o \in V_{or}}(\|v_o - v_{d\_nearest\_neighbour}\|_2,$$

$v_d$ is the point in Vdeg closest to $v_o$ (L2)) (def. 6)

$$d_{symmetric\_haussdorf}(V_{or}, V_{deg}) = \max\,(d_{haussdorf}(V_{or}, V_{deg}),\, d_{haussdorf}(V_{deg}, V_{or})) \quad \text{(def. 7)}$$

BBwidth = max ((xmax − xmin), (ymax − ymin), (zmax − zmin)) (def. 8)

$psnr_{geom} = 10\log_{10}(\|BBwidth\|_2^2 / (d_{symmetric\_rms}(V))^2)$ (def. 9)

TABLE 1-continued

Assessment criteria for assessment of the point cloud quality of Vdeg, $Q_{point\_cloud}$ $$d_y(V_{or}, V_{deg}) = \sqrt{\frac{1}{K}\sum_{vo \in V_{or}} \left\| y(vo) - y\left(v_{dnearest_{neighbour}}\right)\right\|^2} \quad \text{(def. 10)}$$

$$psnr_y = 10\log_{10}(\|255\|^2/(d_y(V_{or}, V_{deg})^2)) \quad \text{(def. 11)}$$

In some embodiments, additional metrics that define the performance of a codec are outlined below in Table 2.

TABLE 2

Additional Performance Metrics

| | |
|---|---|
| Compressed size | Complete compressed mesh size |
| In point count | K, the number of vertices in Vor |
| Out point count | N, number of vertices in Vdeg |
| Bytes_geometry_layer | Number of bytes for encoding the vertex positions |
| Bytes_color_layer (opt) | Number of bytes for encoding the colour attributes |
| Bytes_att_layer (opt) | Number of bytes for encoding the other attributes |
| Encoder time (opt) | Encoder time in ms on commodity hardware (optional) |
| Decoder time (opt) | Decoder time in ms on commodity hardware (optional) |

Example Closed Form Solution

For each point $P_{rec}(i)$ in the reconstructed point cloud, let $Q^*(i)$ be its nearest neighbor in the original point cloud. For each point $P_{rec}(i)$ in the reconstructed point cloud, let $(Q^+(i,h))_{h \in \{1, \ldots, H(i)\}}$ be the set of point in the original point cloud that share $P_{rec}(i)$ as their nearest neighbor in the reconstructed point cloud. Let $\mathbb{Q}^+(i)$ be the centroid of $(Q^+(i, h))_{h \in \{1, \ldots, H(i)\}}$.

If $H=0$, then $C(P_{rec}(i))=C(Q^*(i))$

Denote as R-G-B vector $C(P)$ associated with a given point P. In order to compute the color for a given $P_{rec}(i)$, we have the following formulation:

$$\underset{C(P_{rec}(i))}{\text{argmin}}\max\left\{\frac{1}{N_{rec}}\|C(P_{rec}(i)) - C(Q^*(i))\|^2, \frac{1}{N}\sum_{h=1}^{H}\|C(P_{rec}(i)) - C(Q^+(i,h))\|^2\right\}$$

Where $\max\left\{\frac{1}{N_{rec}}\|C(P_{rec}(i)) - C(Q^*(i))\|^2, \right.$ $$\left.\sum_{h=1}^{H}\|C(P_{rec}(i)) - C(\mathbb{Q}^+(i)) + C(\mathbb{Q}^+(i)) - C(Q^+(i,h))\|^2\right\} =$$

$$\max\left\{\frac{1}{N_{rec}}\|C(P_{rec}(i)) - C(Q^*(i))\|^2, \frac{H}{N}\|C(P_{rec}(i)) - C(\mathbb{Q}^+(i))\|^2 + \frac{1}{N}\sum_{h=1}^{H}\right.$$

$$\left.\|C(\mathbb{Q}^+(i)) - C(Q^+(i,h))\|^2 + \frac{2}{N}\right.$$

$$\sum_{h=1}^{H}\langle C(P_{rec}(i)) - C(\mathbb{Q}^+(i)), C(\mathbb{Q}^+(i)) - C(Q^+(i,h))\rangle\right\} =$$

$$\max\left\{\frac{1}{N_{rec}}\|C(P_{rec}(i)) - C(Q^*(i))\|^2, \frac{H}{N}\|C(P_{rec}(i)) - C(\mathbb{Q}^+(i))\|^2 + \frac{1}{N}\sum_{h=1}^{H}\|C(\mathbb{Q}^+(i)) - C(Q^+(i,h))\|^2\right\}$$

Now denote $D^2 = \sum_{h=1}^{H}\|C(\mathbb{Q}^+(i)) - C(Q^+(i,h))\|^2$, so that $$\underset{C(P_{rec}(i))}{\text{argmin}}\max\left\{\frac{1}{N_{rec}}\|C(P_{rec}(i)) - C(Q^*(i))\|^2,\right.$$

$$\left.\frac{H}{N}\|C(P_{rec}(i)) - C(\mathbb{Q}^+(i))\|^2 + \frac{D^2}{N}\right\}.$$

Note: if $H=1$ then $D^2=0$

Let $C^0(P_{rec}(i))$ be a solution of the previous minimization problem. It can be shown that $C^0(P_{rec}(i))$ could be expressed as:

$$C^0(P_{rec}(i)) = wC(Q^*(i)) + (1-w)C(\mathbb{Q}^+(i))$$

Furthermore, $C^0(P_{rec}(i))$ verifies:

$$\frac{1}{N_{rec}}\|wC(Q^*(i)) + (1-w)C(\mathbb{Q}^+(i)) - C(Q^*(i))\|^2 =$$

$$\frac{H}{N}\|wC(Q^*(i)) + (1-w)C(\mathbb{Q}^+(i)) - C(\mathbb{Q}^+(i))\|^2 + \frac{D^2}{N}(1-w)^2\|$$

$$C(\mathbb{Q}^+(i)) - C(Q^*(i)) - C(Q^*(i))\|^2 = w^2\frac{HN_{rec}}{N}\|$$

$$C(Q^*(i)) - C(\mathbb{Q}^+(i))\|^2 + \frac{D^2 N_{rec}}{N}$$

Let $\delta^2 = \|C(Q^*(i)) - C(\mathbb{Q}^+(i))\|^2$ and $r = \frac{N_{rec}}{N}$ If $\delta^2 = 0$, then $C(P_{rec}(i)) = C(Q^*(i)) = C(\mathbb{Q}^+(i))$ $(1-w)^2\delta^2 = w^2 rH\delta^2 + rD^2$ $\delta^2 + w^2\delta^2 - 2w\delta^2 = w^2 rH\delta^2 + rD^2$ $\delta^2(1 - rH)w^2 - 2\delta^2 w + (\delta^2 - rD^2) = 0$ $(rH - 1)w^2 + 2w + (\alpha r - 1) = 0$ With $\alpha = \frac{D^2}{\delta^2}$ if $H=1$, then $w=1$
if $H>1$ $\Delta = 4 - 4(rH-1)(\alpha r - 1)$ $\Delta = 4 - 4(rH-1)\alpha r + 4H - 4$ $\Delta = 4(H - (rH-1)\alpha r)$ If $\Delta = 0$ $$w = \frac{-1}{(rH-1)}$$

If Δ>0

$$w1 = \frac{-1 - \sqrt{(H-(Hr-1)\alpha r)}}{(rH-1)}$$

$$w2 = \frac{-1 + \sqrt{(H-(Hr-1)\alpha r)}}{(rH-1)}$$

Where the cost C(i) is computed for both w1 and w2 and the value that leads to the minimum cost is retained as the final solution.

Compression/Decompression Using Multiple Resolutions

Figure 5A:
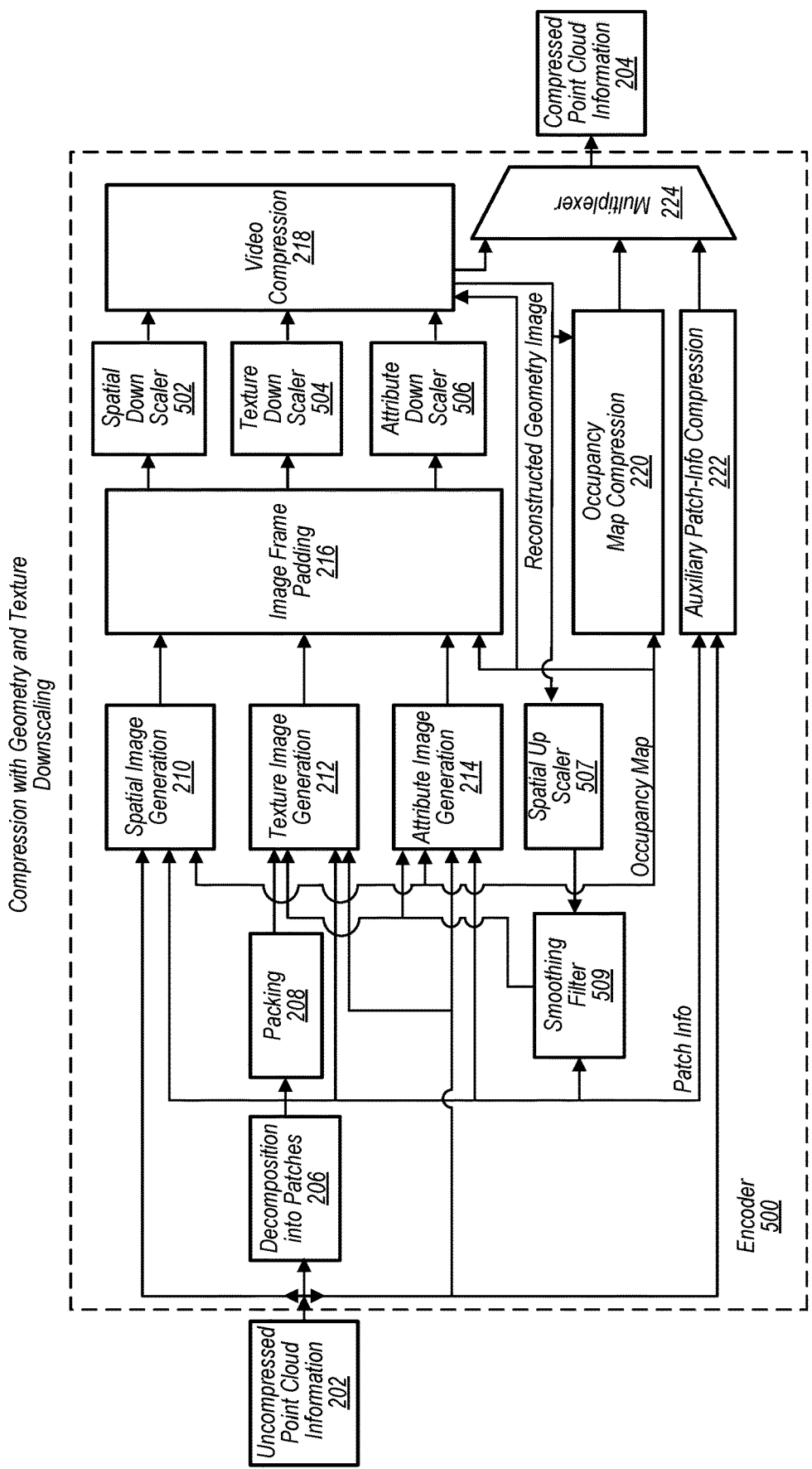
FIG. 5A illustrates components of an encoder that includes geometry, texture, and/or other attribute downscaling, according to some embodiments.

FIG. 5A illustrates components of an encoder that includes geometry, texture, and/or attribute downscaling, according to some embodiments. Any of the encoders described herein may further include a spatial down-scaler component 502, a texture down-scaler component 504, and/or an attribute down-scaler component 506 as shown for encoder 500 in FIG. 5A. For example, encoder 200 illustrated in FIG. 2A may further include downscaling components as described in FIG. 5A. In some embodiments, encoder 250 may further include downscaling components as described in FIG. 5A.

In some embodiments, an encoder that includes downscaling components, such as geometry down-scaler 502, texture down-scaler 504, and/or attribute down-scaler 506, may further include a geometry up-scaler, such as spatial up-scaler 507, and a smoothing filter, such as smoothing filter 509. In some embodiments, a reconstructed geometry image is generated from compressed patch images, compressed by video compression module 218. In some embodiments an encoder may further include a geometry reconstruction module (not shown) to generate the reconstructed geometry image. The reconstructed geometry image may be used by the occupancy map to encode and/or improve encoding of an occupancy map that indicates patch locations for patches included in one or more frame images. Additionally, the reconstructed geometry image may be provided to a geometry up-scaler, such as geometry up-scaler 507. A geometry up-scaler may scale the reconstructed geometry image up to an original resolution or a higher resolution approximating the original resolution of the geometry image, wherein the original resolution is a resolution prior to downscaling being performed at geometry down-scaler 502. In some embodiments, the upscaled reconstructed geometry image may be provided to a smoothing filter that generates a smoothed image of the reconstructed and upscaled geometry image. This information may then be provided to the spatial image generation module 210, texture image generation module 212, and/or the attribute image generation module 214. These modules may adjust generation of spatial images, texture images, and/or other attribute images based on the reconstructed geometry images. For example, if a patch shape (e.g. geometry) is slightly distorted during the downscaling, encoding, decoding, and upscaling process, these changes may be taken into account when generating spatial images, texture images, and/or other attribute images to correct for the changes in patch shape (e.g. distortion).

Figure 5B:
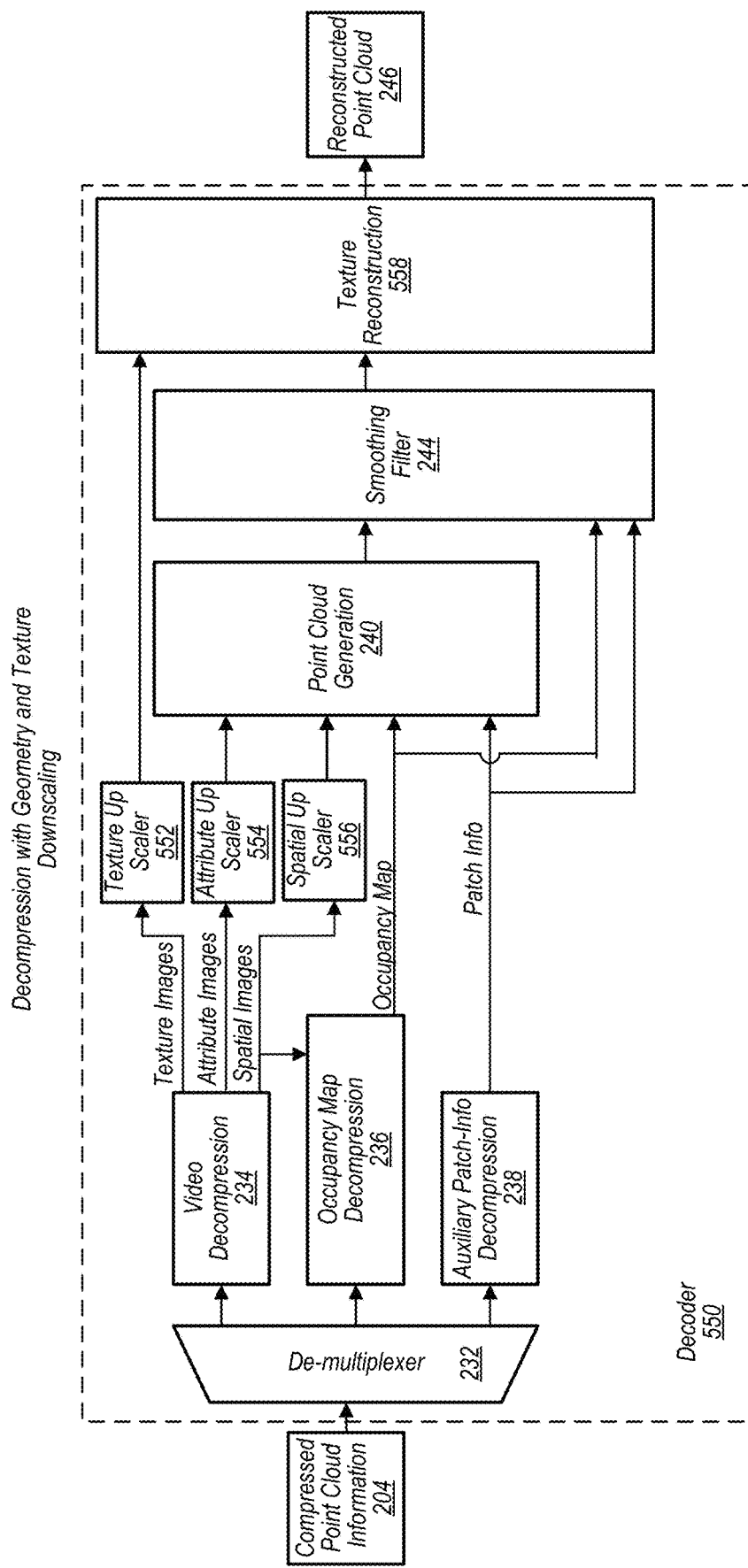
FIG. 5B illustrates components of a decoder that includes geometry, texture, and/or other attribute upscaling, according to some embodiments.

FIG. 5B illustrates components of a decoder 550 that includes geometry, texture, and/or other attribute upscaling, according to some embodiments. For example, decoder 550 includes texture up-scaler 552, attribute up-scaler 554, and spatial up-scaler 556. Any of the decoders described herein may further include a texture up-scaler component 552, an attribute up-scaler component 554, and/or a spatial image up-scaler component 556 as shown for decoder 550 in FIG. 5B.

Figure 5C:
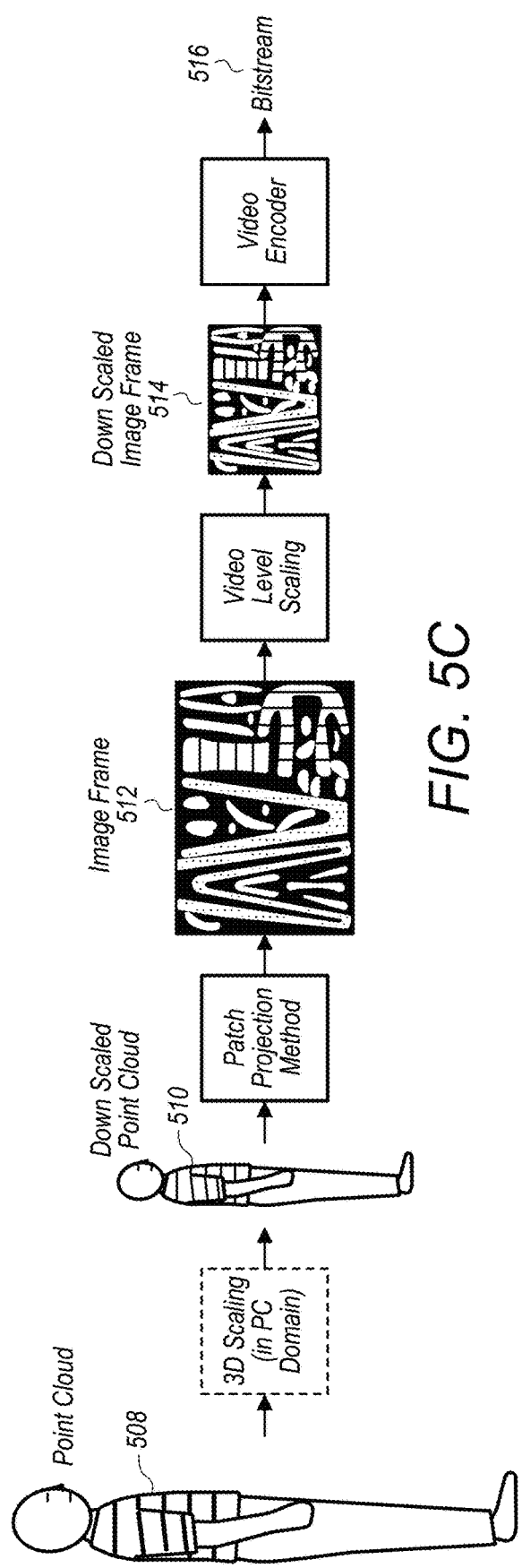
FIG. 5C illustrates rescaling from the perspective of an encoder, according to some embodiments.

FIG. 5C illustrates rescaling from the perspective of an encoder, according to some embodiments. In some embodiments, a point cloud may be scaled in both the point cloud domain (e.g. prior to patch projection) and in a video level domain (e.g. by scaling image frames comprising patch information). For example FIG. 5C illustrates a point cloud 508 of a woman. An encoder, such as encoder 500, performs 3D scaling of the point cloud 508 in the point cloud domain to generate a downscaled point cloud 510. Patches generated based on downscaled point cloud 510 are packed into image frame 512. Additionally, downscaling is performed on the image frame 512 at the video level to reduce a resolution of the image frame. The additional downscaling results in a downscaled image frame 514 that is then encoded into a bit stream 516.

Figure 5D:
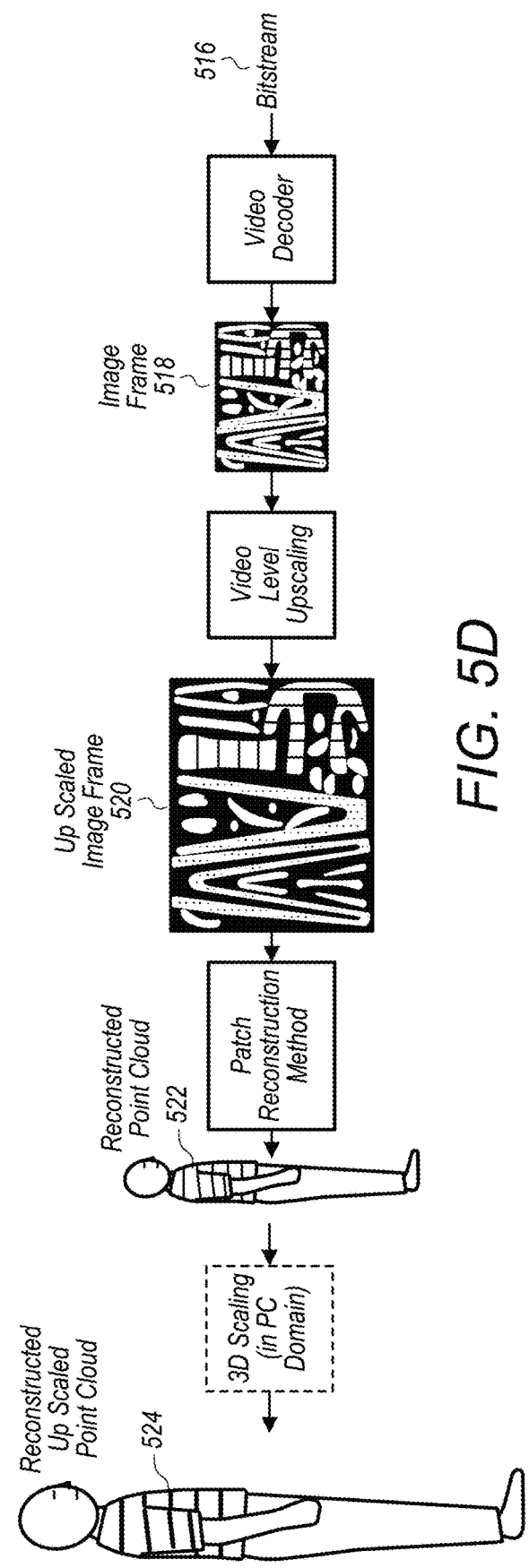
FIG. 5D illustrates rescaling from the perspective of a decoder, according to some embodiments.

FIG. 5D illustrates rescaling from the perspective of a decoder, according to some embodiments. In some embodiments, a decoder, such as decoder 550, may receive a bit stream, such as bit stream 516. The decoder may decode the video encoded bit stream to generate one or more video image frames, such as image frame 518. The decoder may further upscale the image frame 518 to generate an upscaled image frame 520. The decoder may then use a patch projection method, as described above, to generate a reconstructed point cloud 522 from the patch information included in the upscaled image frame 520. The decoder may also perform scaling in the 3D point cloud domain to scale up the reconstructed point cloud 522 to a similar size as the original point cloud. This process may result in an upscaled reconstructed point cloud 524.

Figure 5E:
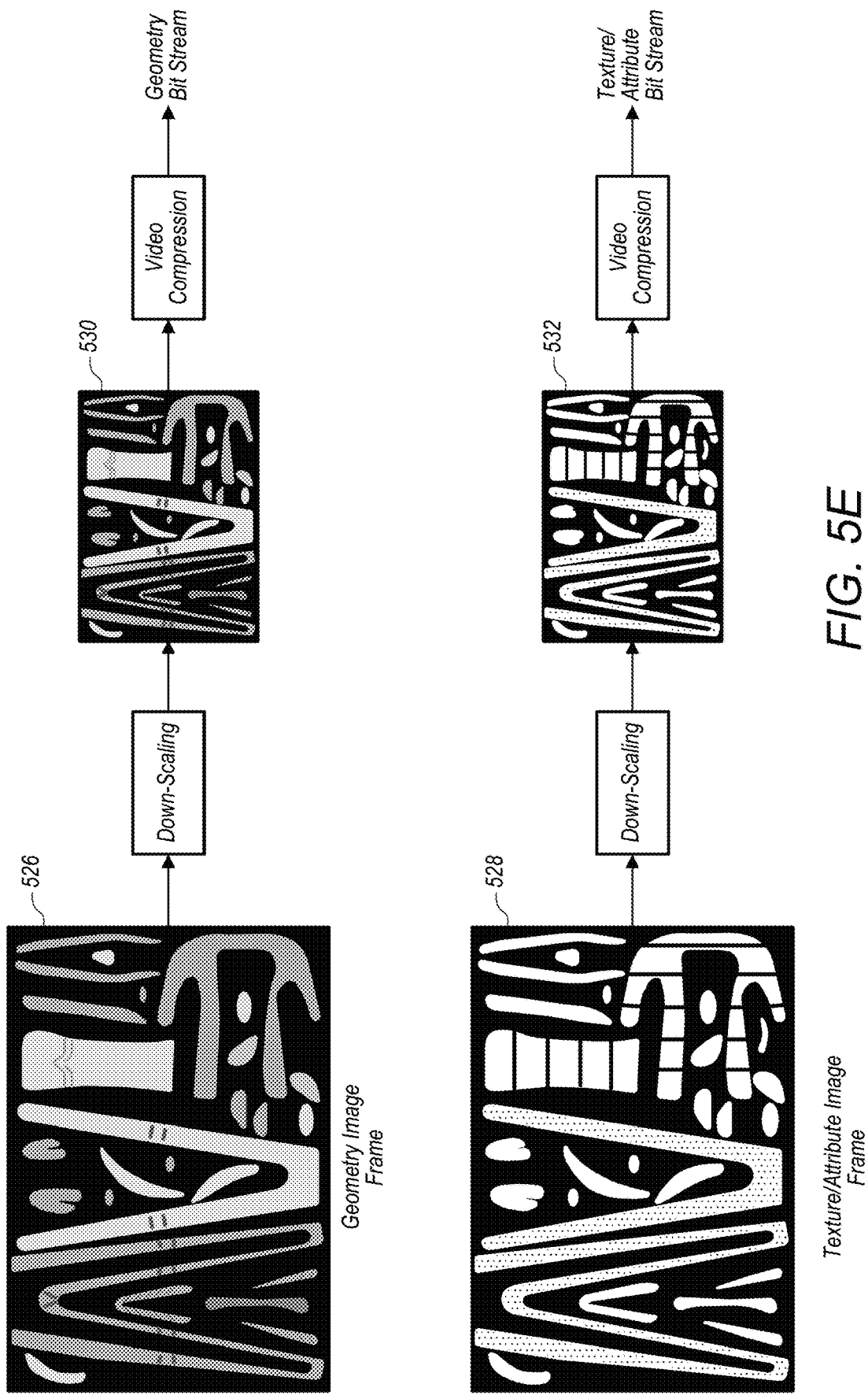
FIG. 5E illustrates an example open loop rescaling, according to some embodiments.

FIG. 5E illustrates an example open loop rescaling, according to some embodiments. In an open loop rescaling of an image frame, a geometry plane, and a texture or other attribute plane may be independently scaled, where geometry distortion is not taken into account when scaling the texture or other attribute information. For example, geometry image frame 526 may indicate depths of points of a point cloud relative to a projection plane and texture or attribute image frame 528 may represent respective attributes of the points of the point cloud projected on to the projection plane. As shown in FIG. 5E, in an open loop rescaling process, the geometry information and the attribute information may be independently scaled to generate downscaled geometry image frame 532 and downscaled attribute image frame 532, respectively. Also, as shown in FIG. 5E, the downscaled geometry image frame 530 may be encoded/compressed to generate a geometry bit stream and the downscaled attribute image frame 532 may be encoded/compressed to generate an attribute bit stream, such as a texture attribute bit stream. For example, spatial down-scaler 502 may downscale the geometry image frame 526 and the texture down-scaler 504 may independently downscale the texture image frame 528. In some embodiments, attribute down-scaler 506 may downscale an attribute independently of spatial down-scaler 502 and texture down-scaler 504. Because different down-scalers are used to downscale different types of image frames (e.g. spatial information, texture, other attributes, etc.), different downscaling parameters may be applied to the different types of image frames to downscale geometry different than texture or attributes.

Figure 5F:
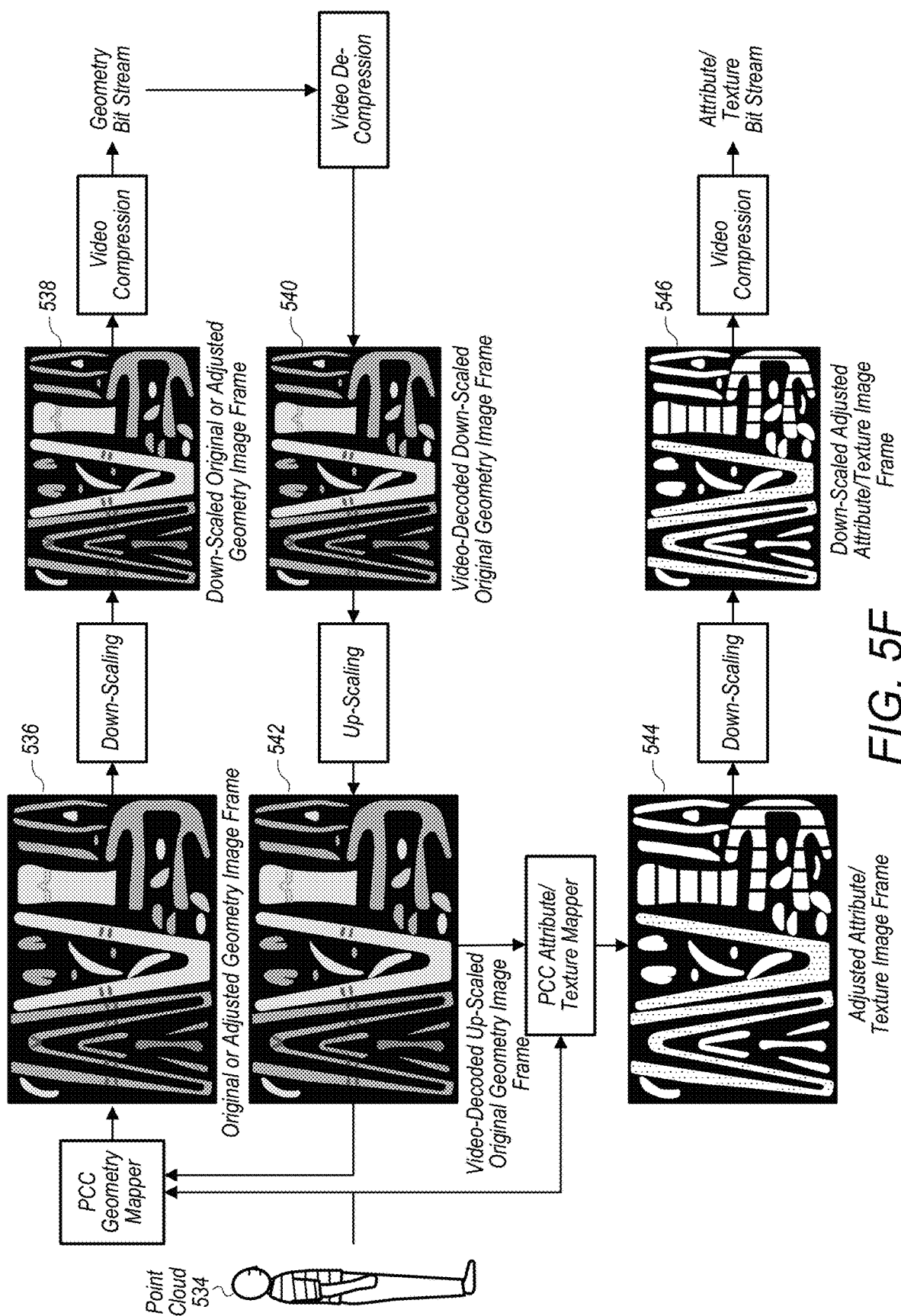
FIG. 5F illustrates an example closed loop rescaling, according to some embodiments.

FIG. 5F illustrates an example closed loop rescaling, according to some embodiments. In some embodiments, a closed loop rescaling process may be used by an encoder such as encoder 500 to determine distortion or other changes to geometry that may occur as part of a downscaling, encoding, decoding, and/or upscaling process. In some embodiments, such distortion may be accounted for when downscaling other attributes, such as texture. An encoder, such as encoder 500, receives a point cloud 534. The encoder generates a geometry image frame for the point cloud 534, for example an image frame comprising patches representing relative depths of the points. A point cloud compression geometry mapper, which may include a decomposition into patches module 506, a packing module 208, and a spatial image generation module 210, etc., generates geometry frame image 536. A geometry down-scaler, such as spatial down-scaler 502 downscales the geometry plane to generate downscaled geometry plane 538. Note that "geometry plane" is used to refer to geometry patch information, which may be included in an image frame only consisting of geometry patches as shown in FIG. 5F.

The downscaled geometry plane 538 is compressed, for example by video compression module 218, and is converted into a geometry bit stream. In a closed loop process as shown in FIG. 5F, the geometry bit stream is decompressed at the encoder to generate a reconstructed geometry plane 540. The reconstructed geometry plane is then upscaled, at the encoder, to generate an upscaled reconstructed geometry plane 542.

The texture points of the point cloud 534 are then mapped to the points of the reconstructed upscaled geometry plane 542. In this way, the texture points are mapped to the same points in the same locations as the decoder will encounter when reconstructing and upscaling the geometry plane. Then, the decoder can take into account the distortion of the geometry plane that may occur due to downscaling, encoding, decoding, and upscaling.

The texture points mapped to the points of the reconstructed upscaled geometry plane 542 may generate a texture plane 544. The texture plane may then be downscaled to generate a downscaled texture plane 546. The downscaled texture plane 546 may then be encoded and transmitted as a texture bit stream.

Figure 5G:
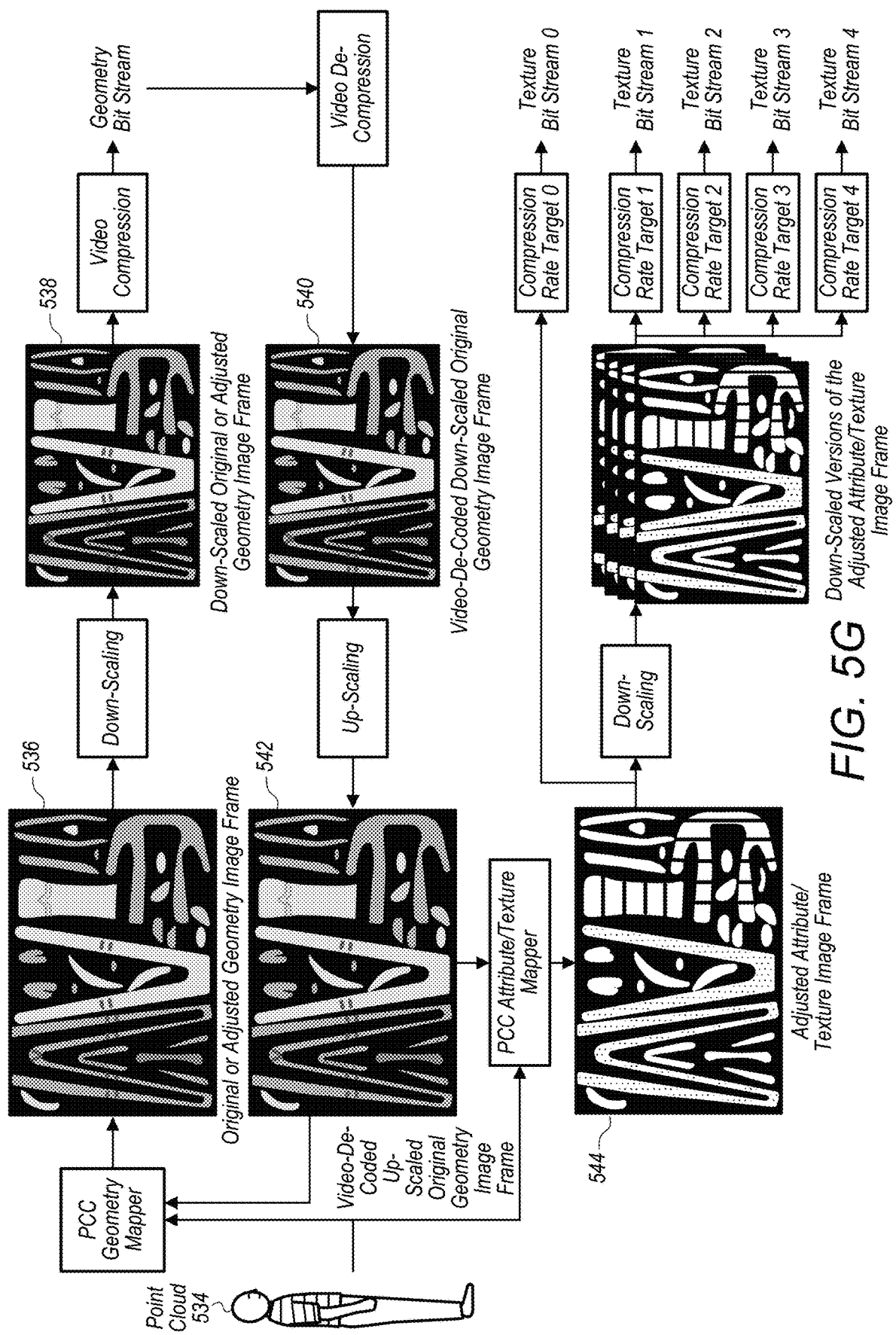
FIG. 5G illustrates an example closed loop rescaling with multiple attribute layers, according to some embodiments.

FIG. 5G illustrates an example closed loop rescaling with multiple attribute layers, according to some embodiments. In some embodiments, a similar process as described for FIG. 5F may be followed. However, multiple degrees of downsampling may be performed for one or more attribute planes being downscaled. For example texture attribute plane 544 may not be downscaled at all (e.g. compression rate target 0), or may be downscaled according to a plurality of compression rate targets (e.g. compression rate targets 1-4). In such embodiments, a compression rate target may be dynamically adjusted, for example based on network conditions, processing capacity, etc.

Figure 5H:
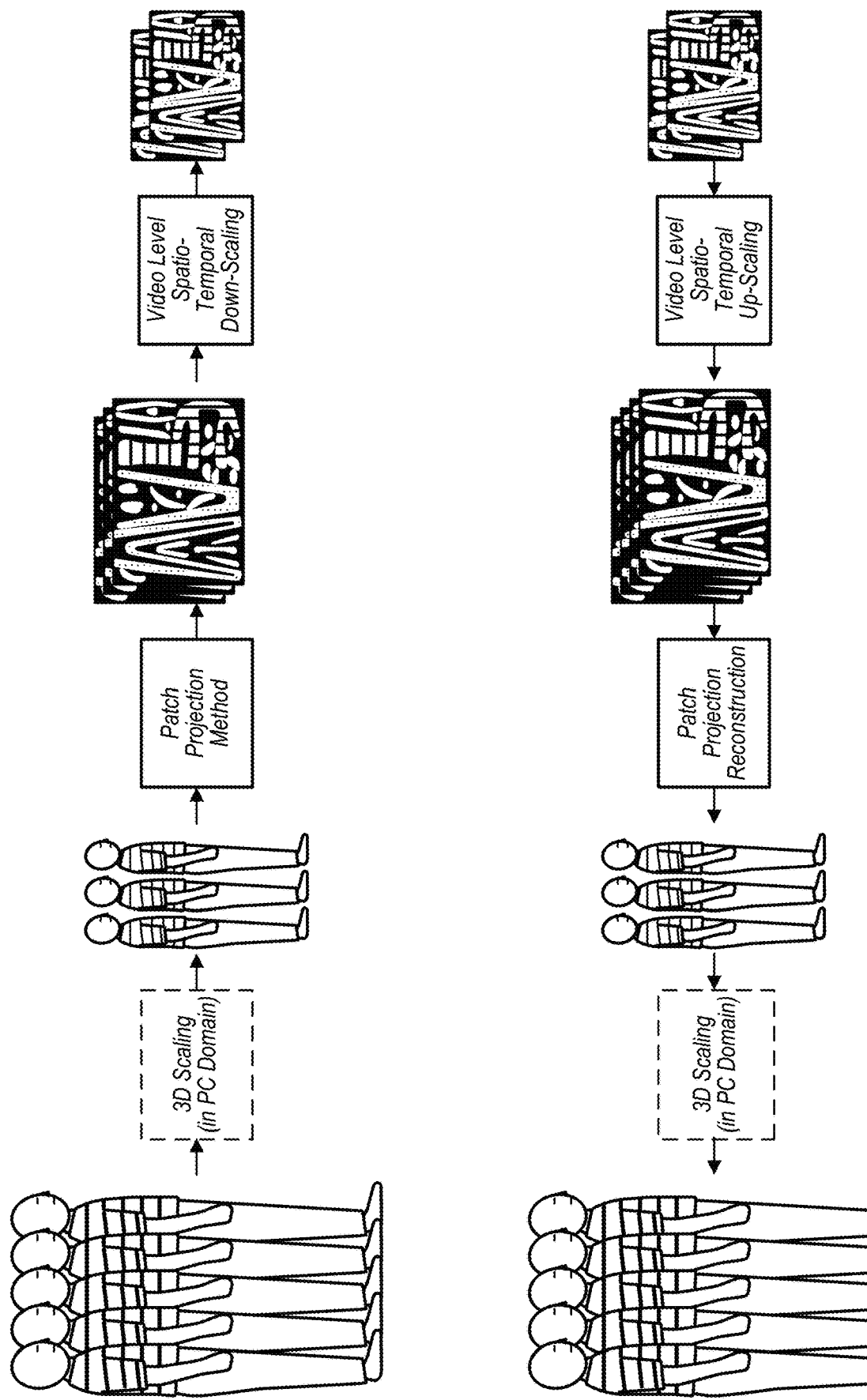
FIG. 5H illustrates an example of video level spatiotemporal scaling, according to some embodiments.
Figure 51:
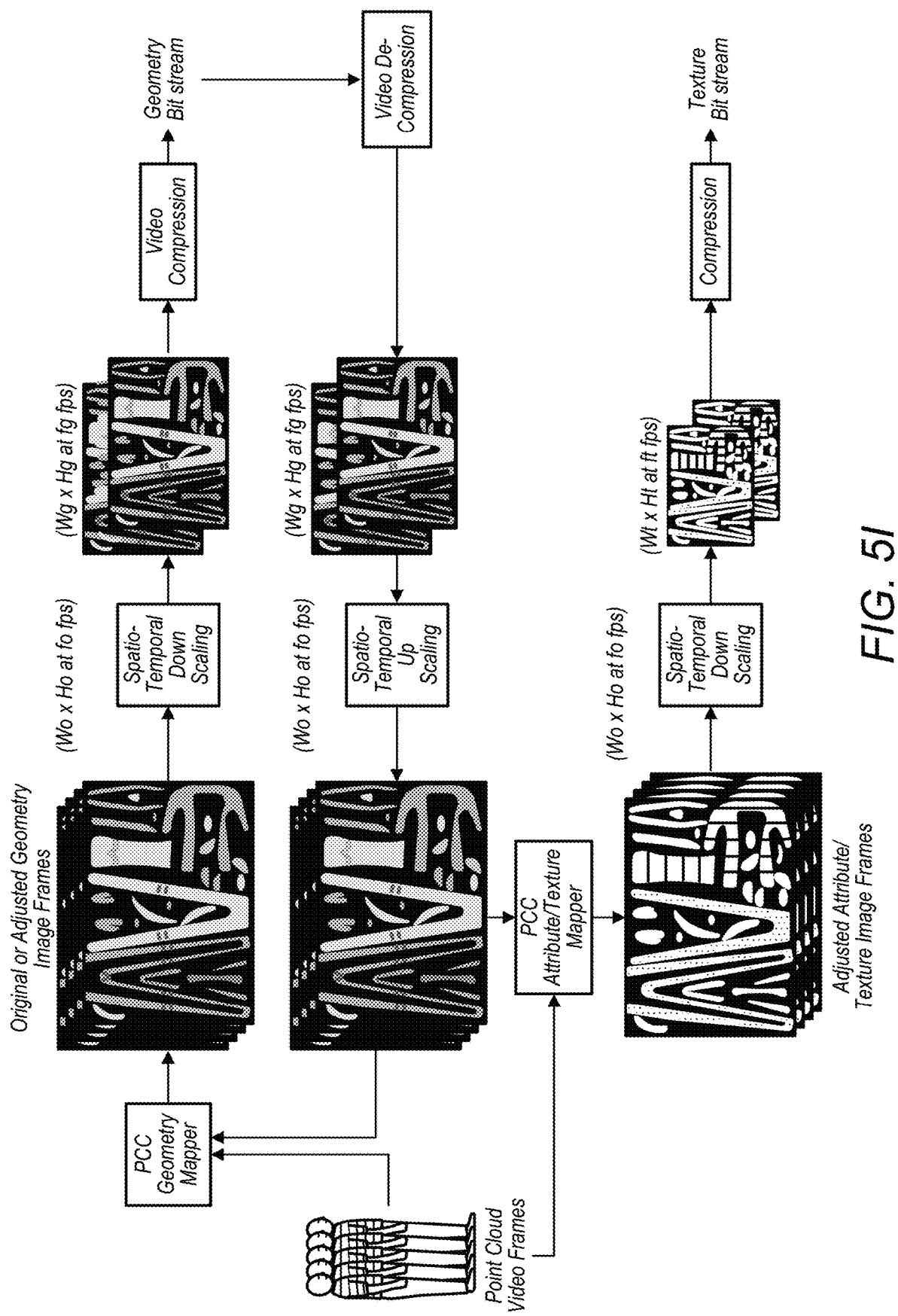

FIG. 5H illustrates an example of video level spatiotemporal scaling, according to some embodiments. In some embodiments, a similar process as described in FIGS. 5C and 5D may be performed using video level spatiotemporal downscaling and upscaling. For example, a frame rate (e.g. a number of frames processed per unit time) may be adjusted up or down in order to improve compression efficiency. In such embodiments spatial temporal adjustment may be made instead of resolution scaling and/or in addition to resolution scaling.

FIG. 5I illustrates an example closed loop rescaling with spatiotemporal scaling, according to some embodiments.

As discussed above, methods of compressing point cloud video data may use conventional video codecs as well as auxiliary information that can help describe and reconstruct the point cloud information. The encoder and decoder diagrams of how that process is performed is shown in at least FIGS. 5A and 5B, respectively. As can be seen, the process segments the point cloud frame into multiple 2D projected images/videos, each representing different types of information. This process is performed by segmenting the point cloud first into multiple patches that permit one to efficiently project the entire 3D space data onto 2D planes. Each patch is associated with information such as geometry (also referred to herein as "spatial information"), texture, and other attributes if they are available. Such information is then copied at the co-located locations of the image frames on separate image sequences with each now containing only the geometry information, the texture information, and any other remaining attributes respectively. Auxiliary information that contains the patch information as well as an occupancy map that dictates which areas in these projected image sequences correspond to actual point cloud data and which are unoccupied, e.g. may contain no data or dummy data, are also provided. Compression is then applied on such information using different strategies. Auxiliary information, for example, is entropy coded, while occupancy maps may be downconverted and encoded using either conventional codecs or other methods such as run length compression. The separate projected image sequences on the other hand are compressed using conventional codecs. This results in a collection of multiple sub streams, e.g. a geometry sub stream, texture and attribute sub streams, as well as occupancy and auxiliary information sub streams.

As described above, all sub streams except the occupancy map are expected to be of the same resolution. Each point in the geometry sub stream essentially corresponds to a point in the final 3D reconstructed point cloud. In some embodiments, it is permitted for the signal to be encoded at a different resolution than the original representation. Also, in some embodiments, offsetting as well as rotating the point cloud is also possible. Seeing things from the encoder perspective, this is done by signaling in the stream header additional metadata that would identify the scaling, offset, and rotation that should be applied onto the original point cloud data prior to projecting it onto the target video planes. From the decoder perspective, these parameters are used after the reconstruction of a first 3D point cloud representation and utilized to generate the final 3D point cloud representation. In such a scheme, both geometry and attribute/texture video data are signaled at the same resolution as specified in the point cloud header. Per patch metadata including scaling factors and rotation parameters are also supported in such a scheme, with scaling though now applied on each projected patch independently.

However, in some embodiments, this scheme may be further extended by providing additional resolution scaling flexibility in the encoded streams. In particular, not only may the scaling be applied in 3D space or per patch, in some embodiments scheme scaling may be applied on the entire projected point cloud video data. This may permit use of "conventional" 2D rescaling schemes and architectures, which are readily available in many architectures. Furthermore, unlike a scheme where geometry and attribute sub streams are encoded at the same resolution, this alternative scheme permits signaling of these sub streams at different resolutions. In some embodiments, this scheme could also be combined with the 3D scaling scheme described above, e.g. the specified 2D image frame scaling can follow in encoding order and precede in decoding order the 3D scaling process as described above. This can provide further flexibility in coding performance.

In particular, with the scheme described above we know the scaling factors, if any, that were applied to the point cloud signal in 3D space to change its resolution. Essentially the point cloud scene/object that is being represented would change from resolution $W_{3D} \times H_{3D} \times D_{3D}$ to $(s_x \times W_{3D}) \times (s_y \times H_{3D}) \times (s_z \times D_{3D})$. Then this rescaled object would be projected using the patch approach specified above into a variety of sub videos, e.g. occupancy, geometry and attribute sub videos, each of a nominal resolution of $W_N \times H_N$. The nominal resolution may be currently specified in the group of frames header syntax of the MPEG PCC TMC2 draft (v1.2), using the syntax elements frame_width and frame_height. The scaling factors may be added into this syntax.

Group of Frames Header Syntax in TMC 2 v1.2

| group_of_frames_header( ) { | Descriptor |
|---|---|
| group_of_frames_size | u(8) |
| frame_width | u(16) |
| frame_height | u(16) |
| occupancy_resolution | u(8) |
| radius_to_smoothing | u(8) |
| neighbor_count_smoothing | u(8) |
| radius_to_boundary_detection | u(8) |
| threshold_smoothing | u(8) |
| } | |

With the proposed method one may also now rescale the geometry and attribute signal i further at a resolution of $W_G \times H_G$ and $W_{A(i)} \times H_{A(i)}$ respectively. There is no need of signaling the resolution of these videos in the point cloud compression PCC headers since that information already exists in the video bit streams themselves. Conventional algorithms can be used to rescale the videos from the nominal resolution of $W_N \times H_N$ to $W_G \times H_G$ or $W_{A(i)} \times H_{A(i)}$ and vice versa. These can be seen from the encoder perspective in FIG. 5C and from the decoder perspective in FIG. 5D.

FIG. 5E shows an open loop architecture for converting the geometry and attribute signals. In this architecture the geometry and attribute signals are created and converted independently. In some embodiments, the only dependency is that the geometry signal prior to downscaling and compression is used for generating the texture plane signal. However, in FIG. 5F, a closed loop architecture is considered. In this architecture, the geometry signal is scaled and coded first, then it is reconstructed and up converted to its original resolution. This new geometry signal is then used to generate the texture/attribute plane. Using this method, the texture (or attributes) generated more accurately correspond to the reconstructed geometry compared to the open loop architecture in the previous figure (FIG. 5E). It should be noted that the upscaling process of the geometry, if needed, should be matched across decoders to achieve the desired closed loop performance. If the up-scalers do not match, there could be some difference in performance. The resolutions of the geometry and attribute signals also do not need to match in any of these systems. Conventional up-scalers, such as a separable filter based up-scaler, e.g. bicubic, lanczos, windowed cosine or sine, etc., or more complicated up-scalers, including bilateral up-scalers, edge adaptive, motion compensated, etc. could be used. Downscaling also could use similar methods, e.g. separable filters, edge preserving downscalers, etc.

Such an approach could also be utilized by adaptive streaming solutions as well. In particular in adaptive streaming systems multiple streams may be generated at different resolutions and bitrates to better support the variability of a network. In this system apart from adjusting bitrates for the different layers, different resolutions can also be used between the texture and geometry to also augment such functionality. An example is shown in FIG. 5G where for a particular geometry signal multiple different bit streams are generated for the texture/attribute layer, each potentially having different resolution as well. A decoder may select to use the particular texture layer and then also select the appropriate corresponding sub-bit stream for the texture given the overall bandwidth characteristics of their network.

In a different aspect, downscaling and upscaling of the different layers can be performed by considering the characteristics of the point cloud system and how the images are constructed. In particular, in the systems described above, images are constructed using patches. These patches are available at both the encoder and decoder. A conventional system likely will not be able to consider the patches, however a more advanced system could utilize the patches to improve these two processes. In particular, better performance could be achieved by processing/filtering when upscaling or downscaling only the samples within a patch. Samples outside the patch are likely padded samples that may have no direct relationship with the samples inside the patch and if filtered/processed together could contaminate the signal. By isolating such samples this contamination can be avoided and performance can be improved. Even if not able to extract the full patch location information in a system, it could still be possible to consider other related information such as the occupancy map information. Occupancy maps, even though less accurate if they were down sampled, can still provide some improvement in performance. On the other hand, the interpolation process for the attribute signals may be augmented by also considering the characteristics, e.g. edges, in the geometry signal. In particular, edges may be extracted in the geometry signal, and they may be related to edges in the attribute signals and a guided interpolation based on that information may be performed. This is possible since edges in the two layers are highly related, especially at the boundaries of every patch.

In some embodiments, spatiotemporal rescaling may be applied as shown in FIGS. 5H and 5I. In some embodiments, on the encoder, frame dropping may be performed, while the decision to drop a frame may be based on how similar are the "neighboring" frames or the frame dropping could be done at a fixed rate (time stamps would still exist in the stream to inform the use of temporal relationships). In some embodiments "blending"/averaging of frames may be performed. That is, all frames may be scaled using different phase that is controlled "temporally". For example, odd frames may be scaled vertically using phase 0, while even frames would be scaled vertically using phase 1. Those scaled images are called fields, which are then interleaved together to create interlace frames. This process could be used for projected point cloud data. Note that interleaving does not need to be restricted in vertical fashion, but could be done horizontally instead or as well.

For the temporal up conversion, frame repeats could be used, or more intelligent methods could be used that include motion adaptive and motion compensated strategies for the interpolation. Machine learning methods could also be used to assist with the interpolation.

In some embodiments, assume that the temporal resolution is only reduced in one of the planes (e.g. geometry or texture) while for the other all frames are retained (along with the occupancy and patch information). In such a case the "shape" and location of all patches in the reduced temporal resolution plane are known, but the exact value of its characteristics (depth for geometry, color for texture) is not known. However, that value may be computed by trying to locate each patch in their temporal adjacent neighbors. That can be done by searching using the shape information of the patch and/or the available values of the patch characteristics of the full resolution plane. That basically would involve a search (e.g. a motion estimation based search). When a patch is located, the information from the characteristics to interpolate from its temporal neighbors can be copied/blended and used as a predictor.

Post Video Decompression Filtering/Post-Processing

Figure 6A:
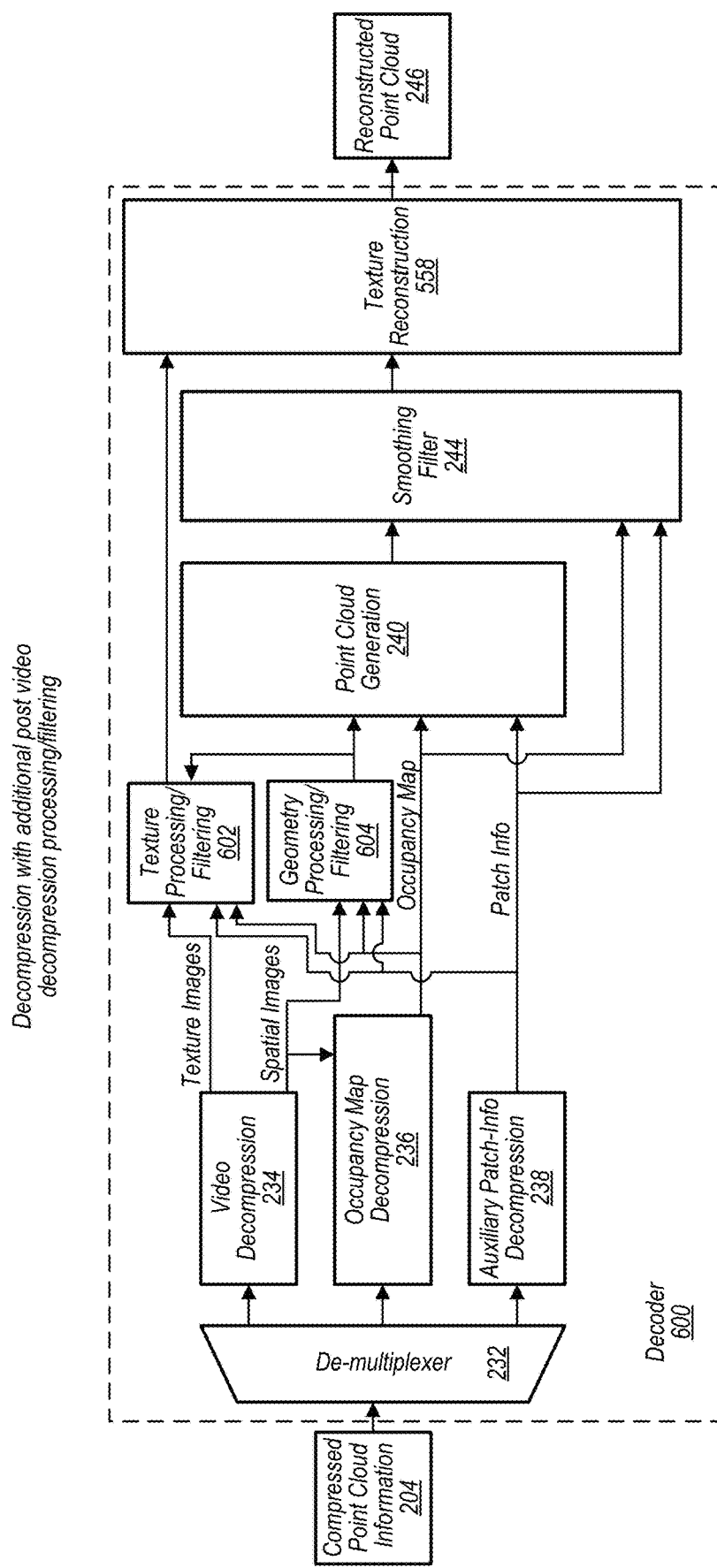
FIG. 6A illustrates components of a decoder that further includes post video decompression texture processing and/or filtering and post video decompression geometry processing/filtering according to some embodiments.

FIG. 6A illustrates components of a decoder that further includes post video decompression texture processing and/or filtering and post video decompression geometry processing/filtering according to some embodiments. Decoder 600 includes texture processing/filtering element 602 and geometry processing/filter element 604. In some embodiments, any of the decoders described herein, such as decoder 230 or decoder 280 may further include a texture processing/filtering element, such as texture processing/filter element 602. In some embodiments, any of the decoders described herein, such as decoder 230 or decoder 280, may further include a geometry processing/filtering element, such as geometry/filtering element 604.

As discussed above, video point cloud data may be compressed using conventional video codecs. Also, auxiliary information that can be used to describe and reconstruct a point cloud may be compressed using conventional video codecs. As discussed above, the process segments a point cloud frame into multiple 2D projected images/videos, each representing different types of information. This process is performed by segmenting the point cloud into multiple patches that permit one to efficiently project the 3D space data of the point cloud onto 2D planes. Each patch is associated with information such as geometry, texture, and/or other attributes, if they are available. Such information is then copied at co-located locations on separate image frame sequences with each image frame containing only the geometry information, the texture information, or any other remaining attributes, respectively. Auxiliary information that contains the patch information as well as an occupancy map that dictates which areas in these projected image frame sequences correspond to actual point cloud data and which are unoccupied, e.g. may contain no or dummy data, are also provided. Compression is applied on such information using different strategies. Auxiliary information, for example, can be entropy coded, while occupancy maps may be down converted and encoded using either conventional codecs or other methods such as run length compression. The separate projected image sequences on the other hand are compressed using conventional codecs. This results in a collection of multiple sub streams, e.g. a geometry sub stream, texture and attribute sub streams, as well as occupancy and auxiliary information sub streams. All these streams are multiplexed together to generate the final point cloud bit stream as shown in FIG. 2A.

Figure 6B:
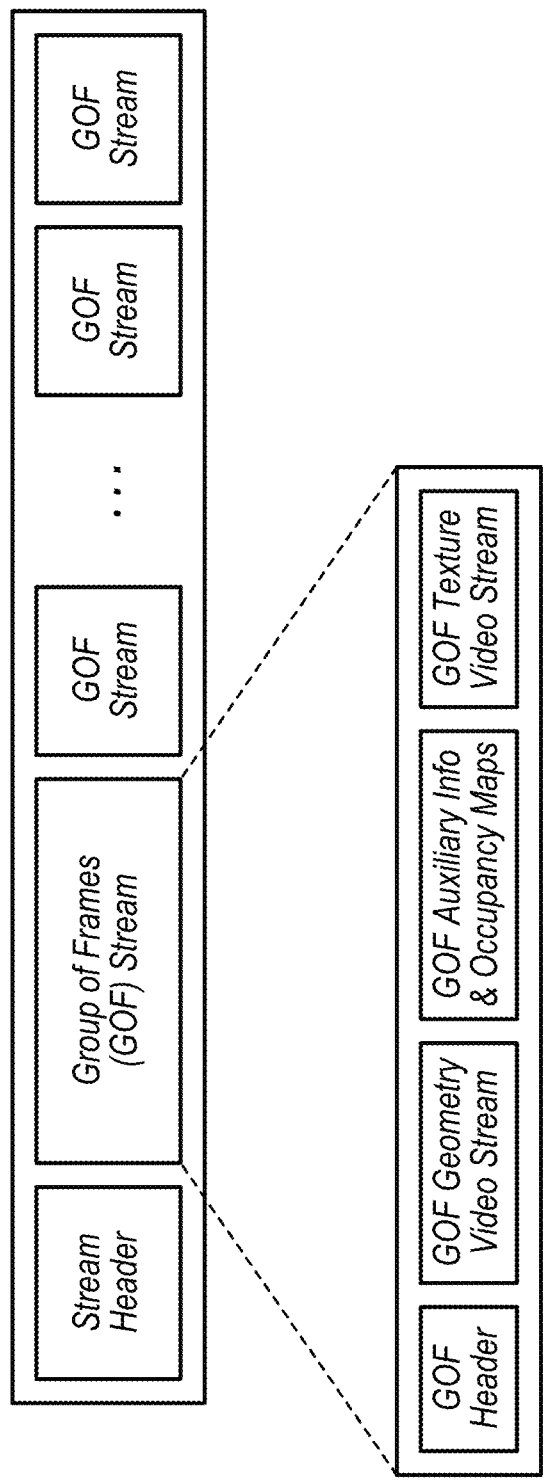
FIG. 6B illustrates, a bit stream structure for a compressed point cloud, according to some embodiments.

For example, FIG. 6B illustrates a bit stream structure for a compressed point cloud, according to some embodiments.

One of the characteristics of this point cloud coding scheme is that the different projected image sequences can be not only compressed using "conventional" codecs but also processed with conventional processing algorithms reserved for 2D image/video data. That is, one could apply de-noising, scaling, enhancement, and/or other algorithms commonly used for processing 2D image data onto these image sequences. Such processing could have advantages, especially in terms of complexity and reuse of existing hardware implementations, versus performing such processing in the 3D domain.

One example of such processing is the conversion of the data from an RGB 4:4:4 representation to a 4:2:0 YCbCr representation and vice versa. In that scenario, for down conversion, the RGB data would be, for example, first converted to a YCbCr 4:4:4 representation, and then the chroma planes could be filtered and downscaled to ¼ of their original resolution (half resolution horizontally and vertically). For the inverse process, the chroma planes would be upscaled to their original resolution, e.g. back to YCbCr 4:4:4, and then the signal would be converted back to RGB 4:4:4. A variety of down conversion and up conversion methods could be used, including the use of edge adaptive downscaling and upscaling, as well as techniques such as the luma adjustment method.

Although some conventional processing methods may operate "as is" on the point cloud projected image sequences they do not fully consider the characteristics of such images and in particular the relationship that exists between different layers or the information about patches and occupancy. Consideration of such information could improve performance. For example, such methods may be improved by taking into account such characteristics and information, therefore improving performance and the final quality of the reconstructed 3D point cloud from the projected images.

In particular, conventional methods will most likely process the projected image sequences assuming that all samples inside these sequences are highly correlated and that adjoining samples likely correspond to the same or at least neighboring objects. Unfortunately, this may not be the case in such imagery. In fact, such image frames consist of samples that correspond to projected patches, as well as filler areas used to separate and distinguish these patches. Such filler areas may be left unfilled, e.g. with a default color value, or may have been filled using padding methods as described herein. Processing of individual samples, e.g. when using long filters for filtering, may result in contamination of information between different patches as well as the filler areas, which can impair quality.

Knowledge of the precise patch location and the filler areas can instead benefit performance substantially. In some embodiments, a processing engine (such as texture processing/filtering element 602 and/or geometry processing/filtering element 604) performs filtering/processing operations on such image data on a patch by patch basis. That is, a particular sample s is processed/filtered by accounting for samples that correspond to the same patch as s. Samples that may have been included in the processing using a conventional method, e.g. because of the consideration of a long filter, but which do not correspond to the same patch are excluded from the processing of s. This could be done, for example, by reducing the length of the processing filter until such samples are fully excluded, or by performing on the fly extrapolation of the data at the boundaries between patches, when processing, and using the extrapolated data in place of the available data outside a patch.

The same principles could be applied when processing filler data, which can be seen as a patch on its own.

A particular system may consider the exact location and shape information for each individual patch, e.g. it may require that the patch information be fully decoded and therefore is fully available during processing. This can provide the most accurate processing and can avoid contamination across patches. In some embodiments, an approximation of the patch location and shape can be determined by looking only at the occupancy map information, which may have been coded using a conventional 2D video coding system. In this case, since occupancy information may have been subsampled, e.g. by 4 times horizontally and vertically (16 times overall), some of the samples at the boundaries of the patch may have been duplicated. This may have some implications in performance, however, processing complexity can be considerably lower since there is no need to decode the full patch information.

Point cloud data are associated with geometry information as well as other attributes, e.g. texture, color, reflectance information, etc. Improved performance may be achieved by considering the relationships and characteristics across different attributes. In particular, similarity or dissimilarity of the geometry sample values in the projected plane may be accounted for when processing the corresponding samples in an attribute plane. In particular, neighboring projected samples that correspond to the same or similar depth in the geometry plane are expected to be highly correlated. However, neighboring samples that have very dissimilar depth information are less likely to be correlated. Therefore, when processing such samples, depth information could also be considered to determine how these samples should be considered.

Figure 6C:
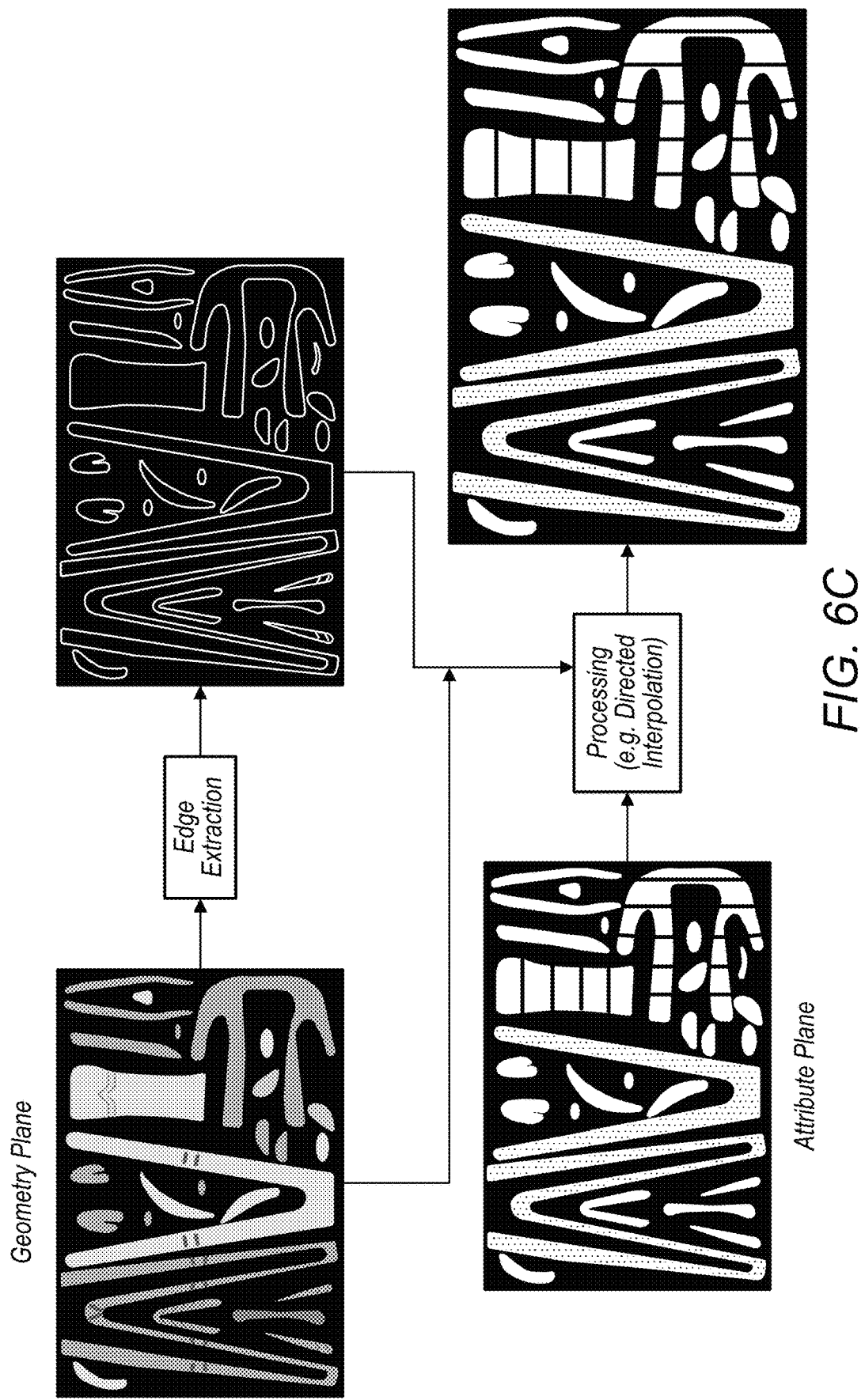
FIG. 6C illustrates an example application where an attribute plane is up-scaled using its corresponding geometry information and the geometry extracted edges, according to some embodiments.

In some embodiments, samples that are too far from a sample x in terms of depth distance, e.g. exceed a distance threshold T, may be excluded when processing sample x. Other samples may be weighted or prioritized in processing again based on their distance. Corresponding information from other attributes and how similar or dissimilar these attributes are could also be considered when processing the sample. Information, such as edges extracted from the geometry plane or from other attribute planes could also be considered when processing. In the particular example of chroma down sampling (e.g. 4:4:4 to 4:2:0), as discussed earlier, edge directed downsampling using the geometry as well as luma attribute information could be performed in the first case, while similarly for up sampling (e.g. 4:2:0 to 4:4:4) an edge directed upsampling process using geometry and luma attribute information could be performed. Such processing could again be patch/occupancy map based as described earlier, however such processing could also be performed on its own without such consideration. In another example, directed interpolation could be performed of the attribute planes from a resolution $H\_o \times W\_o$ to a new resolution $H\_n \times W\_n$, again using information from the geometry information and/or other attribute planes that may be available. For example, FIG. 6C illustrates an example application where an attribute plane is upscaled using its corresponding geometry information and the geometry extracted edges, according to some embodiments.

In some embodiments, other applications that utilize the proposed filter/processing techniques described above may include de-noising, de-banding, de-ringing, de-blocking, sharpening, edge enhancement, object extraction/segmentation, display mapping (e.g. for HDR applications), recoloring/tone mapping, among others. Such methods could also be utilized for quality evaluation, e.g. by pooling together and considering data (e.g. summing distortion values) in corresponding patches that also correspond to similar geometry information and other attributes when evaluating a particular distortion measurement. Processing may be purely spatial, e.g. only projected images that correspond to the same time stamp may be considered for such processing, however temporal/spatio-temporal processing may also be permitted, e.g. using motion compensated or motion adaptive processing strategies.

Bit Stream Structure for Compressed Point Cloud Data

As discussed above and in more detail in regard to FIGS. 13 and 14, there is considerable interest in augmented and virtual reality applications and in the use and compression of 3 dimensional data to support them. One such form of data includes point cloud representations, where objects are specified as a series of points that are described in terms of 3D geometry and a set of attributes per point that may include information such as color, reflectance, time, or other types of information. Compression of such information is highly desirable given the amount of space and bandwidth such data would require if not compressed.

One method that has been proposed for compressing point cloud data is described above in regard to packing patches into video frames and may be further extended to achieve near lossless or lossless performance by further encoding points that are "missed" or not included in the patches.

The encoder and decoder diagrams as shown in FIGS. 5A and 5B show how that process is performed. In some embodiments, the point cloud data is first segmented into multiple 2D projected images/videos, each representing different types of information. Segmentation is performed by dividing the point cloud into multiple patches that permit one to efficiently project the entire 3D space data onto 2D planes. Each patch is associated with information such as geometry, texture, and other attributes if they are available. Such information is then copied at the co-located locations on separate image sequences with each now containing only the geometry information, the texture information, and any other remaining attributes respectively. Auxiliary information that contains the patch information as well as an occupancy map that dictates which areas in these projected image sequences correspond to actual point cloud data and which are unoccupied, e.g. may contain no or dummy data (e.g. padded data), are also provided. Compression is then applied on such information using different strategies. Auxiliary information, for example, can be entropy coded, while occupancy maps may be down-converted and encoded using either conventional image/video codecs or other methods such as run length compression. The separate projected image sequences may be compressed using conventional codecs. This results in a collection of multiple sub streams, e.g. a geometry sub stream, texture and attribute sub streams, as well as occupancy and auxiliary information sub streams. All these streams are multiplexed together to generate the final point cloud bit stream as shown in the bit stream structure illustrated in FIG. 6B.

In some embodiments, the structure specified in FIG. 6B may be quite rigid and inflexible, and may not account for certain applications, especially low delay applications, that would require all information corresponding to a single point cloud frame in time to be efficiently signaled and decoded within a constrained time frame. The bit stream architecture illustrated in FIG. 6B may also impose considerable penalties in terms of memory and delay. In some embodiments, a point cloud video sequence is segmented into multiple groups of point cloud frames (GOFs). Group of Frames or GOFs may consist of multiple layers of information, with each one representing different types of data, such as geometry and texture information among others. In some embodiments, a point cloud compression PCC decoder is required to first decode and store the entire geometry video stream for each GOF, as well as any associated information with it, followed by the related texture video stream before starting to reconstruct each frame within a GOF (one may argue that point cloud reconstruction can follow the decoding order of the texture video stream). However, the memory requirements may be reduced by scanning the bit stream and finding the appropriate location of each sub-bit stream (e.g. geometry, occupancy/auxiliary info, texture) and decoding them in parallel. However, this assumes that such streams are restricted in using the same coding order and structures.

When all the data is sequentially signaled without any markers to indicate the positions of different sub streams, there may be a significant disadvantage of time delay. For example, one frame cannot be reconstructed until all the group of frame GOF information is decoded. Also, the bit stream cannot be decoded in parallel unless every data has information of its own size. To resolve this issue, in some embodiments the concept of a coding unit, which may be referred to herein as a PCCNAL (Point Cloud Compression Network Abstraction Layer) unit for convenience, that contains information on one or more types of data and its related header information may be used. Encapsulated data can be placed in any location within a bit stream and can be decoded and reconstructed in parallel.

In some embodiments, signaling methods of the parameters may not be defined or limited. The names of the parameters may not be limited as long as the parameters serve the same purpose. The actual value or code words of each parameter may not be limited as long as each function of the parameter is identified by the numbers.

For example, a bit stream structure for compressed Point Cloud Data that is more flexible and that permits the delivery of point cloud data for low delay applications may be used. The bit stream structure may also enable other features such as unequal error protection, reordering, and reduced memory footprint, among others. Furthermore, the parameters and/or component units which are used to identify the different methods and definitions used over the entire slice, frame, GOP, or sequence of the Point Cloud Data may also be considered in some embodiments. An example of a component unit that is defined and used within a point cloud compression PCC bit stream is the Point Cloud Compression Network Abstraction Layer (PCCNAL) unit. In particular, a PCCNAL unit may be defined as a set of data that contains one or more types of information and that can be placed anywhere in the bit stream. However, placement may be limited within a particular period.

Some other properties of the PCCNAL unit include:
PCCNAL header: sequence of bits that indicates the start of the unit and/or the type of the unit. Such a header may contain a "start code" indicator that is a unique sequence that should not be present anywhere else within the PCCNAL, and can help in identifying such a unit. Start code emulation prevention methods could be used to avoid the presence of equivalent signatures within the stream.
PCCNAL index: index to identify different PCCNAL units
PCCNAL size: size of the PCCNAL unit
PCCNAL trailing bits: Such information is optional, and similar to the start code, this is a unique signature that can help in identifying the end of a PCCNAL unit
PCCNAL GoF index: Corresponding GoF index to the PCCNAL units
PCCNAL POC: An indexing parameter for such a unit. This index can be used to classify and/or identify each NAL unit and permit grouping of different NAL units based on its value. For example, a geometry and an attribute frame that correspond to the same Point Cloud frame can be given the same index, which helps identify their relationship later during decoding and reconstruction of the point cloud representation. This information may limit placement of PCCNAL units within the bit stream.

Each coded block or set of coded blocks can be identified as a PCCNAL unit. Such blocks can include sequence parameter sets, picture parameter sets, geometry video data, occupancy data, texture video data, geometry frame, occupancy frame and texture frame amongst others. For example, Geometry video stream in FIG. 7A can correspond to geometry video data PCCNAL(PCCNAL-GEO), auxiliary info & occupancy maps can correspond to PCCNAL-OCC and Texture video stream can correspond to PCCNAL-ATT. In an alternative embodiment, all of the geometry video data, occupancy data and texture video data can comprise one PCCNAL unit.

Examples of PCCNAL unit are as following:
PCCNAL-SPS: set of parameters used and can be applied over the entire sequence
PCCNAL-PPS: set of parameters used and can be applied over the entire frame/picture
PCCNAL-GOF: set of parameters used and can be applied over the entire GOF
PCCNAL-OCC: set of occupancy map information
PCCNAL-GEO: set of geometry data information
PCCNAL-ATT: set of texture data information
PCCNAL-FRM: information on single frame
PCCNAL-GEOFRM: geometry information on single frame
PCCNAL-ATTFRM: texture information on single frame
PCCNAL-OCCFRM: occupancy map information on single frame The above information could also be defined for sub-frames, e.g. slices, group of coding tree units (CTUs) or macroblocks, tiles, or groups of slices or tiles. They can also be specified for a group of frames that does not necessarily need to be equal to the number of frames in a GOF. Such group of frames may be smaller or even larger than a GOF. In the case that this is smaller, it is expected that all frames inside this group would be a subset of a GOF. If larger, it is expected that the number would include several complete GOFs, which might not necessarily be of equal length. FIG. 7B is an example illustration of the conceptual structure of PCC encoded bit stream with PCCNAL units In some embodiments, the PCCNAL units can be signaled sequentially without any marker.

In some embodiments, PCCNAL units can have a PCCNAL header, which may include a start code and/or contain PCCNAL trailing bits. The PCCNAL header is located at the beginning of a PCCNAL unit and the PCCNAL trailing bits are located the end of a PCCNAL unit. By having a PCCNAL header and/or a PCCNAL trailing bits, the decoder can jump to the point where the proper data is located without decode from the beginning to the data.

For example, in the PCCNAL header a start code can be included, which can help in detecting a PCCNAL unit. A start code is a unique sequence of bits that should not be used for representing any other data within such a unit. When such start code is detected, it may be known that the following bits would correspond to particular information relating to such a unit, including its identification information as well as any related payload that would correspond to such an identifier. For example, an identifier equal to 000000, assuming 6 bits for the identifier, can indicate the PCCNAL is GoF Header Unit, while an identifier equal to 000001 can indicate that the payload includes Geometry Data information. Other identifiers could correspond to occupancy information, attributes, and so on and such could be defined by the application or user (e.g. engineer configuring the encoder/decoder). It should be pointed out that although start codes are present at the beginning of a particular unit, it might be possible to also define a "start code" that follows a fixed number of bits or syntax elements, which may be referred to herein as a "preamble" sequence. For example, the preamble sequence may include the unit identifier as well as the POCNAL POC parameter. If the parameters in the preamble sequence use variable arithmetic encoding, encoding them in right to left order in the bit stream (e.g. the least significant bit of the encoded parameter is written first in the stream and the most significant one is written last). This is not necessary, but could still be used for fixed length parameters.

In some embodiments, a PCCNAL header can contain the size of its own PCCNAL size instead of PCCNAL header bits.

In some embodiments, a PCCNAL header can have both PCCNAL size and PCCNAL header bits.

In some embodiments, a PCCNAL can have trailing bits to indicate the end of the PCCNAL unit.

In some embodiments, a PCCNAL can have its corresponding GoF index.

In some embodiments, a PCCNAL can have its corresponding POC index.

In some embodiments, a PCCNAL can have its corresponding a type identifier.

In some embodiments, with the PCCNAL header, PCCNAL units in a bit stream can be located without any fixed order. For example, in some embodiments PCCNAL units can be placed in any order within a bit stream, within the limitations of the PCCNAL POC. Reordering could still be performed during decoding or reconstruction using the value of PCCNAL POC. PCCNAL POC could be a periodic number however, and such reordering should account for such a characteristic. In some embodiments, PCCNAL units can be grouped by their GoF index. In some embodiments, PCCNAL units can be grouped by their POC as depicted in FIG. 7B. In some embodiments, PCCNAL units can be grouped by their types as depicted in FIG. 7C.

In some embodiments, PCCNAL units can be signaled in different bit streams. Even when they are signaled separately they can be reconstructed properly by PCCNAL header information such as GoF index and/or POC.

For example, when an encoded PCC bit stream is received at the decoder, the decoder may start parsing PCCNAL unit headers. Using information in the headers, a decoder can jump through the bit stream to collect synced occupancy-geometry-texture data. If a header has the size of the PCCNAL unit, it may jump to the end by the size. If a header only contains a start code, it may read through the bit stream until it encounters a new header or a trailing bits sequence. The decoder can also analyze the PCCNAL POC information for each PCCNAL, determine which units contain the same information and then group and reorder them. Such process can permit the compressed point cloud data to be properly decoded and then reconstructed, e.g. by determining which frame in the geometry and attribute video signals correspond to the same point cloud frame and could be used for its reconstruction. This is a similar mechanism as used in scalable video codecs where the decoder scans through the bit stream and determines correspondence of base and enhancement layers based on their POCs.

In an encoded PCC bit stream, there can be several parameters per slice, per frame/picture, per GOP, or per sequence of Point Cloud Data, which signal information that permits proper decoding and rendering of the point cloud data. The parameters can be present in the bit stream more than one once and at different locations. For example, a parameter can be signaled at both the sequence level and at the slice level. In this case, the parameter at the lower level can overwrite the one at the higher level within the level's scope. In another embodiment, the parameter at the lower level can provide additional information that can clarify the characteristics of the parameter at the higher level. Set of these parameters can comprise a PCCNAL unit. Some example of such parameters include the following:

PCC frame_width, PCC frame_height: the "nominal" width and the height of the frame that the PCC data is mapped. The size can be the same as the size of the output of the video codec. The size can be different from the size of the output of the video codec. In this case the outputs can be resized by a method indicated in the parameter sets or predefined by the user/codec.

Resizing type: type of resizing method from decoded video size to PCC frame size Group of Frames size: the number of frames in one group of frames can be signaled.

Chroma format: Chroma format of the geometry data video and texture data video can be signaled. If necessary, Chroma format of occupancy map can be signaled as well. The format can be signaled once for both video layers or can be signaled separately for each video layer. Such information could also be inferred from the video bit stream and does not necessarily need to be present in the PCCNAL unit again.

Input, output bit depth: This syntax defines the bit depth of input PCC data and output PCC data are signaled.

Internal bit depth: This syntax element defines the bit depth of the data for internal computation in the PCC. During the internal computation, the input data is adjusted to be within the range of internal bit depth. Such information could also be inferred from the video bit stream and does not necessarily need to be present in the PCCNAL unit again.

Type of the video codec: This syntax element defines the video codec, e.g. AVC, HEVC, AV1 or some other codec, as well as the corresponding profile and level information, that is used for encoding the Geometry and Attribute projected video data. Such a syntax element can be signaled once for both the Geometry and Attribute video signals, or can be signaled independently for each video signal. Such information could also be omitted and be inferred by the characteristics of and information within the video stream.

Layers for each stream
  Presence of layers: a flag that indicates that there are more than 1 layers for the geometry data/attribute data/occupancy map in the bit stream
  Number of layers: in the case that the layers are more than 1, the number of layers is also signaled. This syntax element defines the number of layers that the Geometry and Attributes data video have. Each layer contains information about the points mapped to a same pixel in a patch but each one corresponds to a different depths.
  Minimum number of layers: This is an optional syntax element that defines the minimum number of layers present in the bit streams.
  Each video layer can use a different type of a video codec. The type of the video codec used for a particular layers can be signaled.

Occupancy map
   Presence of an occupancy map: a flag that indicates the presence of occupancy map in the bit stream
   Coding type of the occupancy map: in case that occupancy map is present, the type of the coding method used for the occupancy map is also signaled. For example, the occupancy map can be coded with a video codec or another method defined in the specification.

Example Methods of Compressing and Decompressing Point Clouds

Figure 8A:
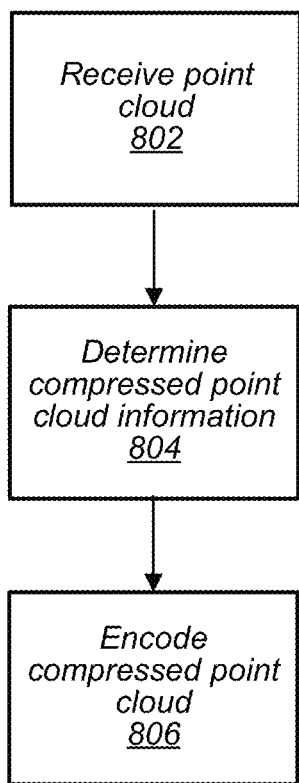
FIG. 8A illustrates a process for compressing attribute and spatial information of a point cloud, according to some embodiments.

FIG. 8A illustrates a process for compressing attribute and spatial information of a point cloud, according to some embodiments.

At 802, a point cloud is received by an encoder. The point cloud may be captured, for example by one or more sensors, or may be generated, for example in software.

At 804, compressed point cloud information is determined, using any of the techniques described herein or using one more combinations of the techniques described herein.

At 806, a compressed point cloud is encoded using the compressed point cloud information determined at 804. The point cloud may be compressed using any of the techniques described herein.

Figure 8B:
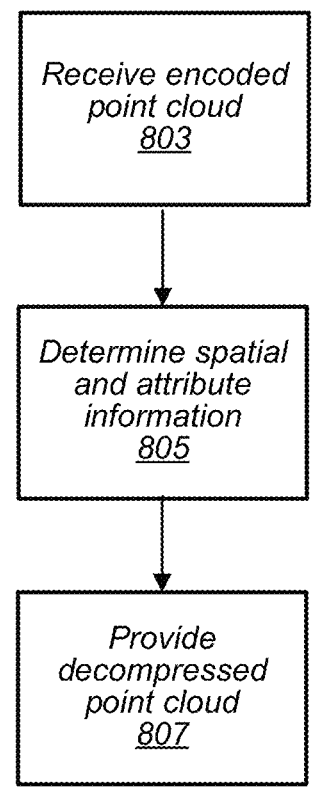
FIG. 8B illustrates a process for decompressing attribute and spatial information of a point cloud, according to some embodiments.

FIG. 8B illustrates a process for decompressing attribute and spatial information of a point cloud, according to some embodiments.

At 803 an encoded point cloud is received. The point cloud may have been encoded using any of the encoding techniques described herein, such as patch images packed into an image frame that is then encoded by a video encoder. In some embodiments, the encoded point cloud may comprise point cloud projections, such as projections onto a cube, cylinder, sphere, etc. that are then encoded via a video encoder.

At 805, spatial and attribute information for the encoded point cloud is determined. For example, a video decoder may be used to decode video encoded packed images or projects. Spatial information may then be determined based on the packed images or projections and combined to determine spatial information for points of the point cloud. For example, depth information for points of a patch may be matched with X and Y information for the points of the patch to determine spatial information for the points of the patch in 3D space. In a similar manner other attributes, included in patch images such as color attributes, texture attributes, etc. may be matched with corresponding points to determine attribute values for the points. Also, in the case of multiple projections, the same point may be identified in more than one of the projections to determine spatial information for the point in 3D space.

At 807, a decompressed point cloud may be provided to a recipient device or module.

Figure 8C:
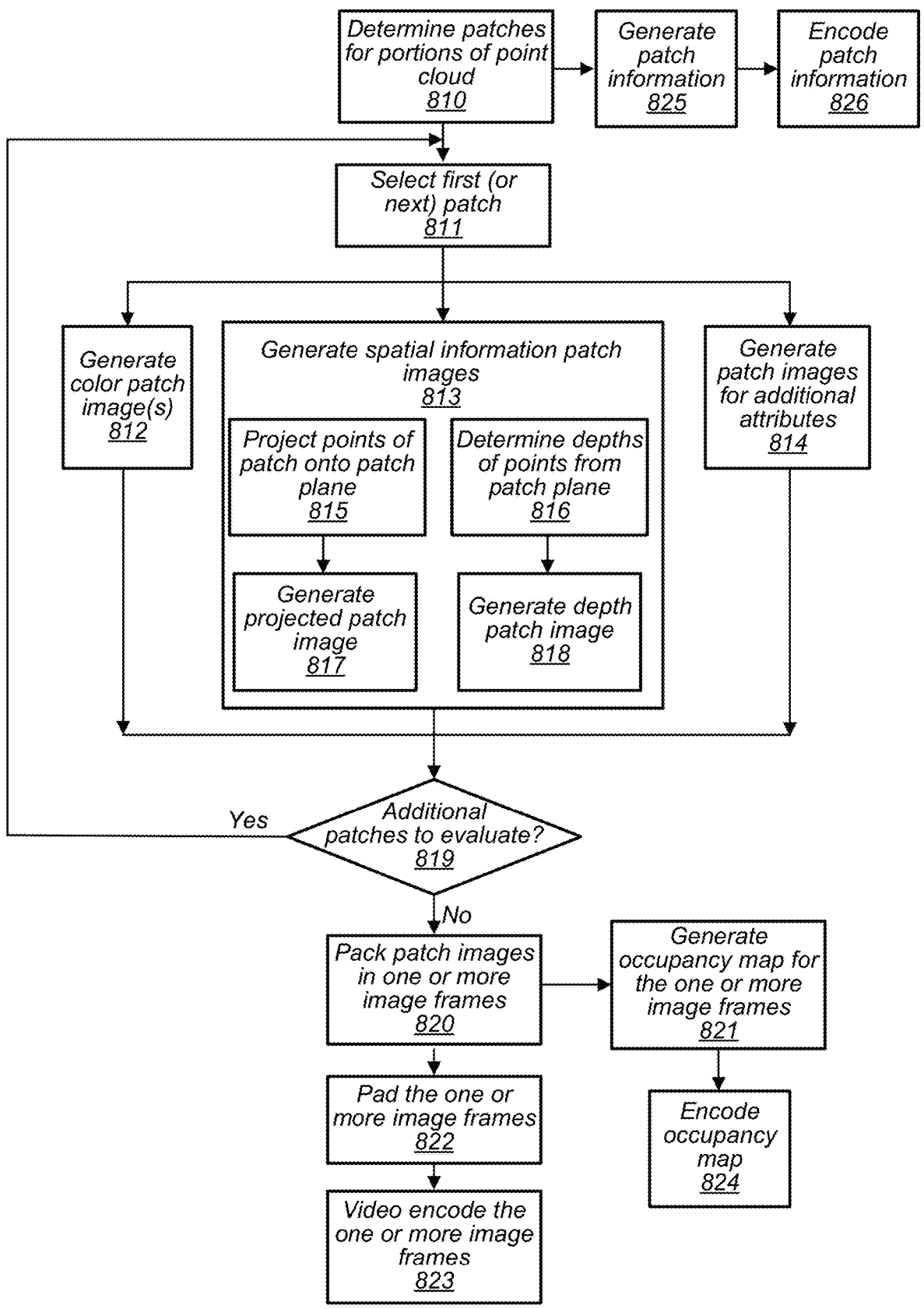
FIG. 8C illustrates patch images being generated and packed into an image frame to compress attribute and spatial information of a point cloud, according to some embodiments.

FIG. 8C illustrates patch images being generated and packed into an image frame to compress attribute and spatial information of a point cloud, according to some embodiments.

At 810, patches are determined for portions of point cloud. For example patches may be determined as described above. At 825 patch information for the patches may be generated and at 826, may be encoded to be sent to a decoder. In some embodiments, encoded patch information may be separately encoded from one or more image frames comprising packed patch images.

At 811, a first patch (or next patch is selected). At 812 a color (e.g. attribute) patch image is generated for the points of the point cloud included in the patch. At 814, one or more additional attribute images, such as a texture attribute image, are generated for the points of the point cloud included in the patch.

At 813, spatial information images are generated for the points of the point cloud included in the patch. In some embodiments, to generate the spatial information images, the points of the point cloud are projected, at 815, onto a patch plane perpendicular to a normal vector normal to a surface of the point cloud at the patch location. At 817 a first spatial image is generated for the patch based on the points being projected on the patch plane at 815. In addition, depth information for the points of the patch relative to the patch plane is determined at 816, and at 818 a depth patch image is generated based on the depth information determined at 816.

At 819, it is determined whether there are additional patches for which patch images are to be generated. If so, the process reverts to 811 for the next patch. If not, at 820 the patch images for the patches are packed into one or more image frames. In some embodiments, patch images for respective patches may be packed before patch images are determined for other patches. At 821, an occupancy map is generated based on where the patch images were placed when being packed into the one or more image frames. At 824, the occupancy map is encoded.

At 822, spaces in the one or more image frames that are not occupied by patch images are padded.

At 823, the one or more image frames are video encoded, such as in accordance with a high efficiency video coding (HEVC) standard.

Figure 9:
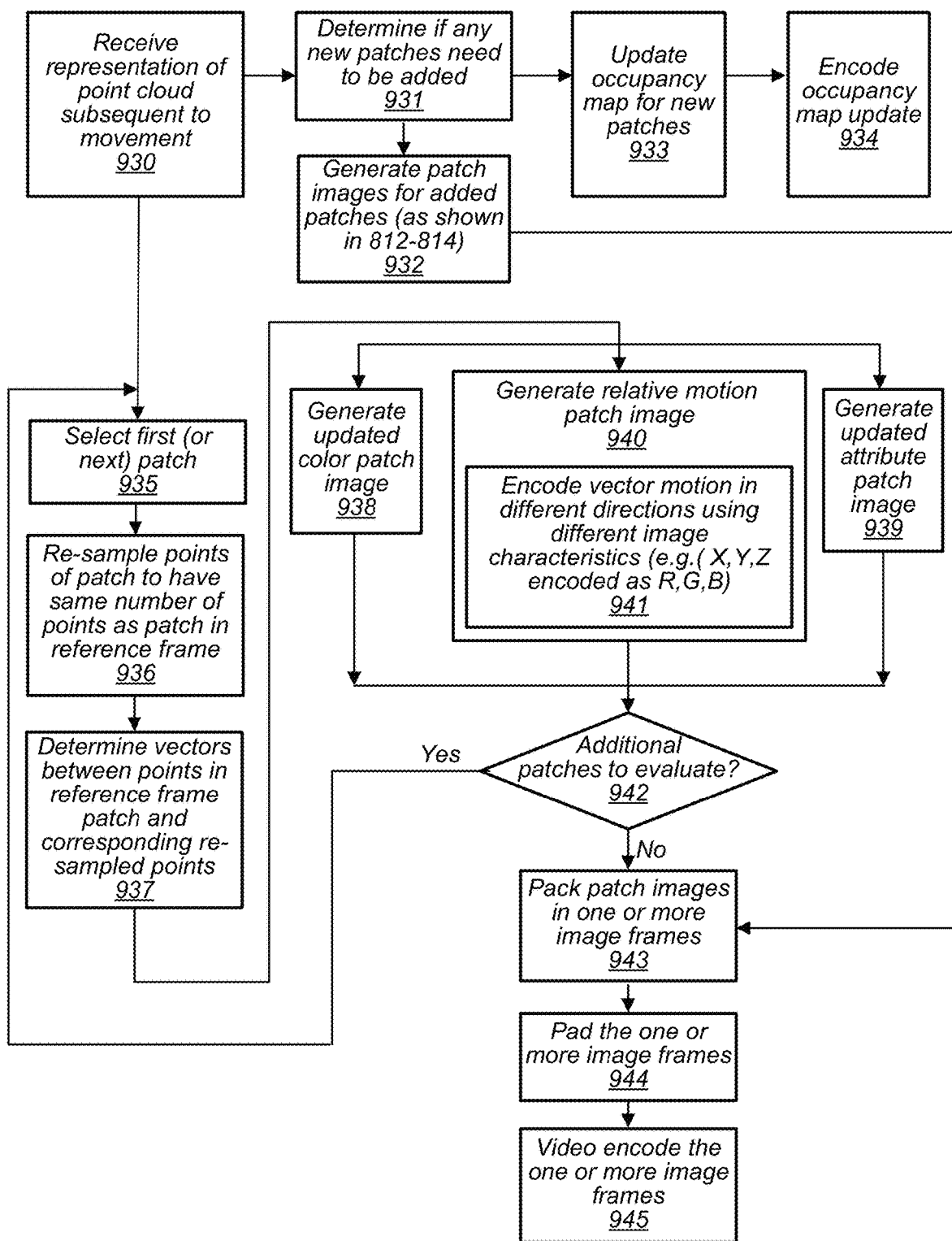
FIG. 9 illustrates patch images being generated and packed into an image frame to compress attribute and spatial information of a moving or changing point cloud, according to some embodiments.

FIG. 9 illustrates patch images being generated and packed into an image frame to compress attribute and spatial information of a moving or changing point cloud, according to some embodiments.

At 930, point cloud information for a previously encoded point cloud is received wherein the point cloud information represents a subsequent version of the previously encoded point cloud. For example, the subsequent version may be a representation of the point cloud at a subsequent moment in time, wherein the point cloud is moving or changing as time progresses.

At 931, it is determined if any new patches need to be determined for the point cloud. For example, an object not currently in the previously encoded point cloud may have been added to the point cloud. For example, the point cloud may be a point cloud of a road and a ball may have entered into the road. If there is a need to add a new patch, the occupancy map is updated at 933 to include the new patch and encoded at 934. Also, at 932 patch images are generated for the new patch in similar manner as described in 812-814. The generated patch images are included in packing at 943.

At 935, a first or next patch of the patches generated for the reference (previous) point cloud is selected. At 936, the points of the patch are re-sampled as described herein. At 937 motion vectors for the points included in the selected patch between the reference point cloud and the current point cloud are determined. At 940 the motion vectors are used to generate a relative motion patch image. For example, in some embodiments, generating a relative motion patch image may comprise, encoding, at 941, vector motion in different directions using different image characteristics, as described herein. At 938 an updated color patch image is generated. In some embodiments, the updated color patch image may encode residual values indicating differences in colors of the points of the point cloud included in the patch between the reference point cloud and the current point cloud. In a similar manner, at 939, other attribute update patch images may be generated.

At 942, it is determined whether there are additional patches to be evaluated. If so, the process reverts to 935 for the next patch. If not, at 943 the patch images for the patches are packed into one or more image frames. In some embodiments, patch images for respective patches may be packed before patch images are determined for other patches.

At 944, spaces in the one or more image frames that are not occupied by patch images are padded.

At 945, the one or more image frames are video encoded, such as in accordance with a high efficiency video coding (HEVC) standard.

Figure 10:
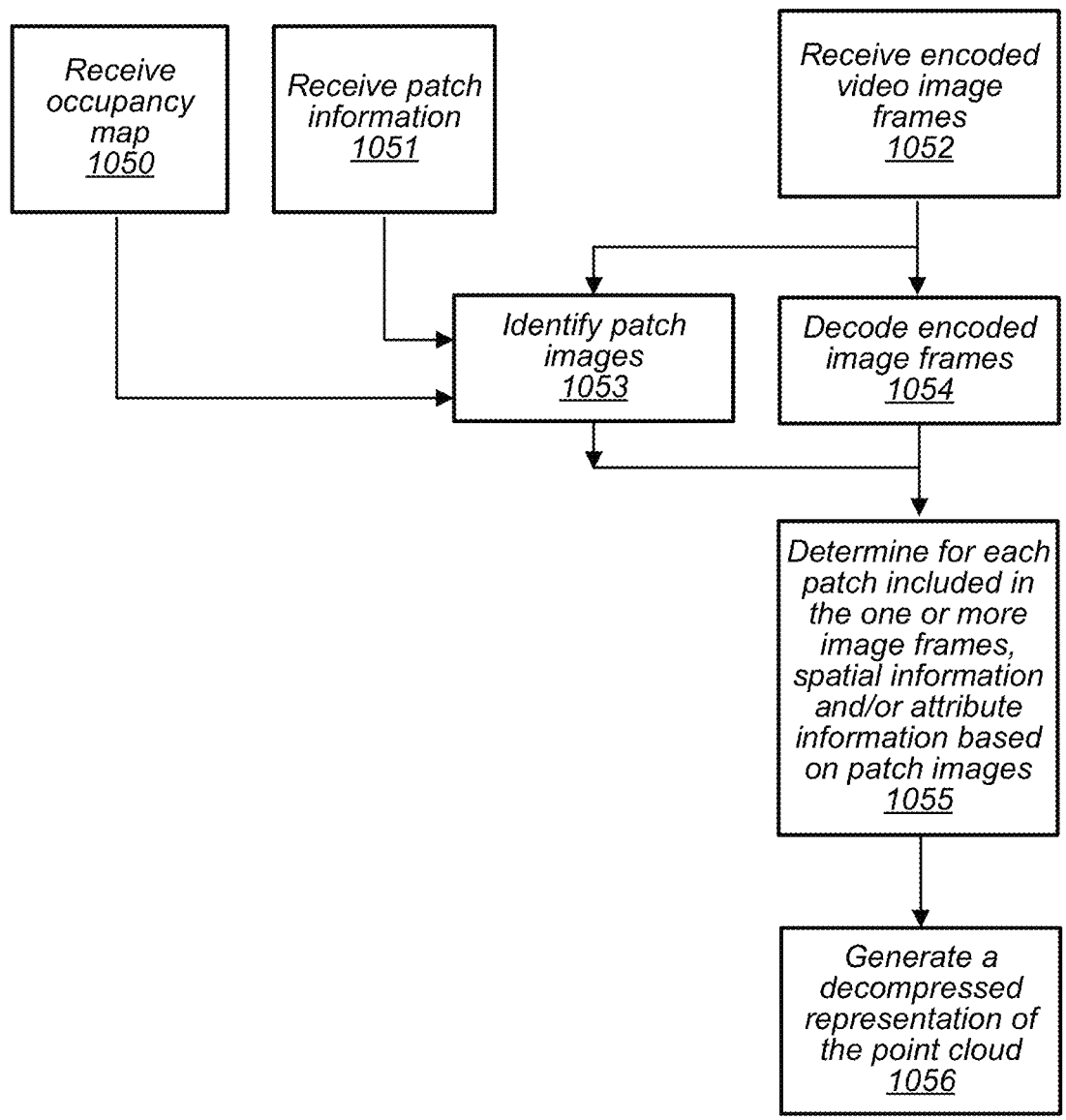
FIG. 10 illustrates a decoder receiving image frames comprising patch images, patch information, and an occupancy map, and generating a decompressed representation of a point cloud, according to some embodiments.

FIG. 10 illustrates a decoder receiving image frames comprising patch images, patch information, and an occupancy map, and generating a decompressed representation of a point cloud, according to some embodiments.

At 1050, an occupancy map is received by a decoder, at 1051 patch information is received by the decoder. In some embodiments the occupancy map and the patch information may be encoded and the decoder may decode the occupancy map and the patch information (not shown). At 1052, the decoder receives one or more encoded video image frames. At 1052 the decoder identifies patch images in the one or more encoded video image frames and at 1054 the decoder decodes the encoded video image frames. In some embodiments, the decoder may utilize the occupancy map and the patch information to identify active and non-active portions of the one or more encoded video images and may adjust one or more decoded parameters used to decode the encoded video images based on whether portions, e.g. blocks, sub-blocks, pixels, etc. comprise active or non-active information.

At 1055, the decoder determines spatial information and/or attribute information for the points of the respective patches and at 1056 generates a decompressed representation of the point cloud encoded in the one or more encoded video images.

In some embodiments, active and non-active portions of an image frame may be indicated by a "mask." For example, a mask may indicate a portion of an image that is a padding portion or may indicate non-active points of a point cloud, such as points that are hidden from view in one or more viewing angles.

In some embodiments, a "mask" may be encoded along with patch images or projections. In some embodiments, a "mask" may show "active/available" points and "non-active/non-available" points in space. In some embodiments, a mask may be independent from a texture and a depth patch image. In some embodiments, a mask may be combined with other information, such as a texture or depth patch image. For example, by indicating that certain values in a signal range correspond to active points, e.g. values above 16 and below 235 in an 8 bit image, and that other values correspond to non-active points, e.g. values below 16 or values above 235 in an 8 bit image. In some embodiments, additional considerations may be taken to avoid or reduce contamination between active and non-active regions. For example, it may be necessary to make use of lossless or visually lossless coding at the boundaries between active and non-active regions.

In some embodiments, a mask may be utilized in a variety of ways for improving coding efficiency. For example, a mask may be used with projection methods such as cylindrical, spherical or multiple projection as wells as decomposition into patches. In addition, a mask may be used with a cubic projection method.

Figures 11A, 11B:
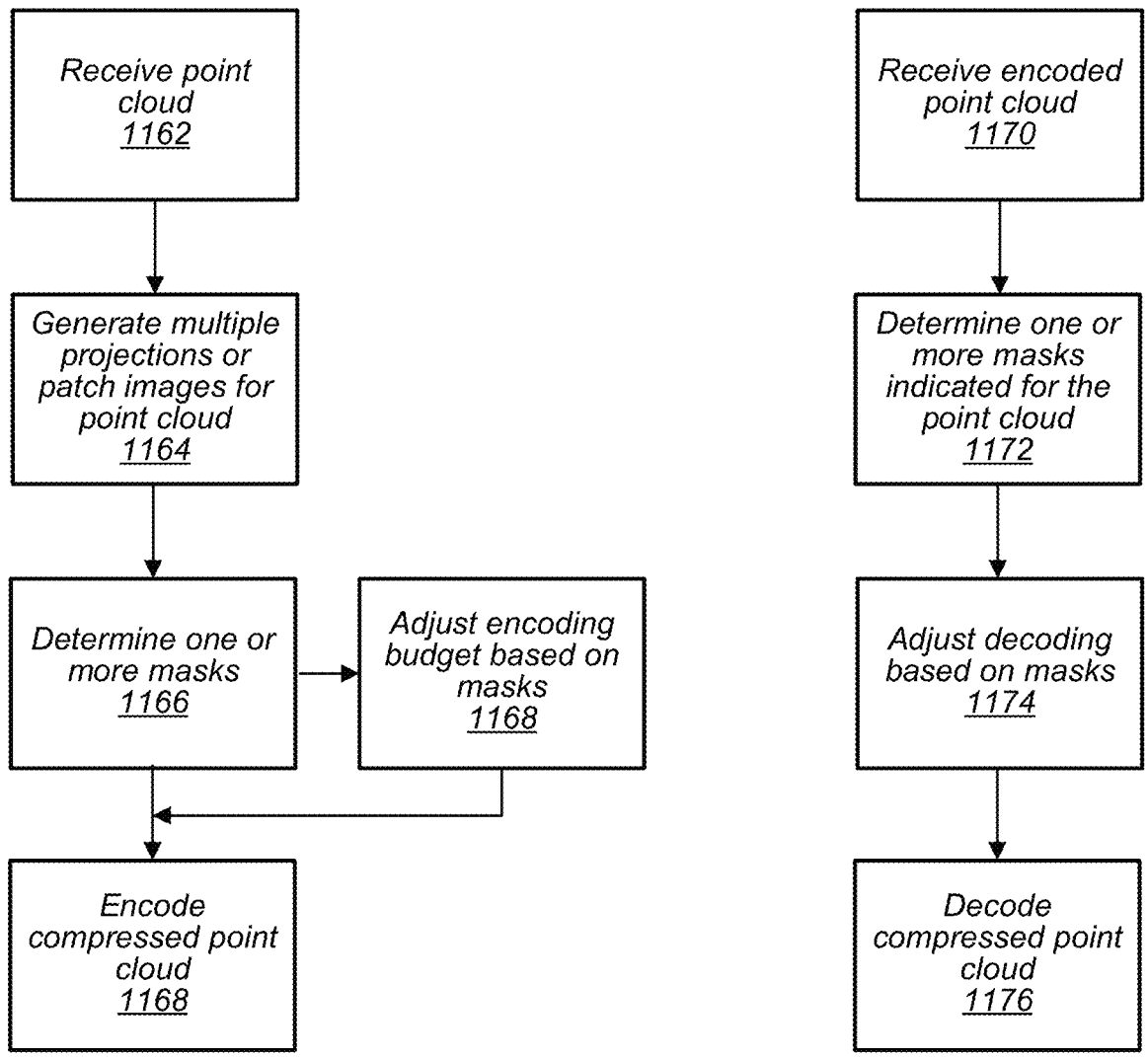
FIG. 11A illustrates an encoder, adjusting encoding based on one or more masks for a point cloud, according to some embodiments.
FIG. 11B illustrates a decoder, adjusting decoding based on one or more masks for a point cloud, according to some embodiments.

FIG. 11A illustrates an encoder, adjusting encoding based on one or more masks for a point cloud, according to some embodiments.

At 1162, an encoder receives a point cloud. At 1164, the encoder generate multiple projections or patch images as described herein, for the received point cloud. At 1166, the encoder determines or more masks. The masks may be hidden points, padded portions of an image frame, points not viewable from a particular view-point, etc. At 1168, the encoder adjusts one or more encoding parameters based on the masks. For example the encoder may adjust a budget allocated to masked portions. Additional adjustments that an encoder may perform are described. At 1168, the encoder encodes a compressed point cloud, for example via one or more video encoded image frames.

FIG. 11B illustrates a decoder, adjusting decoding based on one or more masks for a point cloud, according to some embodiments.

At 1170, a decoder receives an encoded point cloud. At 1172, the decoder determines one or more masks for portions of the encoded point cloud. For example, the encoder may determine portions of image frames representing the compressed point cloud correspond to padding. Or, for a particular view of the point cloud being rendered by the decoder, the decoder may determine that one or more points of the compressed point cloud are not viewable from the particular point of view. In some embodiments, mask information may indicate which points are hidden when the point cloud is viewed from particular points of view. At 1174, the decoder adjusts one or more decoding parameters based on the masks. Adjustments that may be made by a decoder based on active/non-active regions or points (e.g. masks) are described in more detail below. At 1176 the decoder decodes the compressed point cloud.

In some embodiments, a mask may be used when performing motion estimation and mode decision. Commonly distortion is computed for an entire block. However, some blocks may have blocks that contain a combination of texture data as well as empty/nonvisible areas. For these areas only the textured data are of interest and any distortion in the non-visible areas may be ignored. Therefore, since commonly when performing such processes as motion estimation and mode decision, a distortion computation, such as Sum of Absolute Differences (SAD) or Sum of Square Errors (SSE), is performed, a mask may be used to alter the computation to exclude distortion for the non-visible areas. For example, for the SAD case, distortion may be computed by computing the sum of absolute differences of only samples in a block that correspond to a visible area in a current image. All other samples may be ignored during the computation. In some embodiments, distortion may be normalized at the pixel level thus avoiding having to consider blocks with different number of pixels.

In some embodiments, instead of only considering non-visible samples, samples that are adjacent to non-visible samples, or samples identified to correspond to different projections (but are placed when encoding within the same coding block) may be assigned different weights. For example samples in particular blocks could be considered more important for subjective quality, and a lower distortion tolerance may be assigned. In such case, the weighting for those samples may be increased, thus biasing decisions where the distortion for those samples is lower. Knowledge also that different samples in the same block of a particular size M×N during motion estimation or mode decision correspond to different objects, may also help with the determination of the block partitioning mode, e.g. the encoder could make an early decision (based potentially on a preliminary search) on whether different partitioning could/should be used.

In some embodiments, masks may be used for rate control and rate allocation. For example, it may be desirable that blocks that correspond to areas that contain both visible and non-visible samples be encoded at a different, and some times higher, quality than blocks that contain only visible samples. This is done so as to avoid leakage between visible and not visible samples and ensure the best quality at the point-clouds "boundaries". Different quality may also be assigned based on depth information, which may also be available on the encoder. Flatter areas may tolerate much more distortion than areas with considerable variance in depth. Control of quality may be performed by adjusting quantization parameters/factors, but also by adjusting other parameters such as the lagrangian multiplier during mode decision, using different quantization matrices if available, enabling and/or adjusting quantization thresholding and the size and/or shapes of zonal quantization.

Quantization may also be adjusted according to the projection method used. If, for example an equirectangular projection method was used to project the object onto a sphere and then onto a 2D plane, it might be desirable to increase quantization on the top and bottom boundaries, and slowly decrease it when moving towards the center/equator. This may help compensate for some of the differences in resolution allocation when using a particular projection method. Different adjustments may also be made to the different color components, again based on similar assumptions, and in consideration again of the mask information.

Quantization may also be performed while considering whether a sample is a visible or a non-visible sample. For example, if a strategy involves the use of dynamic programming/trellis quantization methods for determining the value of a quantized coefficient. In such embodiments, an impact in distortion of a quantized coefficient, as well as its impact on bitrate at multiple reconstruction points may commonly be computed. This may be done for all coefficients while considering their bitrate interactions. Finally a decision may be made for all coefficients jointly by selecting the quantized values that would together result in the best rate distortion performance. In some embodiments, the visible and non-visible areas may be considered when computing such metrics.

Similar to the motion estimation and mode decision processes, sample adaptive offset (SAO) techniques also commonly compute the resulting distortion for each possible mode or SAO value that may be used. Again, the decision may exclude non-visible samples, or prioritize, with different weights samples that are close to non-visible samples or samples that correspond to areas with considerably varying depth.

In some embodiments, masks may be used in any other coding process that may involve a distortion computation.

In some embodiments, masks may be used in preprocessing/prefiltering. For example, samples may be prefiltered based on their proximity to non-visible samples so as to reduce the possibility of artifacts and/or remove noise that may make encoding more difficult. Any form of prefiltering, including spatio-temporal filters, may be used.

In some embodiments, prefiltering may be applied to both texture as well as depth information.

Decisions in quantization parameters could also be made at the picture level (temporally) given the amount of visible/non-visible samples and depth variance on different pictures. Such decisions could be quite useful, for example, in a multi-pass coding system where analyze the entire sequence is first analyzed to determine the complexity and relationship of each frame with other frames. The coding parameters may then be decided that will be used for that frame in relationship to all other frames and given an expected quality or bitrate target. Similar decisions may also be made, not only for quantization parameters, but also for the picture coding types (i.e. I, P, or B), structures (e.g. hierarchical or not coding of N frames that follows a particular coding order of frames), references to use, weighting parameters, etc.

Encoding and Decoding (Normative Concepts)

Since a mask is likely to be available losslessly or visually losslessly at the decoder, as well as the depth information, this information may also be used at the decoder (and of course at the encoder) to further improve quality.

For example, deblocking and sample adaptive offset (SAO), as well as adaptive loop filtering (ALF) and deringing (in codecs that support such mechanisms), with exclusion of non-visible samples, samples that correspond to different projections, or samples with very different depth characteristics may use masking information. Instead, it may be desirable to only consider for such filtering methods samples that correspond to the same projection and are not so far from each other (depth wise). This may reduce blockiness and/or other artifacts that these methods try to mitigate. Other future types of in-loop post filtering may also be performed in a similar manner.

As another example, out of loop post filtering with visible/non-visible/different area segmentation may utilize masking information.

Implicit adjustment of QP quality parameters based on a certain percentage of visible/non-visible samples within a block may be performed. This may reduce signaling of coding parameters if such switching occurs frequently in a bit stream.

Adjustment of the transform type based on the percentage of visible/non-visible samples may be performed, including the consideration of shape adaptive discrete cosine transforms (DCT transforms).

Adjustment of overlapped block motion compensation techniques may utilize masking information, if existing in a codec, to mask away non-visible samples. A similar consideration may be performed for block motion compensation and/or intra prediction (including an intra block copy method). Samples that are considered visible may be considered when constructing a prediction signal, including also when interpolating to perform subpixel motion compensation or when performing bi-prediction. Masks from the current picture may be considered, but if desired, both the masks from the current picture as well as the masks corresponding to the reference pictures could be considered. Such considerations may be made adaptive at the encoder, through some form of signaling, i.e. at the sequence, picture, tile, slice, or even CTU/block level.

In some embodiments, clipping of the final value based on the mask or depth information may be performed.

In some embodiments, other prediction methods that may exist inside a codec (e.g. in AV1 or the Versatile Video Coding (VVC) standard currently being developed by the JVET team in MPEG) may be similarly adjusted or constrained based on the existence (and amount) of visible and non-visible points, and points corresponding to different projections.

In some embodiments, different control/adjustments may be applied to different color components as well as to the depth information.

Occupancy Map Compression

Figure 12A:
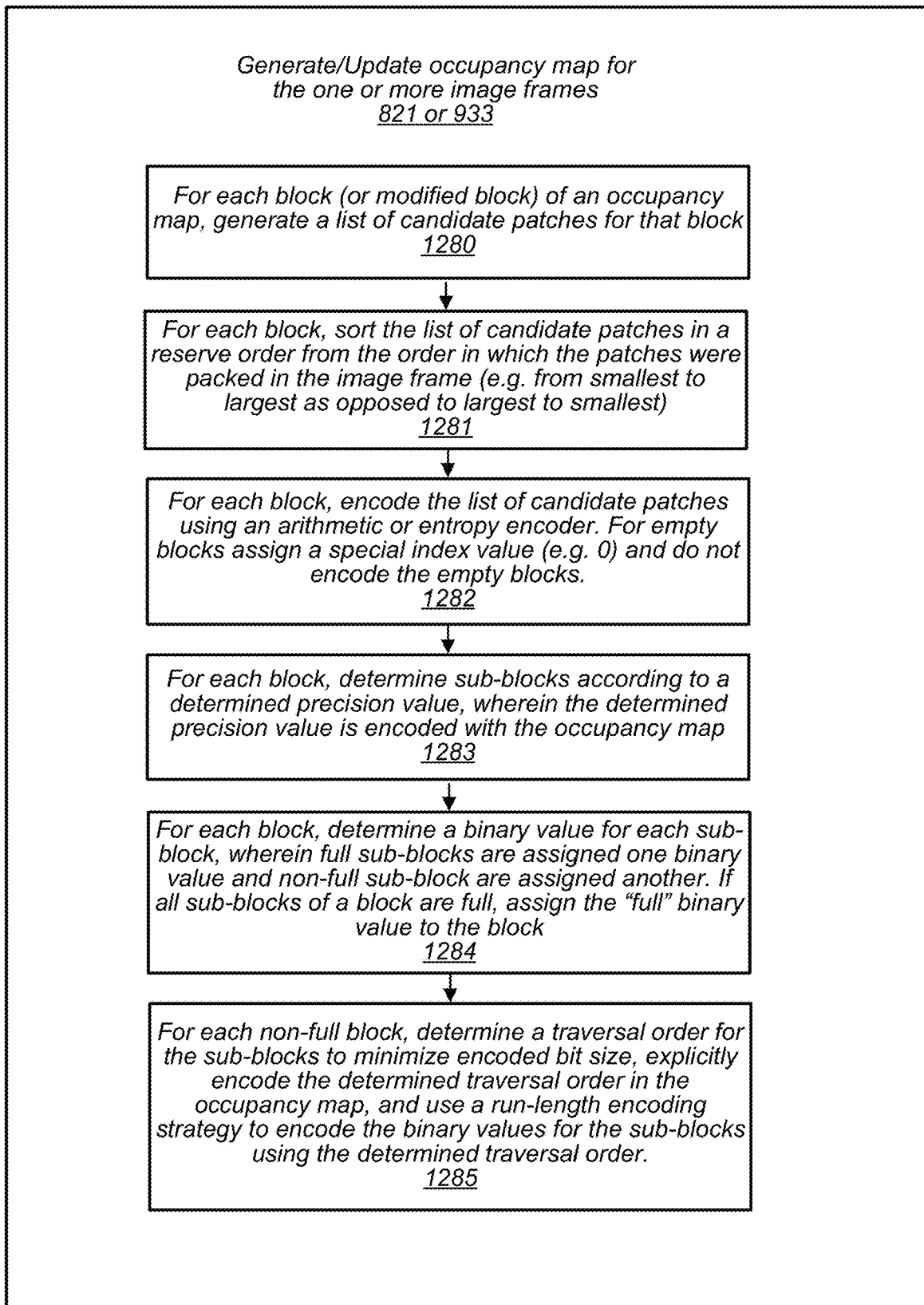
FIG. 12A illustrates more detail regarding compression of an occupancy map, according to some embodiments.

FIG. 12A illustrates more detail regarding compression of an occupancy map, according to some embodiments. The steps shown in FIG. 12A may be performed as part of steps 821 or 933 as described above. In some embodiments, any of the occupancy map compression techniques described herein may be performed at 821 or 933.

At 1280 a list of candidate patches is determined for each block or modified block of an occupancy map.

At 1281, the lists of candidate patches for each block are ordered in a reverse order as an order in which the patches were packed into the image frame. For example, the patches may be packed into an image, with larger patches packed before smaller patches. In contrast, the candidate list for each block of an occupancy map may include smaller patches before larger patches. At 1282, an arithmetic encoder may be used to encode the patch candidate list for each block. In some embodiments, an entropy encoder may be used. Also, in some embodiments, empty blocks may be assigned a special value, such as zero, whereas patch candidates may be assigned numbers corresponding to a patch number, such as 1, 2, 3, etc.

At 1283, for each block sub-blocks are determined according to a determined precision value. The determined precision value may be encoded with the occupancy map such that a decoder may determine the determined precision value used at the encoder.

At 1284, for each block, a binary value (e.g. 0 or 1) is determined for each sub-block of the block. Full sub-blocks are assigned a different binary value than non-full sub-blocks. If all sub-blocks of a block are full, the block may be assigned a binary "full" value.

At 1285, for each non-full sub-block, a traversal order is determined. For example, any of the example traversal orders shown in FIG. 12B (or other traversal orders) may be determined. A run-length encoding strategy as described above in regard to occupancy map compression may be used to encode the binary values for the sub-blocks using the determined traversal order.

FIG. 12B illustrates example blocks and traversal patterns for compressing an occupancy map, according to some embodiments. The traversal patterns may be used as described above in regard to occupancy map compression and in FIG. 12A.

Lossless or Near-Lossless Point Cloud Compression Using a Video Encoder

When patches are determined as described above a small number of points may not be included in any patches. For example, for examples, as patches needed to create patches for isolated points gets below a certain size, a tradeoff between compression efficiency and quality may be used to determine whether it is justified to create ever smaller patches to capture isolated or spread out points. In some embodiments, an additional technique in addition to patch generation may be applied to capture points not included in patches and provide lossless or near lossless compression.

In some embodiments, a point cloud is compressed via a patching technique as described above and is then reconstructed from the patches. The points in the input point cloud are compared to points in the reconstructed point cloud in order to detect missed points. In some embodiments, nearest points may be searched for points corresponding to a first geometry map, such as the set 2D images describing the geometry. For every missed point P (e.g. a point that exists in the input but not in the reconstructed point cloud), the nearest point Q in the reconstructed point cloud is detected. In some embodiments, the nearest point Q is on a same tangential and bi-tangential axis in the patch as the missed point P. Said another way, in some embodiments, a missed point P may be located at a same location in a patch projection (same tangential and bi-tangential axis), but may be located at a different depth (e.g. along a normal axis to the patch projection plane).

In some embodiments, the process may proceed as follows:

1. For every missed point P (i.e., a point that exists in the input but not in the reconstructed point cloud), the nearest point Q in the reconstructed point cloud is detected.
2. Let $i(Q)$ and $j(Q)$ be the pixel coordinates of Q.
3. Let $dx(Q)$, $dy(Q)$, and $dz(Q)$ be the position difference between P and Q. As discussed above, in some situations, a missed point P may be at the same tangential and bi-tangential axis, but at a different depth than the nearest point Q. When this situation is true, only the $dz(Q)$ may be calculated. Missed points P at the same tangential and bi-tangential axis, but at a different depth may be referred to herein as "depth only missed points." The other type of missed points may be referred to as "3 component missed points."
4. Let $dR(Q)$, $dG(Q)$ and $dB(Q)$ be the attribute difference (e.g. color difference) between P and Q. In some embodiments, the attribute data can be converted to a different color scheme using a lossless transform, such as YCgCo-R before or after the residual differences are determined.
5. The encoder may compress $i(Q)$ and $j(Q)$ by using one of the following strategies:
   A. Prediction+quantization+entropy coding,
      Prediction can be performed by previously encoded/decoded neighboring samples, e.g. using the last coded points or the weighted average of the N last coded points.
      Quantization can be any linear or non-linear quantization process.
      Entropy coding could utilize a variable length coder, based for example on exp-golomb, arithmetic encoding, or some other entropy coding method.
   B. Quantization+quadtree coding+entropy coding
      1. Quadtree coding may proceed as follows:
         a. Create a square around the quantized 2D pixel positions
         b. Recursively split the square into 4 sub-squares
         c. Generate a 1-bit value indicating for each sub-square whether it contains points or not.
         d. The 4-bit binary code generated for the 4 sub-squares is entropy encoded, e.g. using an arithmetic entropy codec.
         e. If a sub-square has a size of 1×1, then encode one bit to indicate whether it contains one or multiple points. If it has multiple points then encode the number of points minus one. Arithmetic encoding could be used to encode such information.
         f. Continue subdividing squares containing points and having size higher than 1.
         g. Compress $dx(Q)$, $dy(Q)$, $dz(Q)$, $dR(Q)$, $dG(Q)$, and $dB(Q)$ by using one of the following strategies:
   C. Prediction+quantization+entropy coding
      Prediction can be performed by previously encoded/decoded neighboring samples, e.g. using the last coded points or the weighted average of the N last coded points.

Also, in some embodiments or situations, prediction can be performed using previously encoded/decoded missed points (P) that have the same point (Q) as their reference point.

In the case that more than one missed point (e.g. multiple Ps) have the same reference point (Q), the missed points can be recorded by the difference from Q(d(Q)). For example, instead of signally d(Q) for the multiple missed points, a d(Q) value can be signaled for a first one of the missed points and a further difference relative to a previous difference can be signaled for the other ones of the multiple missed points that share the same reference point.

Quantization can be any linear or non-linear quantization process.

Entropy coding could utilize a variable length coder, based for example on exp-golomb, arithmetic encoding, or some other entropy coding method 6. Store the values as pixels in a video frame and compress the video frame using a video codec.

In some embodiments, this approach could be used to support both lossless and lossy compression, including lossless compression of geometry only, lossless compression of both geometry and attributes, and lossy compression of the entire point cloud. In some embodiments, lossless compression proceeds as follows. First, the encoder is configured such that the precision of the occupancy map is 1×1, e.g. each pixel in the occupancy map corresponds to one point/pixel in the geometry and attribute images. Afterwards, the video codec is encoded in lossless mode and the smoothing step, as described above, that is applied to the reconstructed point cloud is disabled. Also, in some embodiments, the quantization step for i(Q), j(Q), dx(Q), dy(Q), dz(Q), dR(Q), dG(Q), and/or dB(Q) may be disabled.

In some embodiments, to store the values in a video frame and compress them using a video codec, one or more of the following techniques may be used.

In some embodiments, the position and attributes of missed points may be explicitly saved inside a frame or frames and compressed with a video codec.

In some embodiments, instead of signaling residual values(dx(Q), dy(Q), dz(Q), dR(Q), dG(Q), dB(Q)), the absolute value of missed points (Xp, Yp, Zp, Rp, Gp, Bp) may be signaled.

In some embodiments, the residual values(dx(Q), dy(Q), dz(Q), dR(Q), dG(Q), dB(Q)) may be saved inside a video frame or video frames, and compressed with a video codec. Other attributes, such as reflectance may also be handled in a similar manner. The frame size of the video frame for the missed points may be the same as the frame size of other video data used for geometry information or texture information. However, in some embodiments, a frame size of a video frame for missed points may be different from a frame size of other video streams used for geometry information or texture information.

For example, since each point cloud frame may comprise a different number of missed points, it is possible that this process may result in missed point video frames of different resolution. In order to encode video frames comprising different numbers of missed points, one or more of the following techniques may be used:

Encode each missed point frame independently without updating its resolution. In this case, and if the resolution of any frame in a group of point cloud frames is different, then these missed point frames may have to be coded independently, e.g. as intra coded frames.

As an alternative, missed point frames may be grouped as a group of point cloud frames and their resolutions may be updated to a maximum resolution selected for the missed point frames in the group. This would then permit the use of inter coding tools.

Also, in some embodiments, the frame size (width, height) may be explicitly signaled.

However, in some embodiments, the frame size may be a multiple of a predefined block size M that corresponds to a base block size (e.g. CTU in HEVC or Macroblock in AVC) of the video codec. M, for example, may be equal to 8, 16, 32, 64, etc. In such embodiments, the number of missed points(num_missed_points) may be explicitly signaled. Additionally or alternatively, the number of depth-only missed points (e.g. num_missed_points_1comp) and the number of 3-component missed points (e.g. num_missed_points_3comp) may be signaled. A predefined parameter M (e.g. block size) may be signaled with the number of missed points and may be used to determine the frame size. In some embodiments, M (block size) may be different for geometry residual frames and texture residual frames. Also, in some embodiments M (block size) for each frame may be signaled separately.

The parameter "N" to compose the width of the missed point frames with M sized blocks may not have to be explicitly signaled but instead may be derived by the resolution of the missed point frame (e.g. it is implicitly signaled in the parameter sets of the missed point frame sequence).

In some embodiments, a frame size of geometry and texture missed point frames may be derived based on the number of missed points and the width given. For example, when the number of missed points is num_missed_points and the width of a frame is width, the frame height(height) can be derived as follows:

$$height = \left\lceil \frac{num\_missed\_points}{width} \right\rceil$$

In the above equation the outside operator $\lceil \ldots \rceil$ is the ceiling operator for the number of missed points divide by width, which results in the smallest integer value greater than or equal to the number of missed points divide by width. For example, when the color differences (dR, dG, dB) are placed on 3 different planes, e.g. the R, G, and B planes, respectively, this derivation can be applied.

When the number of missed points is num_missed_points and the width of a frame is width=n×M, where n and M are positive integer values, the frame height (height) can be derived as shown below, which also tries to keep the height at a multiple of M:

$$height = \left\lceil \frac{num\_missed\_points}{\frac{width}{M}} \right\rceil \times M$$

Figure 13A:
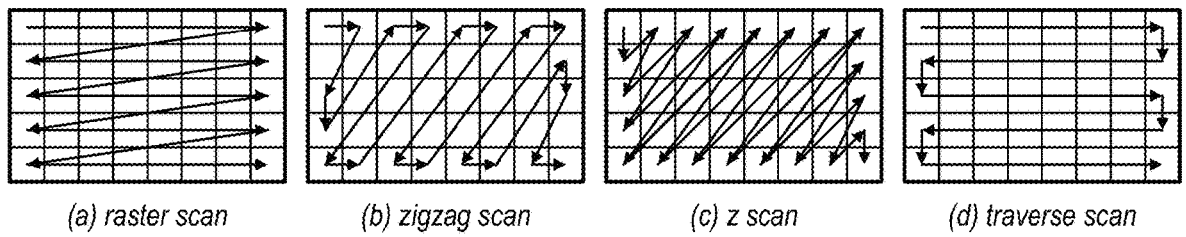
FIG. 13A illustrates example scanning techniques including a raster scan, a zigzag scan, a "Z" scan, and a traverse scan, according to some embodiments.
Figure 13B:
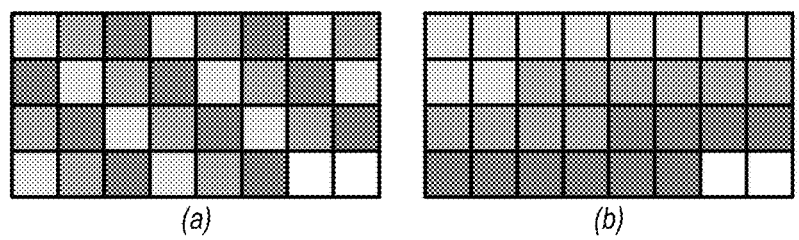
FIG. 13B illustrates examples of interleaved missed point components in a video frame and grouped missed point components in a video frame, according to some embodiments.
Figure 13C:
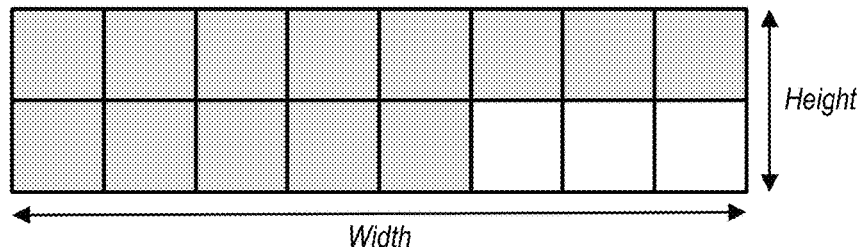
FIG. 13C illustrates an example video frame, according to some embodiments.
Figure 13D:
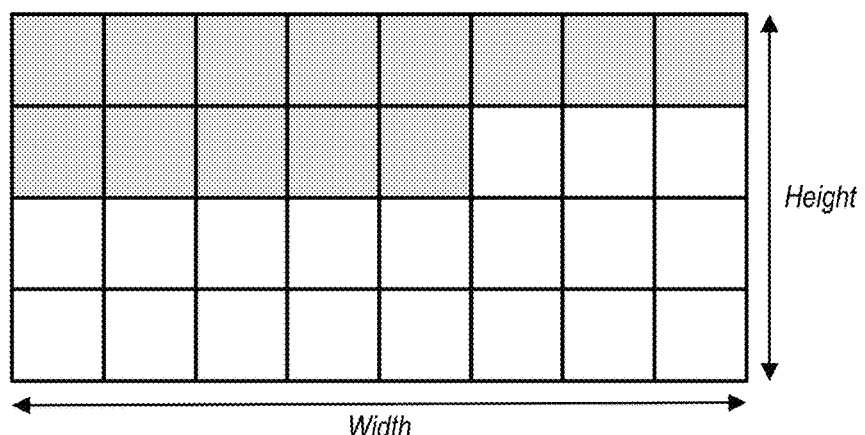
FIG. 13D illustrates an example video frame, according to some embodiments.

For example, FIG. 13C illustrates an example of a frame size where shaded blocks indicate occupied pixels with values, and in the illustrated example the width is 8 and the height is 2. In another example FIG. 13D illustrates an example of a frame size where shaded blocks indicate occupied pixels and n=2 and M=4, wherein in the illustrated example, the width is 8 and the height is 4.

In the case that 3 different component values such as (dX, dY, dZ) are placed on a single plane, e.g. the Y plane, the total number of pixels occupied by the values will be 3×num_missed_points. For such cases, the frame height (height) can be derived as follows:

$$height = \left\lceil \frac{3 \times num\_missed\_points}{width} \right\rceil$$

Figure 13E:
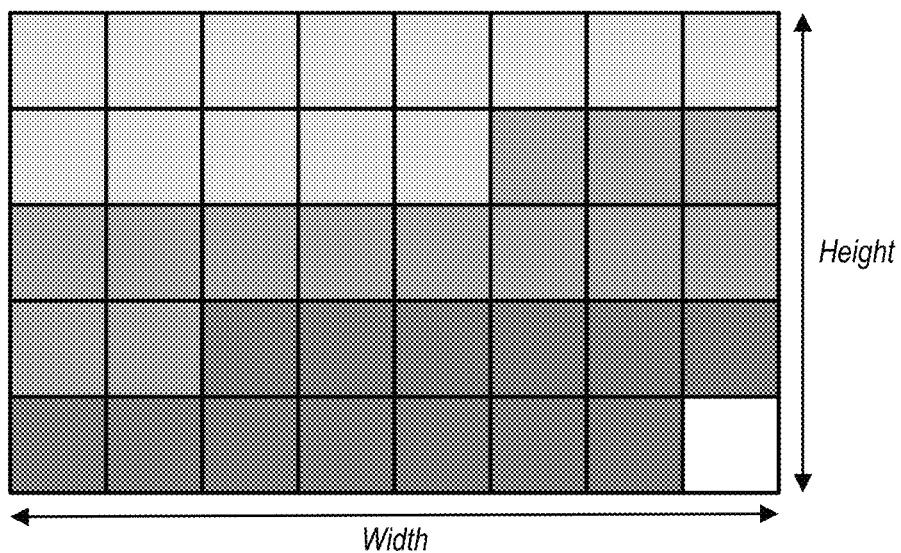
FIG. 13E illustrates an example video frame, according to some embodiments.

For example, FIG. 13E illustrates an example frame size where each shade indicates a different residual value component. In the illustrated example, the width is 8 and the height is 5.

In an alternative embodiment, and again in the case that 3 different component values, such as (dX, dY, dZ) are placed on a single plane, e.g. the Y plane, then each component can start at the beginning of a row for derivation convenience and also to avoid further contamination between different components. The empty areas could be left with a zero or some other fixed value, or replaced/padded with either the values on the left, above, or a blend between the neighboring values on the left or above. For example:

$$height = 3 \times \left\lceil \frac{num\_missed\_points}{width} \right\rceil$$

Figure 13F:
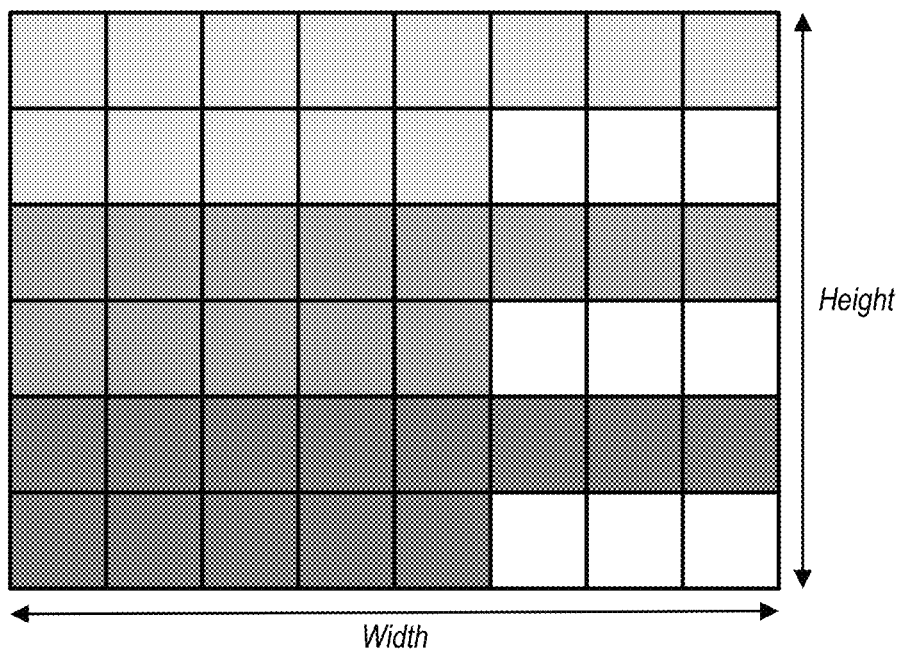
FIG. 13F illustrates an example video frame, according to some embodiments.

FIG. 13F illustrates such an example, wherein each shade indicates a different component. In the example illustrated in FIG. 13F the width is 8 and the height is 6. Also note that the "white" blocks may be padded blocks that do not include residual values.

In some embodiments, when the block size R is defined by signaling or predefining, each component can start at the beginning of a block. For example, in the case that 3 components such as (dX, dY, dZ) are placed on a single plane, such as the Y plane, the frame height (height) can be derived as a multiple of M by applying the method as described above in regard to FIG. 13D.

In some embodiments, when missed points include depth only missed points and also 3 component missed points, the set of depth only missed points can be mapped first and then the set of 3 component missed points can be mapped afterwards. In this case, the total number of pixels occupied in the frame will be num_missed_points_1comp+3× num_missed_points_3comp. In this case, the height can be derived as follows:

$$height = \left\lceil \frac{num\_missed\_points\_1comp + 3 \times num\_missed\_points\_3comp}{width} \right\rceil$$

Figure 13G:
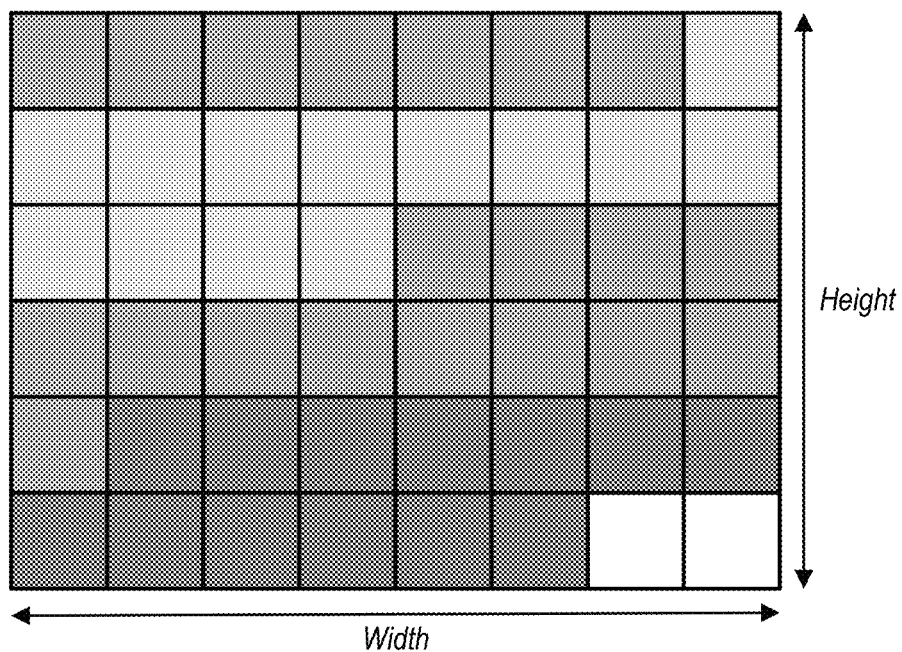
FIG. 13G illustrates an example video frame, according to some embodiments.

For example, FIG. 13G illustrates an example of a frame where the gradient shaded blocks indicate pixels corresponding to depth only points and the fixed gray blocks indicate different components of 3 component missed points. In this example, num_missed_points_1comp=7, num_missed_points_3comp=13. The 3 components are grouped by the component for 3 component missed points. The width is 8, the height is 6.

In some embodiments, when missed points include depth only missed points and also 3 component missed points, each set of missed points can start at the beginning of a row for derivation convenience and also characteristic discontinuity. In this case the height can be derived as the sum of the height of each subset. When the number of depth only missed points is num_missed_points_1comp, the number of 3 component missed points is equal to num_missed_points_3comp, and the frame_width is width, the height can be computed as follows:

$$height = height1 + height2$$

$$height1 = \left\lceil \frac{num\_missed\_points\_1comp}{width} \right\rceil$$

$$height2 = \left\lceil \frac{3 \times num\_missed\_points\_3comp}{width} \right\rceil$$

Figure 13H:
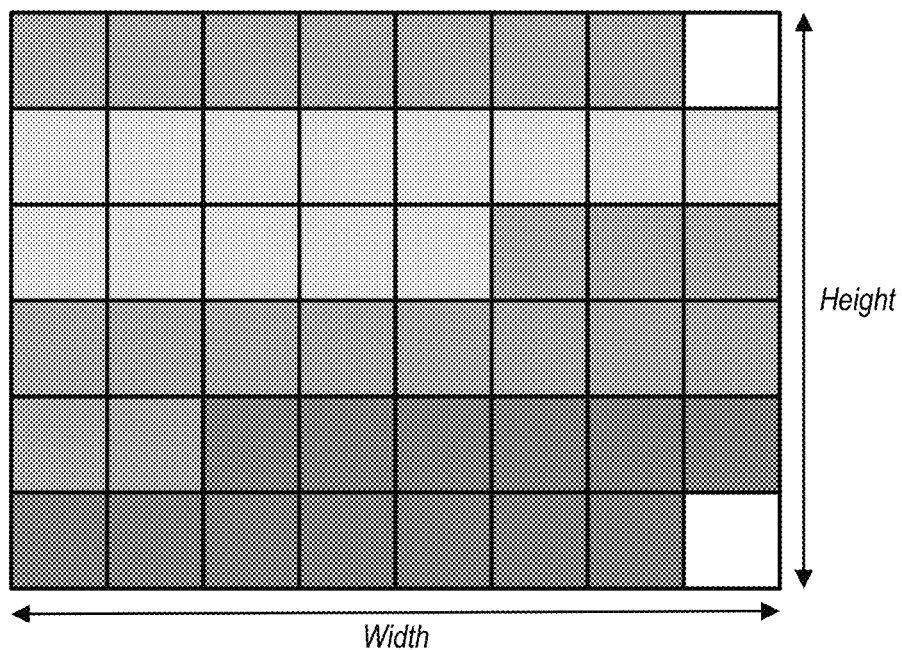
FIG. 13H illustrates an example video frame, according to some embodiments.

For example, FIG. 13H illustrates an example of a frame where the gradient shaded blocks indicate pixels corresponding to depth only points and the other, fixed value blocks, indicate difference components of 3 component missed points. In this example, num_missed_points_1comp=7, num_missed_points_3comp=13.

In some embodiments, the order of the missed points set (depth only missed points, 3 component missed points), the start position of each set and each component t (at the beginning of a row or next of a previously occupied pixel) and the height regularity (multiple of M or not) can be combined as needed. In this case, height1 and height3 can be derived using any of the above mentioned methods, where applicable. For example, depth only missed points can be placed first and the derived height can be a multiple of M. Then the 3 component missed points will start at the beginning of a new row. The set of each component of the missed points can be placed sequentially. In this case the frame_height can be derived as follows:

$$height = height1 + height3$$

$$height1 = \left\lceil \frac{\frac{num\_missed\_points\_1comp}{width}}{M} \right\rceil \times M$$

$$height2 = 3 \times \left\lceil \frac{num\_missed\_points\_3comp}{width} \right\rceil$$

Figure 13I:
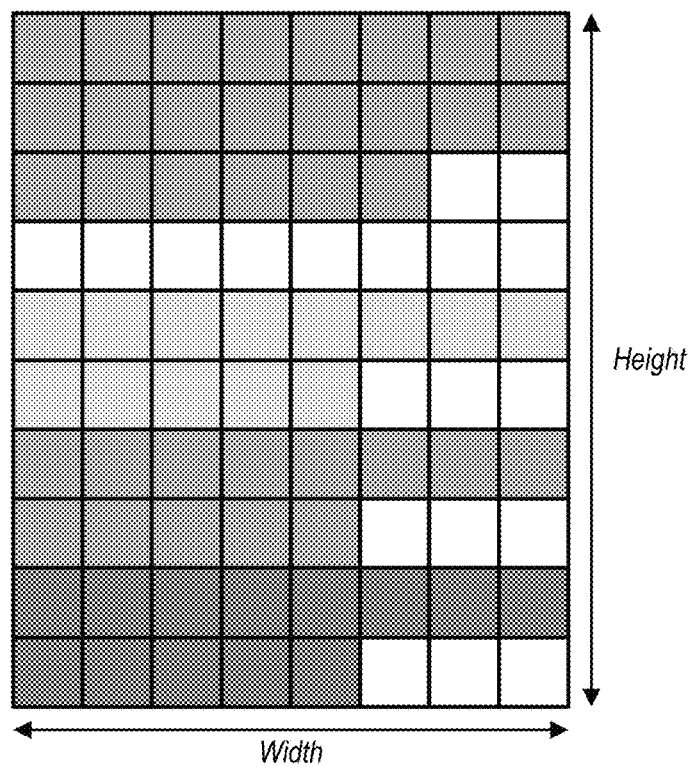
FIG. 13I illustrates an example video frame, according to some embodiments.

For example, FIG. 13I illustrates an example of a frame where the gradient shaded blocks indicate pixels corresponding to depth only points and the remaining blocks indicate difference components of 3 component missed points. In this example, num_missed_points_1comp=22, num_missed_points_3comp=13.

The residual values (dx(Q), dy(Q), dz(Q), dR(Q), dG(Q), dB(Q)) and or residual values for depth only missed points Q may be placed in the video frame of the determined frame size using various scanning techniques. In a scanning technique, a first residual value may be placed in a first pixel location according to the scanning technique, and a subsequent residual value may be placed in a subsequent pixel according to the scanning technique, and so on.

In some embodiments, a predefined scanning order may be signaled. For example, a raster scan, a zig-zag scan, a z-order, a traverse scan or their vertical inversion could be used. The scanning order may be different for geometry residual frames and texture residual frames. In some embodiments, the scanning order for each frame may be signaled separately. For example, FIG. 13A illustrates example scanning techniques including a raster scan, a zigzag scan, a "Z" scan, and a traverse scan.

In some embodiments, the scanning techniques, also referred to herein as scanning orders, may be determined based on one or more of: rate, distortion, rate distortion optimization, memory access constraints, and/or could be based on user preferences. Such decisions may be made at a frame level, or every certain number of frames, e.g. Nf. The number Nf could be fixed and based on user preferences or other criteria, or could also be adaptive based on, for example, system, processing, or power requirements. In some embodiments, scanning orders may be signaled for each frame or for each group of frames. In some embodiments, placement of missed points on a frame may consider temporally consistency. In such embodiments, a same scanning order may be used for different sequential frames in time.

In some embodiments, when missed points (Ps) have more than one component, such as 3-component missed points, the components may be interleaved or grouped per component type. For example, FIG. 13B shows (a) interleaved components and (b) components grouped per component type. For example, when geometry residuals are mapped onto a single plane, a residual set of one missed point (dx(Q), dy(Q), dz(Q)) may be mapped sequentially as shown in FIG. 13B (a). And as another example, when residuals are again mapped onto a single plane, residual sets of missed points (dx(Q), dy(Q), dz(Q)) may be mapped per axis, e.g. all the dx(Q) can be mapped first, then all the dy(Q), and then all the dz(Q) may be mapped, as shown in FIG. 13B (b).

In some embodiments, residual values mapped onto a frame can be scanned using the scanning order specified in either some metadata information or predicted by the system. The scanning order and the frame size derivation process can be combined, if possible. In the example where depth only missed points can be placed first and its height can be a multiple of M, then the 3 component missed points start at the beginning of a new row. The set of each component of the missed points can be placed sequentially, the first num_missed_points_1comp residuals can be scanned block by block with z scan order. Then the last 3×num_missed_points_3comp can be scanned using a raster scan order for each num_missed_points_3comp component.

Figure 13J:
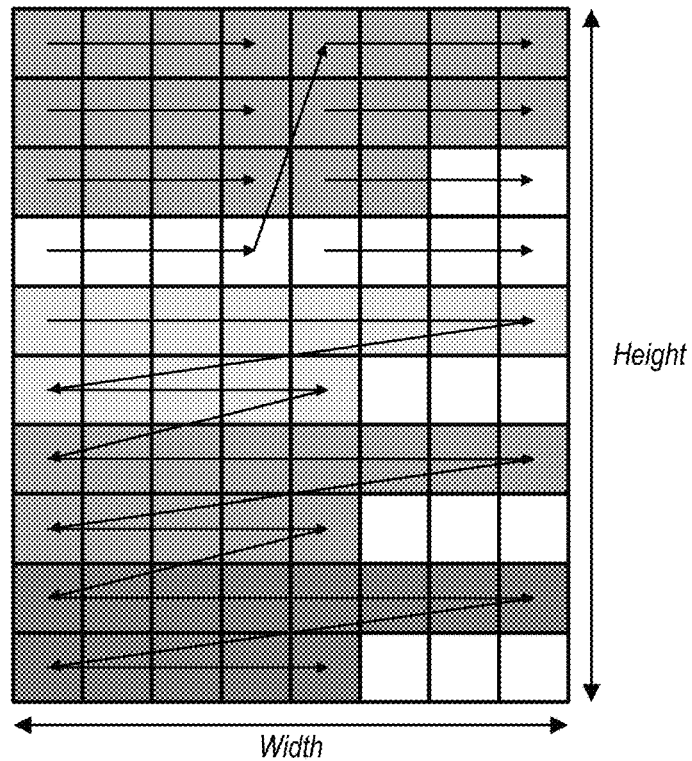
FIG. 13J illustrates an example scanning order, according to some embodiments.

For example, FIG. 13J illustrates such an example scanning order.

Figure 13K:
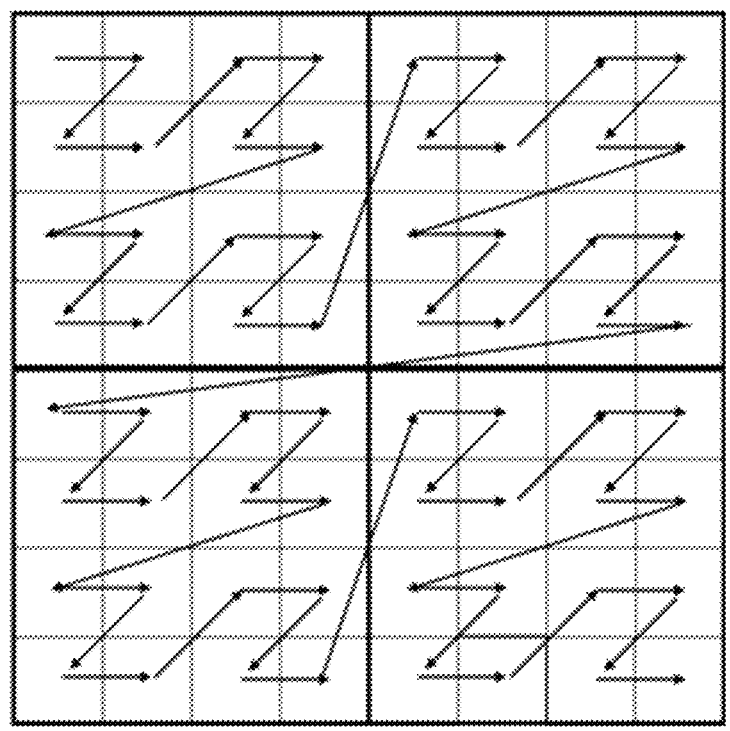
FIG. 13K illustrates an example scanning order, according to some embodiments.

In some embodiments, when the values are scanned block by block, the block can be scanned in a reduced quad tree order as shown in FIG. 13K.

In some embodiments, when pixels in a frame are not filled with values, the pixels may be set as 0. Also the pixels can be set as a predefined value. Also the pixels can be set as the same value of previous pixels. Also the pixels can be set as the average or weighted average of neighboring available pixels.

In some embodiments, missed point geometry residuals (dx(Q), dy(Q), dz(Q)) and the missed point texture residuals (dR(Q), dG(Q), dB(Q)) can be signaled in separate video streams.

In some embodiments, missed point geometry residuals (dx(Q), dy(Q), dz(Q)) can be mapped to 3 different color planes respectively to compose a single video sequence. For example, dx(Q) may be mapped to the Y plane, dy(Q) may be mapped to the co-located positions in the U plane, and dz(Q)) may be mapped to the co-located positions in the V plane.

In some embodiments, the missed point geometry residuals (dx(Q), dy(Q), dz(Q)) can be mapped onto the same color plane, for example, on the Y plane.

In some embodiments, when residual sets of missed points (dx(Q), dy(Q), and dz(Q) or dR(Q), dG(Q), and dB(Q)) are mapped per axis, the values of each axis can be saved from the new line/column/block depending on its scanning order.

In some embodiments, the missed point geometry residuals that have only a depth difference (dz(Q)) are mapped first. Then all other residuals are mapped next.

In some embodiments, all the missed point geometry residuals that have only depth difference (dz(Q)) are mapped last.

In some embodiments, when the missed point geometry residuals that have only a depth difference (dz(Q)) are mapped, only the depth difference (dz(Q)) can be saved in the video frame.

In some embodiments, missed point texture residuals (dR(Q), dG(Q), dB(Q)) can be mapped to the 3 different color planes respectively to compose a new video sequence. For example, dR(Q) may be mapped to the Y plane, dG(Q) may be mapped to the co-located positions on the U plane, and dB(Q)) may be mapped to the co-located positions on the V plane. Alternatively, in some embodiments, missed point texture residuals (dR(Q), dG(Q), dB(Q)) can be mapped onto a same color plane, for example, the Y plane.

In some embodiments, all the missed point texture residuals of depth only points can be mapped first.

In some embodiments, all the missed point texture residuals of depth only points can be mapped last.

In some embodiments, in order to achieve lossless compression, the encoder may be configured such that the precision of the occupancy map is 1×1, i.e. each pixel in the occupancy map corresponds to one point/pixel in the geometry and attribute images. Afterwards, the video codec may be configured in lossless mode and the smoothing step as described above that is applied to the reconstructed point cloud may be disabled. Also, the quantization step for i(Q), j(Q), dx(Q), dy(Q), dz(Q), dR(Q), dG(Q), and dB(Q) should be disabled to achieve lossless compression.

Point Cloud Attribute Transfer Algorithm

In some embodiments, a point cloud transfer algorithm may be used to minimize distortion between an original point cloud and a reconstructed version of the original point cloud. A transfer algorithm may be used to evaluate distortion due to the original point cloud and the reconstructed point cloud having points that are in slightly different positions. For example, a reconstructed point cloud may have a similar shape as an original point cloud, but may have a.) a different number of total points and/or b.) points that are slightly shifted as compared to a corresponding point in the original point cloud. In some embodiments, a point cloud transfer algorithm may allow the attribute values for a reconstructed point cloud to be selected such that distortion between the original point cloud and a reconstructed version of the original point cloud is minimized. For example, for an original point cloud, both the positions of the points and the attribute values of the points are known. However, for a reconstructed point cloud, the position values may be known (for example based on a sub-sampling process, K-D tree process, or a patch image process as described above). However, attribute values for the reconstructed point cloud may still need to be determined. Accordingly a point cloud transfer algorithm can be used to minimize distortion by selecting attribute values for the reconstructed point cloud that minimize distortion.

The distortion from the original point cloud to the reconstructed point cloud can be determined for a selected attribute value. Likewise the distortion from the reconstructed point cloud to the original point cloud can be determined for the selected attribute value for the reconstructed point cloud. In many circumstances, these distortions are not symmetric. The point cloud transfer algorithm is initialized with two errors (E21) and (E12), where E21 is the error from the second or reconstructed point cloud to the original or first point cloud and E12 is the error from the first or original point cloud to the second or reconstructed point cloud. For each point in the second point cloud, it is determined whether the point should be assigned the attribute value of the corresponding point in the original point cloud, or an average attribute value of the nearest neighbors to the corresponding point in the original point cloud. The attribute value is selected based on the smallest error.

Below is a more detailed discussion of how a point cloud transfer algorithm is utilized to minimize distortion between an original point cloud and a reconstructed point cloud.

The attribute transfer problem could defined as follows:

a. Let $PC1=(P1(i))_{i \in \{1, \ldots, N1\}}$ be a point cloud defined by its geometry (i.e., 3D positions) $(X1(i))_{i \in \{1, \ldots, N1\}}$ and a set of attributes (e.g., RGB color or reflectance) $(A(i))_{i \in \{1, \ldots, N1\}}$. Let $PC2(P2(j))_{j \in \{1, \ldots, N2\}}$ be a re-sampled version of PC1 and let $(X2(j))_{j \in \{1, \ldots, N2\}}$ be its geometry.

b. Then compute the set of attribute of $(A2(j))_{j \in \{1, \ldots, N2\}}$ associated with the point of PC2 such that the texture distortion is minimized.

In order to solve the texture distortion minimization problem using an attribute transfer algorithm:

Let $P_{2 \to 1}(j) \in PC1$ be the nearest neighbor of $P2(j) \in PC2$ in PC1 and $A_{2 \to 1}(j)$ its attribute value.

Let $P_{1 \to 2}(i) \in PC2$ be the nearest neighbor of $P1(i) \in PC1$ in PC2 and $A_{1 \to 2}(i)$ its attribute value.

Let $\wp_{i \to 2}(j) = (Q(j,h))_{h \in \{1, \ldots, H(j)\}} \subseteq PC2$ be the set of points of PC2 that share the point $P1(i) \in PC1$ as their nearest neighbor and $(\alpha(j,h))_{h \in \{1, \ldots, H(j)\}}$ be their attribute values Let $E_{2 \to i}$ be the non-symmetric error computed from PC2 to PC1:

$$E_{2 \to 1} = \Sigma_{j=1}^{N2} \|A2(j) - A_{2 \to 1}(j)\|^2$$

Let $E_{1 \to 2}$ be the non-symmetric error computed from PC1 to PC2:

$$E_{1 \to 2} = \Sigma_{j=1}^{N1} \|A1(j) - A_{1 \to 2}(j)\|^2$$

Let E be symmetric error that measures the attribute distortion between PC2 to PC1:

$$E = \max(E_{2 \to 1}, E_{1 \to 2})$$

Then determine the set of attributes $(A2(j))_{j \in \{1, \ldots, N2\}}$ as follows:

--- a. Initialize E1 ← 0 and E2 ← 0
b. Loop over all the point of PC2
   1) For each point P2(j) compute $P_{2 \to 1}(j) \in PC1$ and $\wp_{1 \to 2}(j)$
   2) If (E1 > E2 or $\wp_{1 \to 2}(j) = \{\}$)
     • A2(j) = $A_{2 \to 1}(j)$
   3) Else

• $A2(j) = \dfrac{1}{H(j)} \sum_{h=1}^{H(j)} \alpha(j, h)$

4) EndIf
   5) E1 ← E1 + $\|A2(j) - A_{2 \to 1}(j)\|^2$

6) E2 ← E2 + $\left\|A2(j) - \dfrac{1}{H(j)} \sum_{h=1}^{H(j)} \alpha(j, h)\right\|^2$

---

Multi-Level Video/Image Encoding

In many applications, there is a need to compress multi-level images, where the number of levels is commonly much lower than the number of levels that may be supported by the codec. There are also cases where the number of levels that are to be encoded may exceed the number of levels supported by the codec. Most codecs, for example, are built on the assumption that 8 bit or 10 bit images are to be encoded, and assume that usually up to 256 or 1024 levels respectively may be present in an image. On the other hand, it is common to encounter applications where fewer levels may need to be encoded. Example applications include binary map compression where each pixel can be either a 0 or a 1, and index map compression where each pixel can be an index value in the range of [0, N−1]. 16 bit depth information is also required in some applications and needs to be compressed using conventional codecs. Such compression may need to be lossless, but there are also cases where some loss may be tolerated, up to a certain degree.

In some embodiments, a system includes the following stages

Code word mapping. Each input pixel value is mapped to one or more M-bit code words, e.g. 8-bit or 10-bit code word.

Pre-processing. This optional step can make the images friendlier for compression.

Encode/decode. In principle any image/video codec can be used here, including H.264/AVC or H.265/HEVC, AV1, etc. Different profiles and coding tools could also be used in these codecs.

Post-processing. Decoded images are converted back to the original signal space with a mapping function. Mapping function can be signaled as a side information, in-band or out-of-band from the compressed video data.

The above stages are described in more detail below.

Code Word Mapping

Mapping of the N-Bit data to M-bit code words would depend on whether N<M.

If N<M, then there are several different options:

a) scale the data by multiplying using a value $2^{\wedge}(M-N-i)$ (or equivalently shifting the data by (M−N−i) with 0<=i<= (M−N). Obviously when i=M−N, no scaling is performed.

b) scale the data by multiplying using a value of $(2^{\wedge}(M-i)-1)$ and then dividing by $(2^{\wedge}(N)-1)$, with again 0<=i<=(M−N).

c) scale the data by multiplying using a value of X with $(2^{\wedge}(N)-1) < X <= (2^{\wedge}(M)-1)$ and then dividing by $(2^{\wedge}(N)-1)$.

If N>M, then the original X is separated in several sub images of lower bit depth by processing each pixel x in that image as follows:

---

```
O = N − M
y_0 = (x + (1 << O)) >> (O + 1)
y_1 = x − (y_0 << (O + 1)) + (1 << O)
if (O > M) {
    P = O − M
    y_1 = (y_1 + (1 << P)) >> (P + 1)
    y_2 = x − (y_1 << (P + 1)) + (1 << P)
}
```

---

The above process repeats until all samples N have been assigned to a sub image of particular bit depth.

The above process repeats until all samples N have been assigned to a sub image of particular bit depth. Note that in this case rounding up is performed, so the reason why shifting by O+1 is performed is to ensure that there is not overflow in the MSB. It is not necessary for all sub images to use the same bit depth. Some images could use bit depth of 10 and others of 8 for example. Such order could be prefixed/predetermined and known at both the encoder and/or decoder, or determined on the encoder based, for example, coding performance, and signaled to the decoder. For example if N=16 and M=10, then $$y\_0=(x+(1<<6))>>7=(x+64)>>7$$

$$y\_1=x-(y\_0<<7)+64$$

If a codec is used to compress y_0, y_1, or any subsequent sub picture, a closed loop conversion could be used when generating these sub pictures. For example, after generating y_0, it can be compressed and the reconstructed image y_0_rec can be generated. Then y_1 could be generated as:

$$y\_1=x-(y\_0\_rec<<(O+1))+(1<<O)$$

Instead of the earlier formulation, the same could be done for y_2, given the reconstruction of y_1, y_1_rec, and for any subsequent sub picture.

Pre-Processing

A spatial smoothing filter can be employed to smooth out the high frequencies associated with code word transitions. The smoothing filter can be designed to take into account unequal error cost. For instance if an error of coding 1->0 is higher than an error of coding 0->1, the darker curve may be preferred over the lighter curve, in the example shown in FIG. 13L.

The filter could be, for example a bilinear or bicubic filter, a cosine filter, a gaussian filter, a lanczos filter etc.

The idea behind this pre-processing is that when decoding, if a value above a normalized 0.5 value is encountered, then that would be decoded as a value of 1, whereas all other values will be interpreted as 0.

Figure 13L:
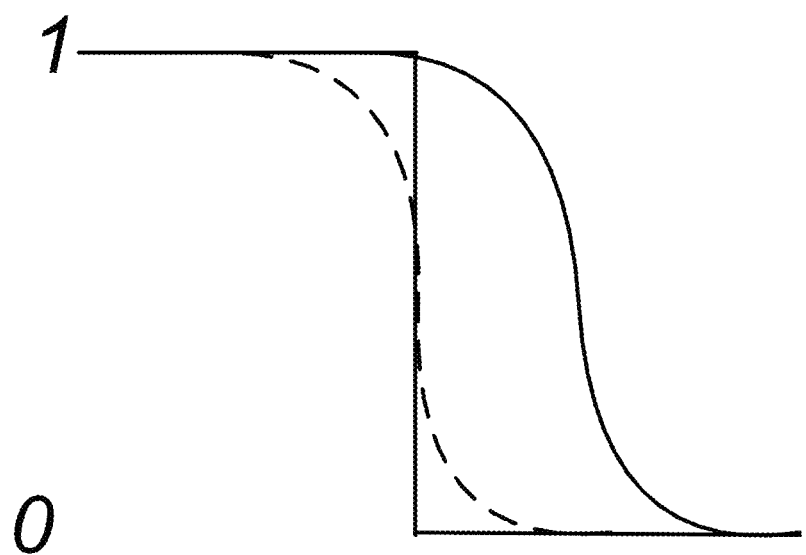
FIG. 13L illustrates an example of two curves that result from applying different filters, according to some embodiments.

It should be noted that in the example shown in FIG. 13L, the lighter curve could prevent ambiguity or leakage between values corresponding to 1 or 0 into their inverse value. Essentially, in this case a range of values can be defined that are not permitted to be generated by the filter so as to avoid ambiguity. The range does not need to be symmetric and a bias towards one end versus the other may be considered.

In some embodiments, spatio-temporal filters may be used to smooth out high frequencies in the temporal dimension, to make the signal friendlier to compress. Techniques in this category include 1) temporal smoothing filter and 2) a "temporal alignment" step to make sure the spatial-only filter mentioned above are consistent in the temporal dimension. The pre-processing stage could be easily extended to multi-level images.

Post Processing Decoded images are converted back to the original signal space with a mapping function. The mapping function can be a one-to-one mapping, or a mapping based on contextual information.

One to one mapping may be similar to quantization, mapping input values from a large set to output values in a smaller set using non-overlapping intervals or quantization boundaries. The set of quantization boundaries can be fixed, or made adaptive and signaled to the decoder as side information.

With contextual information, error can be reduced under certain scenarios. Based on a set of spatial or spatio-temporal neighbors, a joint decision can be made on the current pixel based on voting. The voting strategies can include majority voting, linearly weighted averaging, non-linearly weighted averaging, or iterative refinement based on previous voting results.

Color Consideration

If a 4:2:0, 4:2:2, or 4:4:4 codec is used, both chroma channels can be set to neutral values (128 for 8 bit for example). However, any other value may also be used if desired. A monochrome codec could also be used.

In an alternative embodiment replicating or moving luma values in chroma may be performed. Replication might be useful if using a lossy coding scheme and since that could work as a multiple description coding scheme. In such a scenario errors could be corrected in the full resolution luma by looking at what happens also in the chroma planes. For 4:4:4 coding on the other hand the resolution could be reduced by half by making a 4:4:0 image (subsample horizontally or vertically the original image and placing some of the samples in the luma component and the others in one of the chroma components) and coding it. Replication of one of the components in the remaining color plane could also be possible or instead it could be specified that the last plane could contain a function between the other two planes, such as a difference of the other two planes, an XOR of the other two planes, their average etc. For example, if Y=x(i, 2j), Cb=(x, 2j+1) then we may select Cr=(x, 2j), Cr=(Y−Cb)+1, or Cr=XOR(Y, Cb).

Codec Considerations

The end-to-end distortion of the system can be defined as the distance between the input and output multi-level images. Encoder decisions can be made aware of the end-to-end distortion, instead of the commonly used distortion functions in regular video encoders. This include things like QP, motion estimation, mode decision, loop filter parameters, etc. As with pre-processing in such encoding process a distorted value can be permitted to be reconstructed to another value that after final processing would map to the same multi-level value. For example, if coding a value of 0.6, then this value could be encoded to any value >0.5 and essentially result in the same reconstruction as the original process (i.e. a value of 1). Processes such as motion estimation and mode decision could consider such mapping when performing coding decisions and for selecting the best predictor candidate/coding mode.

In some instances, some distortion may be permitted to occur for a sample. That is a sample that originally corresponded to a level 10, is allowed to be changed to correspond to either level 11 or 12, if those were available. In a particular embodiment it may be permitted that any number of points in a particular layer change but it could also restrict such number of points. Restriction could also be independent per mapping value. E.g. for a binary image, we may wish to restrict differently the number of is that could be permitted to change to 0, and a different number of 0s permitted to change to 1. The shape and characteristics of the region we wish to encode could also be considered. Such information may be available also at the decoder, but could also be explicitly sent into the video signal.

Lossless Consideration

Additional considerations can be made, if the end goal is to provide a lossless coding on multi-level images. One way to achieve lossless is to find the maximal Qp for each block, that also can produce lossless reconstruction after quantization. Determination of the maximal QP could be based on a thorough search and coding evaluation of the current block, and/or could also be based on the characteristics of the current block and its prediction mode and/or residual information after prediction.

For bi-level images the XOR operator could be used to make data more sparse. We know, in particular that the XOR operator results in a value of 1 when samples are the same, and a 0 if the values are different. Using this property an occupancy map can be processed horizontally and/or vertically with the XOR operator. In particular, for every pixel in the image the pixel is updated as follows.

```
// horizontal processing
for (j=0; j < height; j++) {
    b(j,0) = a(j,0)
    for (1= 0; i < width - 1; i++) {
        b(j,i+1) = xor(a(j,i), a(j,i+1));
    }
}
// vertical
for (i=0; i <width; i++) {
    c(0,i) = b(0,i)
    for (j=0; j < height -1; j++) {
        c(j+1,i) = xor(j,i), b(j+1,i));
    }
}
```

Decoding could be performed in similar fashion and by backtracking the above conversion. For example, first decode the vertical samples using the following:

```
//vertical
for (i=0; i <width; i++) {
    d(0,i) = c(0, i)
    for (j=0; j < height -1; j++) {
        d(j+1,i) = xor(dd(j,i), c(j+1,i));
    }
}
// horizontal processing
for (j=0; j < height; j++) {
    e(j,0) = d(j,0)
    for (i= 0; i < width - 1; i++) {
        e(j,i+1) = xor(j,i), d(j,1+1));
    }
}
c=b;
for j=1:320
    for i=1:319
        c(j,i+1) = xor(c(j,i), b(j,i+1));
    end
end
```

Example Applications Using Point Cloud Encoders and Decoders

Figure 14:
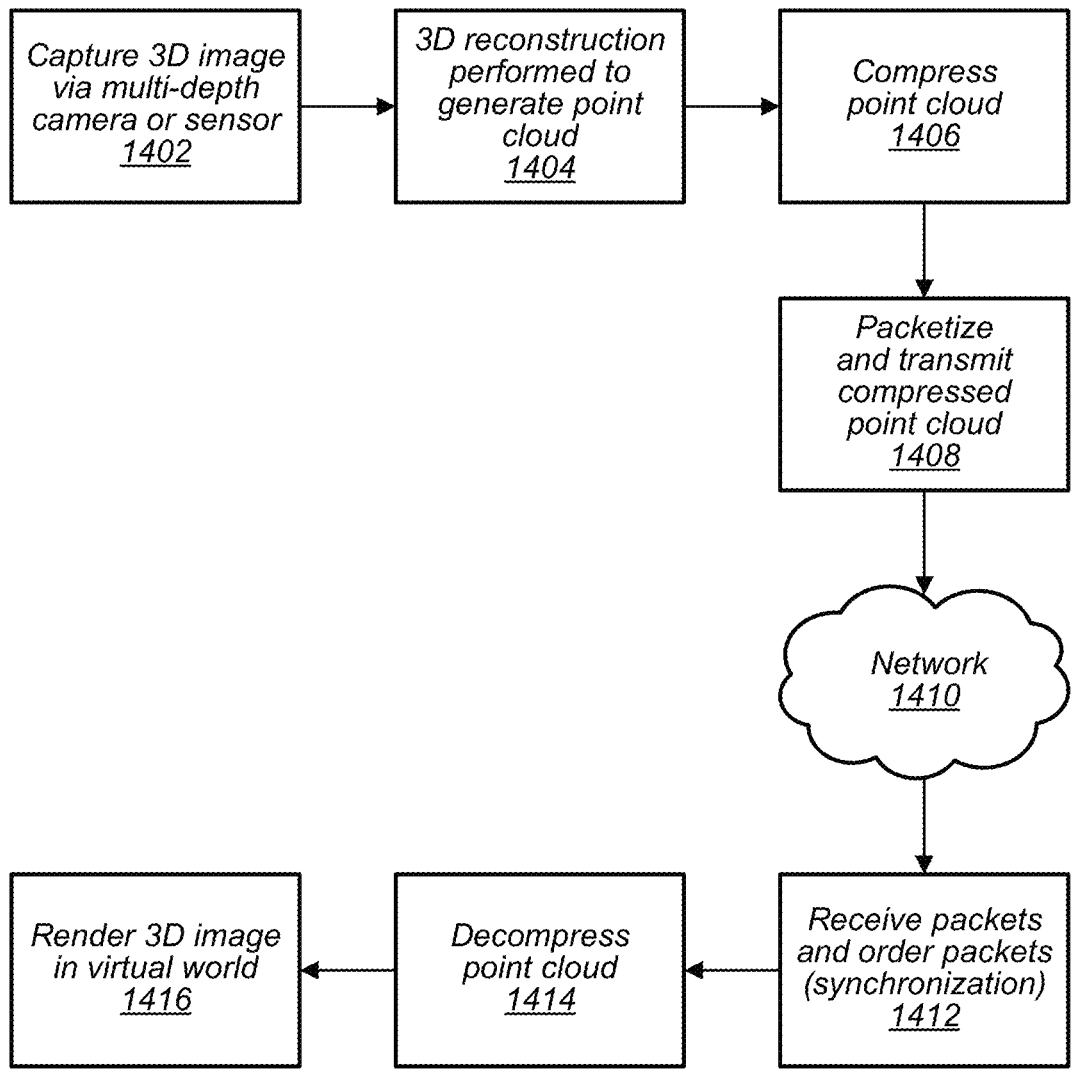
FIG. 14 illustrates compressed point cloud information being used in a 3-D telepresence application, according to some embodiments.

FIG. 14 illustrates compressed point clouds being used in a 3-D telepresence application, according to some embodiments.

In some embodiments, a sensor, such as sensor 102, an encoder, such as encoder 104 or any of the other encoders described herein, and a decoder, such as decoder 116 or any of the decoders described herein, may be used to communicate point clouds in a 3-D telepresence application. For example, a sensor, such as sensor 102, at 1402 may capture a 3D image and at 1404, the sensor or a processor associated with the sensor may perform a 3D reconstruction based on sensed data to generate a point cloud.

At 1406, an encoder such as encoder 104 may compress the point cloud and at 1408 the encoder or a post processor may packetize and transmit the compressed point cloud, via a network 1410. At 1412, the packets may be received at a destination location that includes a decoder, such as decoder 116. The decoder may decompress the point cloud at 1414 and the decompressed point cloud may be rendered at 1416. In some embodiments a 3-D telepresence application may transmit point cloud data in real time such that a display at 1416 represents images being observed at 1402. For example, a camera in a canyon may allow a remote user to experience walking through a virtual canyon at 1416.

Figure 15:
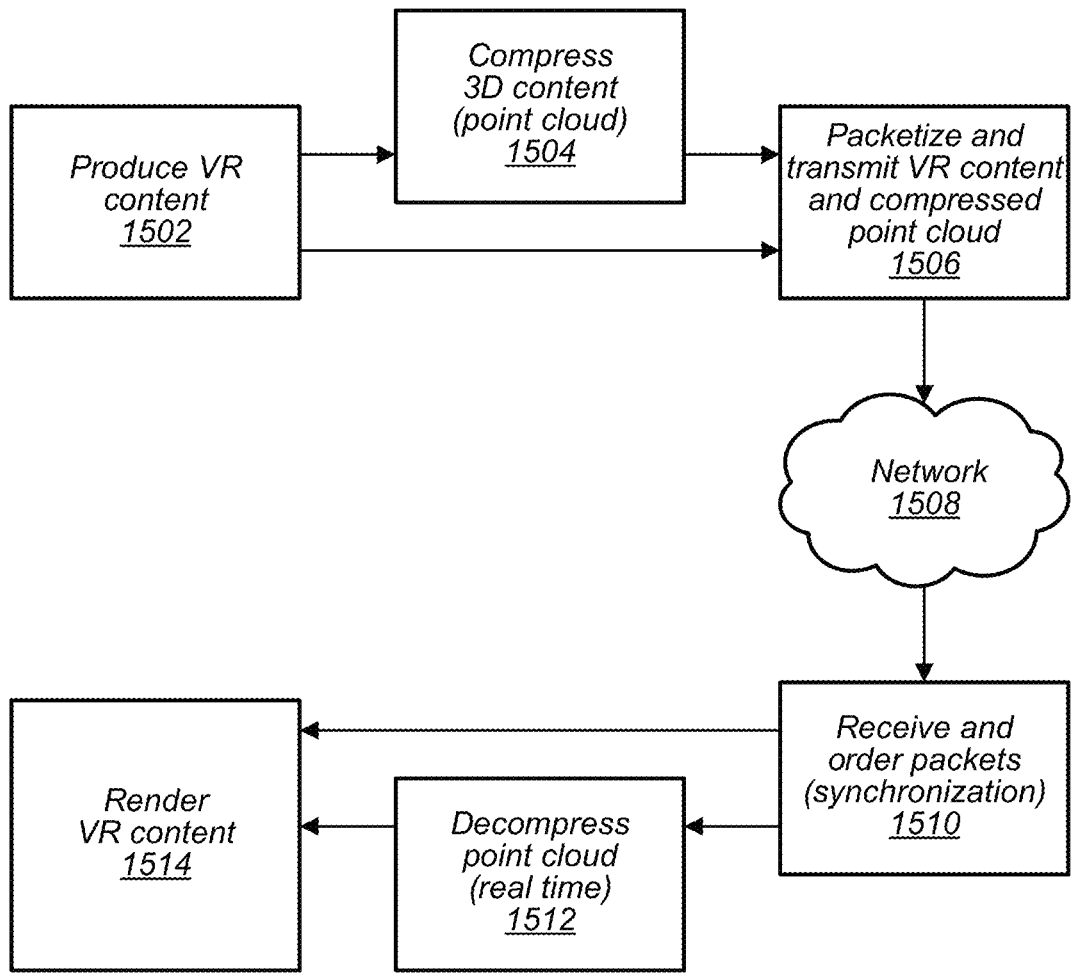
FIG. 15 illustrates compressed point cloud information being used in a virtual reality application, according to some embodiments.

FIG. 15 illustrates compressed point clouds being used in a virtual reality (VR) or augmented reality (AR) application, according to some embodiments.

In some embodiments, point clouds may be generated in software (for example as opposed to being captured by a sensor). For example, at 1502 virtual reality or augmented reality content is produced. The virtual reality or augmented reality content may include point cloud data and non-point cloud data. For example, a non-point cloud character may traverse a landscape represented by point clouds, as one example. At 1504, the point cloud data may be compressed and at 1506 the compressed point cloud data and non-point cloud data may be packetized and transmitted via a network 1508. For example, the virtual reality or augmented reality content produced at 1502 may be produced at a remote server and communicated to a VR or AR content consumer via network 1508. At 1510, the packets may be received and synchronized at the VR or AR consumer's device. A decoder operating at the VR or AR consumer's device may decompress the compressed point cloud at 1512 and the point cloud and non-point cloud data may be rendered in real time, for example in a head mounted display of the VR or AR consumer's device. In some embodiments, point cloud data may be generated, compressed, decompressed, and rendered responsive to the VR or AR consumer manipulating the head mounted display to look in different directions.

In some embodiments, point cloud compression as described herein may be used in various other applications, such as geographic information systems, sports replay broadcasting, museum displays, autonomous navigation, etc.

Example Computer System

Figure 16:
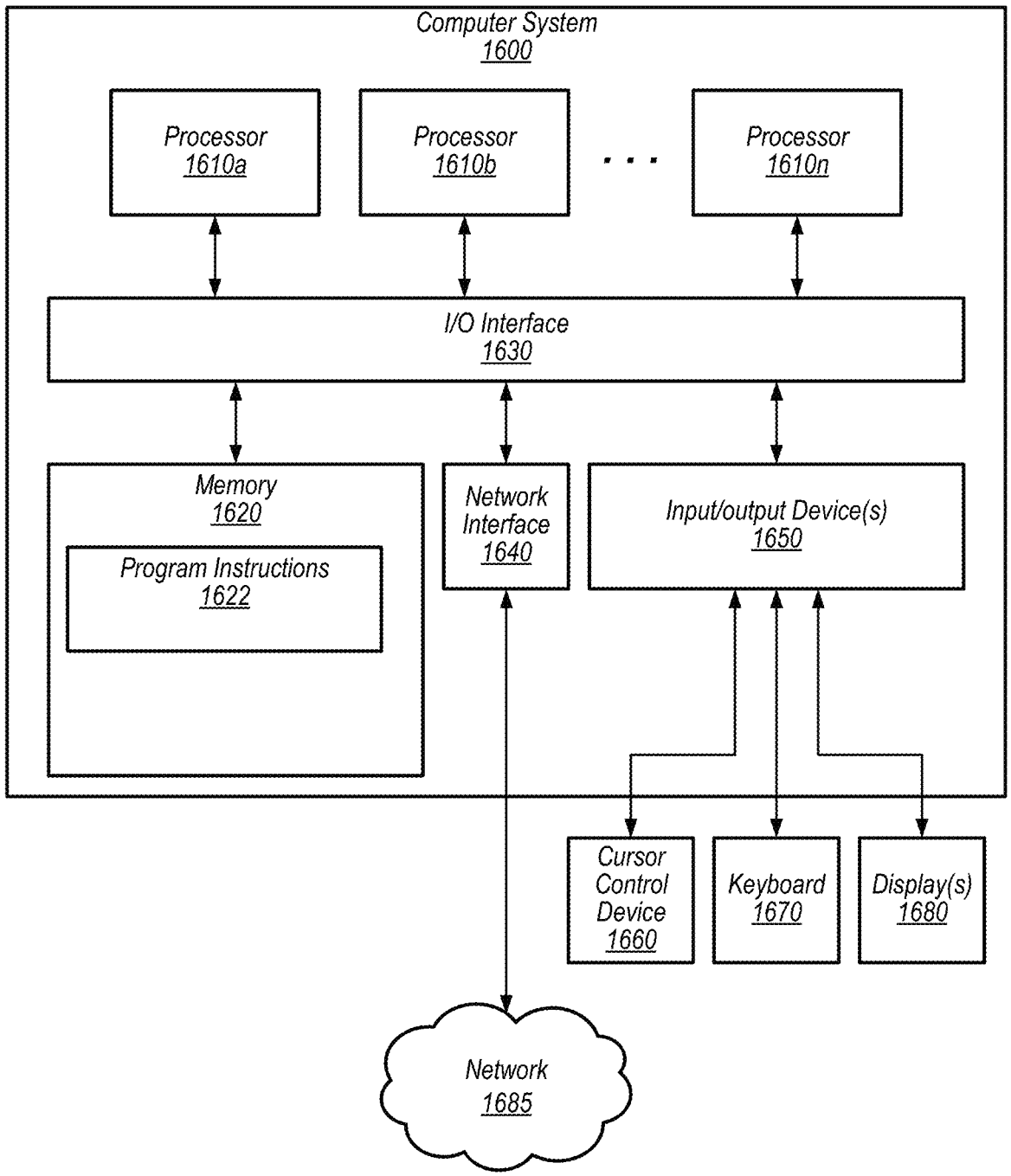
FIG. 16 illustrates an example computer system that may implement an encoder or decoder, according to some embodiments.

FIG. 16 illustrates an example computer system 1600 that may implement an encoder or decoder or any other ones of the components described herein, (e.g., any of the components described above with reference to FIGS. 1-15), in accordance with some embodiments. The computer system 1600 may be configured to execute any or all of the embodiments described above. In different embodiments, computer system 1600 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a point cloud encoder or decoder, as described herein may be executed in one or more computer systems 1600, which may interact with various other devices. Note that any component, action, or functionality described above with respect to FIGS. 1-15 may be implemented on one or more computers configured as computer system 1600 of FIG. 16, according to various embodiments. In the illustrated embodiment, computer system 1600 includes one or more processors 1610 coupled to a system memory 1620 via an input/output (I/O) interface 1630. Computer system 1600 further includes a network interface 1640 coupled to I/O interface 1630, and one or more input/output devices 1650, such as cursor control device 1660, keyboard 1670, and display(s) 1680. In some cases, it is contemplated that embodiments may be implemented using a single instance of computer system 1600, while in other embodiments multiple such systems, or multiple nodes making up computer system 1600, may be configured to host different portions or instances of embodiments. For example, in one embodiment some elements may be implemented via one or more nodes of computer system 1600 that are distinct from those nodes implementing other elements.

In various embodiments, computer system 1600 may be a uniprocessor system including one processor 1610, or a multiprocessor system including several processors 1610 (e.g., two, four, eight, or another suitable number). Processors 1610 may be any suitable processor capable of executing instructions. For example, in various embodiments processors 1610 may be general-purpose or embedded processors implementing any of a variety of instruction set architectures (ISAs), such as the x86, PowerPC, SPARC, or MIPS ISAs, or any other suitable ISA. In multiprocessor systems, each of processors 1610 may commonly, but not necessarily, implement the same ISA.

System memory 1620 may be configured to store point cloud compression or point cloud decompression program instructions 1622 and/or sensor data accessible by processor 1610. In various embodiments, system memory 1620 may be implemented using any suitable memory technology, such as static random access memory (SRAM), synchronous dynamic RAM (SDRAM), nonvolatile/Flash-type memory, or any other type of memory. In the illustrated embodiment, program instructions 1622 may be configured to implement an image sensor control application incorporating any of the functionality described above. In some embodiments, program instructions and/or data may be received, sent or stored upon different types of computer-accessible media or on similar media separate from system memory 1620 or computer system 1600. While computer system 1600 is described as implementing the functionality of functional blocks of previous Figures, any of the functionality described herein may be implemented via such a computer system.

In one embodiment, I/O interface 1630 may be configured to coordinate I/O traffic between processor 1610, system memory 1620, and any peripheral devices in the device, including network interface 1640 or other peripheral interfaces, such as input/output devices 1650. In some embodiments, I/O interface 1630 may perform any necessary protocol, timing or other data transformations to convert data signals from one component (e.g., system memory 1620) into a format suitable for use by another component (e.g., processor 1610). In some embodiments, I/O interface 1630 may include support for devices attached through various types of peripheral buses, such as a variant of the Peripheral Component Interconnect (PCI) bus standard or the Universal Serial Bus (USB) standard, for example. In some embodiments, the function of I/O interface 1630 may be split into two or more separate components, such as a north bridge and a south bridge, for example. Also, in some embodiments some or all of the functionality of I/O interface 1630, such as an interface to system memory 1620, may be incorporated directly into processor 1610.

Network interface 1640 may be configured to allow data to be exchanged between computer system 1600 and other devices attached to a network 1685 (e.g., carrier or agent devices) or between nodes of computer system 1600. Network 1685 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1640 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1650 may, in some embodiments, include one or more display terminals, keyboards, keypads, touchpads, scanning devices, voice or optical recognition devices, or any other devices suitable for entering or accessing data by one or more computer systems 1600. Multiple input/output devices 1650 may be present in computer system 1600 or may be distributed on various nodes of computer system 1600. In some embodiments, similar input/output devices may be separate from computer system 1600 and may interact with one or more nodes of computer system 1600 through a wired or wireless connection, such as over network interface 1640.

As shown in FIG. 16, memory 1620 may include program instructions 1622, which may be processor-executable to implement any element or action described above. In one embodiment, the program instructions may implement the methods described above. In other embodiments, different elements and data may be included. Note that data may include any data or information described above.

Those skilled in the art will appreciate that computer system 1600 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1600 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1600 may be transmitted to computer system 1600 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

Various embodiments can be described in view of the following clauses:

1. A system comprising:
   one or more sensors configured to capture a plurality of points that make up a point cloud, wherein respective ones of the points comprise spatial information for the point and attribute information for the point; and
   an encoder configured to compress the point cloud, wherein to compress the point cloud, the encoder is configured to:
      generate, for the point cloud, one or more patch images;
      pack the generated one or more patch images into one or more image frames;
      pad spaces in the one or more image frames that are not covered by the one or more patch images with a pad;
      encode the one or more image frames; and
      encode information indicating regions of the one or more image frames that correspond to active regions or non-active regions of the one or more image frames, wherein regions that are covered by the pad are indicated as non-active regions.

2. The system of clause 1, wherein to generate the one or more patch images, the encoder is configured to:
   project the point cloud onto a cylindrical surface or a spherical surface.

3. The system of clause 1, wherein to generate the one or more patch images, the encoder is configured to:
   project portions of the point cloud onto three or more parallel planes.

4. The system of clause 1, wherein the encoder is further configured to:
   encode, for points of the point cloud that are not visible from a particular point-of-view, information indicating the points are non-active points in the particular point-of-view.

5. The system of clause 4, wherein the encoder is further configured to:
   budget more bits to encoding active regions of the one or more image frames than are budgeted to encoding non-active regions or to encoding non-active points.

6. The system of clause 4, wherein the encoder is further configured to:
   encode the one or more image frames in accordance with a high efficiency video coding (HEVC) standard.

7. The system of clause 6, wherein the encoder is configured to encode the one or more image frames as a plurality of blocks, wherein the encoder is configured to, for each block of an image frame:
   determine whether the block includes only active regions, includes only non-active regions, or includes a mix of active and non-active regions; and
   for respective blocks including a mix of active and non-active regions:
      divide the block into sub-blocks; and
      for sub-blocks comprising only non-active regions exclude the sub-block from one or more distortion calculations performed as part of motion estimation or mode decision.

8. The system of clause 7, wherein:
   a block or sub-block adjacent to a block or sub-block comprising only one or more non-active regions is assigned a distortion weighting factor different from a distortion weighting factor assigned to a block or sub-block comprising one or more active regions that are not adjacent to one or more non-active regions; or
   a block or sub-block comprising patch images for two or more different projections is assigned a distortion weighting factor different from a block or sub-block comprising less than two different project patch images; and
   wherein the encoder is configured to assign different distortion tolerances to the block or sub sub-block based, at least in part, the respective distortion weighting factor assigned to the block or sub-block.

9. The system of clause 6, wherein the encoder is configured to encode the one or more image frames as a plurality of blocks, wherein the encoder is configured to, for each block of an image frame:
   determine whether the block includes only active regions, includes only non-active regions, or includes a mix of active and non-active regions; and
   for respective blocks including a mix of active and non-active regions:
      assign a higher quality parameter for encoding the respective blocks than is assigned for other ones of the blocks that do not include a mix of active and non-active regions.

10. The system of clause 9, wherein the encoder is configured to:
   adjust a quantization factor or a lagrangian multiplier used to encode a block or sub-block, based, at least in part, on a quality parameter assigned to the block or sub-block.

11. The system of clause 6, wherein the encoder is configured to encode the one or more image frames as a plurality of blocks, wherein the encoder is configured to, for each block of an image frame:
   determine a depth of the point cloud in the one or more patch images; and
   assign a higher quality parameter for encoding blocks that correspond to deeper patch images, or portions thereof, than is assigned to blocks that correspond to less deep patch images, or portions thereof.

12. The system of clause 11, wherein the encoder is configured to:
adjust a quantization factor or a lagrangian multiplier used to encode a block or sub-block, based, at least in part, on a quality parameter assigned to the block or sub-block.

12. The system of clause 6, wherein the encoder is configured to:
adjust a quantized coefficient used in trellis quantization to encode the one or more image frames based, at least in part, on whether respective blocks of the one or more image frames comprise active or non-active regions or active or non-active points.

13. The system of clause 6, wherein the encoder is configured to:
modify a sample adaptive offset decision used to encode the one or more image frames based, at least in part, on whether respective blocks of the one or more image frames comprise active or non-active regions or active or non-active points.

14. A decoder configured to:
receive one or more encoded image frames comprising patch images for a compressed point cloud and padding in portions of the or more images that is not occupied by the patch images;
decode the one or more encoded image frames, wherein less decoding resources are allocated to decoding the padded portions of the one or more images than are allocated to decoding the patch image portions of the one or more image frames; and
generate a decompressed version of the compressed point cloud based, at least in part, on the decoded patch images.

15. The decoder of clause 14, wherein the decoder is further configured to:
receive information indicating points of the point cloud that are not visible from a particular point-of-view,
wherein the padded portions of the one or more images or the non-visible points are processed by the decoder as non-active regions of the one or more images.

16. The decoder of clause 15, wherein when performing de-blocking, sample adaptive offset processing, adaptive loop filtering, or de-ringing, the decoder is configured to exclude non-active regions.

17. The decoder of clause 15, wherein when performing post-filtering, the decoder is configured to exclude non-active regions.

18. The decoder of clause 15, wherein when performing overlapped block motion compensation, the decoder is configured to exclude non-active regions.

19. The decoder of clause 15, wherein the decoder is configured to adjust a degree to which a final value determined for a point of the one or more images is clipped based, at least in part, on whether the final value correspond to an active or non-active region of the one or more images.

20. A method comprising:
receiving one or more encoded image frames comprising patch images for a compressed point cloud and padding in portions of the or more images that is not occupied by the patch images;
decoding the one or more encoded image frames, wherein less decoding resources are allocated to decoding the padded portions of the one or more images than are allocated to decoding the patch image portions of the one or more image frames; and
generating a decompressed version of the compressed point cloud based, at least in part, on the decoded patch images.

21. The method of clause 20, further comprising:
receiving information indicating points of the point cloud that are not visible from a particular point-of-view,
wherein the padded portions of the one or more images or the non-visible points are non-active regions of the one or more images.

22. The method of clause 20, further comprising:
performing de-blocking, sample adaptive offset processing, adaptive loop filtering, or de-ringing,
wherein when performing the de-blocking, the sample adaptive offset processing, the adaptive loop filtering, or the de-ringing, the non-active regions are excluded from said performing the de-blocking, the sample adaptive offset processing, the adaptive loop filtering, or the de-ringing.

23. The method of clause 20, further comprising:
performing post-filtering of the one or more images subsequent to decoding the one or more images,
wherein non-active regions are excluded when performing said post-filtering.

24. The method of clause 20, further comprising:
receiving one or more additional encoded image frames comprising patch images for a compressed point cloud and padding in portions of the or more images that is not occupied by the patch images; and
performing overlapped block motion compensation for the one or more additional images relative to the previously received one or more images;
wherein non-active regions are excluded when performing said overlapped block motion compensation.

25. The method of clause 20, further comprising:
clipping a final value determined for a point of the one or more images based, at least in part, on whether the final value correspond to an active or non-active region of the one or more images.

26. A system comprising:
one or more sensors configured to capture a plurality of points that make up a point cloud,
wherein respective ones of the points comprise spatial information for the point and attribute information for the point; and
an encoder configured to compress the point cloud, wherein to compress the point cloud, the encoder is configured to:
determine, for the point cloud, a plurality of patches each corresponding to portions of the point cloud, and
for each patch,
generate a patch image comprising the set of points corresponding to the patch projected onto a patch plane;
generate a patch image comprising color information for one or more attributes of the point cloud; and
convert the patch image from a first color space to a second color space;
pack generated patch images for each of the determined patches into one or more image frames; and
encode the one or more image frames,
wherein the encoder is configured to adjust one or more parameters used to convert the patch image from the first color space to the second color space to compensate for distortion caused by:
said generating the patch images and packing the generated patch images in the one or more image frames;

said encoding the one or more image frames;
decoding the one or more image frames; and
reconstructing the point cloud based on the decoded one or more image frames.

27. A system comprising:
one or more sensors configured to capture a plurality of points that make up a point cloud, wherein respective ones of the points comprise spatial information for the point and attribute information for the point; and
an encoder configured to compress the point cloud, wherein to compress the point cloud, the encoder is configured to:
map input pixel values to one or more M-bit code words, where M is greater than N.

28. A system comprising:
a decoder configured to:
map M-bit code words to N-bit data, where M is greater than N.

29. A system comprising:
an encoder configured to compress a point cloud, wherein to compress the point cloud, the encoder is configured to:
determine, for the point cloud, a plurality of patches each corresponding to portions of the point cloud and for each patch, generate a patch image;
pack generated patch images for each of the patches into one or more image frames;
generate an occupancy map indicating locations of patch images in the one or more image frames;
encode the occupancy map, wherein encoding the occupancy map comprises:
assigning binary values to sub-blocks of each image frame, wherein full sub-blocks and non-full sub-blocks are assigned different attribute values;
selecting a traversal order for encoding the sub-blocks such that sub-blocks with similar binary values are traversed sequentially; and
encoding the traversal order, wherein the encoded traversal order indicates the selected traversal order to a decoder; and
encode the one or more image frames.

30. A system comprising:
one or more sensors configured to capture a plurality of points that make up a point cloud, wherein respective ones of the points comprise spatial information for the point and attribute information for the point; and
an encoder configured to compress the point cloud, wherein to compress the point cloud, the encoder is configured to:
determine, for the point cloud, a plurality of patches each corresponding to portions of the point cloud;
for each patch,
generate a patch image comprising the set of points corresponding to the patch projected onto a patch plane; and
generate a patch image comprising depth information for the set of points corresponding to the patch and a patch image comprising depth information for another set of points of the point cloud at a different depth than the set of points that correspond to the patch, wherein the depth information represents depths of the points in a direction perpendicular to the patch plane,
wherein at least some geometry information or attribute information for the other set of points is compressed based on geometry or attribute information associated with the set of points;
pack generated patch images for each of the determined patches into one or more image frames; and
encode the one or more image frames.

31. A system comprising:
one or more sensors configured to capture a plurality of points that make up a point cloud, wherein respective ones of the points comprise spatial information for the point and attribute information for the point; and
an encoder configured to compress the point cloud, wherein to compress the point cloud, the encoder is configured to:
determine, for the point cloud, a plurality of patches each corresponding to portions of the point cloud;
for each patch, generate a patch image comprising a set of points corresponding to a patch projected onto a patch plane;
pack generated patch images for each of the determined patches into one or more patch image frames;
generate an image frame comprising occupancy map information for the one or more patch image frames, wherein the occupancy map information indicates whether a portion of the patch image frame represents one of the patches or is a padded portion of the patch image frame; and
encode the one or more image frames.

32. A method comprising:
determining, for a point cloud, a plurality of patches each corresponding to portions of the point cloud;
for each patch, generating a patch image comprising a set of points corresponding to a patch projected onto a patch plane;
packing generated patch images for each of the determined patches into one or more patch image frames;
generating an image frame comprising occupancy map information for the one or more patch image frames, wherein the occupancy map information indicates whether a portion of the patch image frame represents one of the patches or is a padded portion of the patch image frame; and
encoding the one or more image frames.

33. A non-transitory computer readable medium storing program instructions, that when executed by one or more processors, cause the one or more processors to perform:
determining, for a point cloud, a plurality of patches each corresponding to portions of the point cloud;
for each patch, generating a patch image comprising a set of points corresponding to a patch projected onto a patch plane;
packing generated patch images for each of the determined patches into one or more patch image frames;
generating an image frame comprising occupancy map information for the one or more patch image frames, wherein the occupancy map information indicates whether a portion of the patch image frame represents one of the patches or is a padded portion of the patch image frame; and
encoding the one or more image frames.

34. A system comprising:
one or more sensors configured to capture a plurality of points that make up a point cloud,
wherein respective ones of the points comprise spatial information for the point and attribute information for the point; and
an encoder configured to compress the point cloud, wherein to compress the point cloud, the encoder is configured to:

determine, for the point cloud, a plurality of patches each corresponding to portions of the point cloud;
for each patch, generate a patch image comprising a set of points corresponding to a patch projected onto a patch plane;
pack generated patch images for each of the determined patches into one or more patch image frames;
generate a reconstructed version of the point cloud based on the patch images;
determine one or more points included in the point cloud that are omitted from the reconstructed version of the point cloud; and
encode the one or more image frames and spatial or attribute information for the one or more omitted points, wherein the one or more omitted points are compressed without determining additional patches for the one or more omitted points.

35. A method comprising:
determining, for a point cloud, a plurality of patches each corresponding to portions of the point cloud;
for each patch, generating a patch image comprising a set of points corresponding to a patch projected onto a patch plane;
packing generated patch images for each of the determined patches into one or more patch image frames;
generating a reconstructed version of the point cloud based on the patch images;
determining one or more points included in the point cloud that are omitted from the reconstructed version of the point cloud; and
encoding the one or more image frames and spatial or attribute information for the one or more omitted points, wherein the one or more omitted points are compressed without determining additional patches for the one or more omitted points.

36. A non-transitory computer readable medium storing program instructions, that when executed by one or more processors, cause the one or more processors to perform:
determining, for a point cloud, a plurality of patches each corresponding to portions of the point cloud;
for each patch, generating a patch image comprising a set of points corresponding to a patch projected onto a patch plane;
packing generated patch images for each of the determined patches into one or more patch image frames;
generating a reconstructed version of the point cloud based on the patch images;
determining one or more points included in the point cloud that are omitted from the reconstructed version of the point cloud; and
encoding the one or more image frames and spatial or attribute information for the one or more omitted points, wherein the one or more omitted points are compressed without determining additional patches for the one or more omitted points.

37. A system comprising:
one or more sensors configured to capture a plurality of points that make up a point cloud,
wherein respective ones of the points comprise spatial information for the point and attribute information for the point; and
an encoder configured to compress the point cloud, wherein to compress the point cloud, the encoder is configured to:
determine, for the point cloud, a plurality of patches each corresponding to portions of the point cloud, and
pack generated patch images for each of the determined patches into one or more image frames;
downscale the one or more image frames; and
encode the one or more image frames.

38. A system comprising:
a decoder configured to decompress a point cloud, wherein to decompress the point cloud, the decoder is configured to:
determine, for the point cloud, a plurality of patches included in a plurality of video frames, wherein respective ones of the patches correspond to respective portions of the point cloud, and wherein the plurality of patches are determined based on occupancy map information or auxiliary patch information for the one or more video frames, and
process or filter patches in different ones of the video frames that correspond to the same portion of the point cloud in a similar manner, wherein the occupancy map information or the auxiliary patch information is used to determine the patches in the different ones of the video frames that correspond to the same portion of the point cloud.

39. A system comprising:
one or more sensors configured to capture a plurality of points that make up a point cloud, wherein respective ones of the points comprise spatial information for the point and attribute information for the point; and
an encoder configured to compress the point cloud, wherein to compress the point cloud, the encoder is configured to:
determine, for the point cloud, a plurality of patches each corresponding to portions of the point cloud, and
pack generated patch images for each of the determined patches into one or more image frames; and
encode the one or more image frames using a bit stream structure comprising network abstraction layer (NAL) units, wherein different NAL units indicate different particular types of information, and wherein the NAL units are not required to be placed in the bit stream according to a pre-defined location in the bit stream.

What is claimed is:
1. A non-transitory, computer-readable, medium storing program instructions, that when executed on or across one or more processors, cause the one or more processors to:
determine, for a point cloud, a plurality of patches each corresponding to portions of the point cloud, wherein each patch comprises points with surface normal vectors that deviate from one another less than a threshold amount;
for each patch,
generate a patch image comprising a set of points corresponding to the patch projected onto a patch plane; and
generate a patch image comprising depth information for the set of points corresponding to the patch, wherein the depth information represents depths of the points in a direction perpendicular to the patch plane;
pack generated patch images for each of the determined patches into one or more two dimensional (2D) image frames; and
encode the one or more 2D image frames.

2. The non-transitory, computer-readable medium of claim 1, wherein the program instructions, when executed on or across the one or more processors, further cause the one or more processors to:

for each patch,
  generate a patch image comprising attribute information for one or more attributes of the set of points corresponding to the patch;
  wherein said pack generated patch images for the determined patches into one or more 2D image frames comprises packing the patch images comprising attribute information.

3. The non-transitory, computer-readable medium of claim 1, wherein the program instructions, when executed on or across the one or more processors, further cause the one or more processors to:
  fill one or more spaces in the one or more 2D image frames not occupied by a patch image with a padding image.

4. The non-transitory, computer-readable medium of claim 3, wherein the program instructions, when executed on or across the one or more processors, cause the one or more processors to:
  generate the padding image based, at least in part, on image blocks at one or more edges of the patch images, wherein the padding image is selected such that variances between the padding image and the image blocks are less than a threshold amount.

5. The non-transitory, computer-readable medium of claim 1, wherein the program instructions, when executed on or across the one or more processors, further cause the one or more processors to:
  generate an occupancy map indicating locations of patch images in the one or more 2D image frames; and
  encode the occupancy map.

6. The non-transitory, computer-readable medium of claim 1, wherein the program instructions, when executed on or across the one or more processors, further cause the one or more processors to:
  receive a first plurality of points that make up the point cloud at a first point in time;
  receive a second plurality of points that make up the point cloud at a subsequent point in time subsequent to the first point in time, wherein at least some of the points of the point cloud have moved between the first point in time and the subsequent point in time,
  determine vector movements of the at least some points between the first point in time and the subsequent point in time;
  generate, for each patch comprising moved points, a patch image comprising vector movement information for at least some of the points, of the set of points corresponding to the patch, that have moved, wherein movement in a vector component direction for a point is represented by an intensity of a color at the point in the patch image.

7. The non-transitory, computer-readable medium of claim 1, wherein the program instructions cause the one or more processors to encode the one or more 2D image frames in accordance with a high efficiency video coding (HEVC) standard.

8. A non-transitory, computer-readable, medium storing program instructions, that when executed on or across one or more processors, cause the one or more processors to:
  receive one or more encoded two-dimensional (2D) image frames comprising patch images for a plurality of patches of a compressed point cloud, wherein, for each patch, the one or more encoded 2D image frames comprise: a patch image comprising a set of points of the patch projected onto a patch plane and a patch image comprising depth information for the set of points of the patch, wherein the depth information indicates depths of the points of the patch in a direction perpendicular to the patch plane;
  decode the one or more 2D encoded image frames comprising the patch images;
  determine, for each patch, spatial information for the set of points of the patch based, at least in part, on the patch image comprising the set of points of the patch projected onto the patch plane and the patch image comprising the depth information for the set of points of the patch; and
  generate a decompressed version of the compressed point cloud based, at least in part, on the determined spatial information for the plurality of patches.

9. The non-transitory, computer-readable, medium of claim 8, wherein the program instructions, when executed on or across the one or more processors cause the one or more processors to:
  decode the one or more encoded 2D image frames in accordance with a high efficiency video coding (HEVC) standard.

10. The non-transitory, computer-readable, medium of claim 8, wherein to determine, for each patch, spatial information for the set of points for the patch based, at least in part, on the patch image comprising the set of points of the patch projected onto the patch plane and the patch image comprising the depth information for the set of points of the patch, the program instruction, when executed on or across the one or more processors further cause the one or more processors to:
  identify the patch image comprising the set of points of the patch projected onto the patch plane;
  identify the patch image comprising the depth information for the set of points of the patch, wherein the depth information is organized such that respective pieces of depth information for respective ones of the points of the set of points of the patch are located at locations in the depth patch image corresponding to locations of the respective ones of the points in the patch image comprising the set of points of the patch projected onto the patch plane; and
  match respective pieces of depth information to respective points of the patch image comprising the set of points of the patch projected onto the patch plane.

11. The non-transitory, computer-readable, medium of claim 10, wherein the one or more encoded 2D image frames further comprise a patch image comprising attribute information for at least one of the patches,
  wherein the program instruction, when executed on or across the one or more processors further cause the one or more processors to:
    identify the patch image comprising attribute information; and
    assign attribute information included in the patch image to respective ones of the points of the set of points of the at least one patch,
    wherein the attribute information included in the patch image is organized such that respective pieces of attribute information for respective ones of the points of the set of points of the at least one patch are located at locations in the patch image corresponding to locations of the respective ones of the points of the set of points of the patch as included in the patch image comprising the set of points of the patch projected onto the patch plane.

12. The non-transitory, computer-readable, medium of claim 11, wherein the program instruction, when executed on or across the one or more processors further cause the one or more processors to:
receive an occupancy map indicating locations of respective patch images in the one or more encoded 2D image frames; and
utilize the received occupancy map to identify the respective patch images in the one or more encoded 2D image frames.

13. The non-transitory, computer-readable, medium of claim 12, wherein the occupancy map further indicates portions of the one or more encoded 2D image frames that do not include data for patch images, wherein the program instruction, when executed on or across the one or more processors further cause the one or more processors to:
budget less decoding resources to decoding portions of the one or more encoded 2D image frames that do not include data for patch images than an amount of decoding resources budgeted to decode other portions of the one or more encoded 2D image frames that include data for patch images.

14. The non-transitory, computer-readable, medium of claim 13, wherein the one or more encoded 2D image frames are encoded as a plurality of blocks;
wherein the program instruction, when executed on or across the one or more processors further cause the one or more processors to:
for each block of an image frame,
determine, based on the occupancy map, whether the block includes only data for a patch image, includes only non-patch image data, or includes a mix of data for a patch image and non-patch image data; and
for blocks including only non-patch image data, budget a lower level of decoding resources;
for blocks including only patch-image data, budget a high level of decoding resources; and
for blocks including a mix of data for a patch image and non-patch image data, divide the block into sub-blocks, wherein sub-blocks comprising non-patch image data are budgeted less decoding resources than sub-blocks comprising data for patch images.

15. A device comprising:
a memory storing program instructions; and
one or more processors, wherein the program instructions, when executed on or across one or more processors, cause the one or more processors to:
determine, for a point cloud, a plurality of patches each corresponding to portions of the point cloud, wherein each patch comprises points with surface normal vectors that deviate from one another less than a threshold amount;
for each patch,
generate a patch image comprising a set of points corresponding to the patch projected onto a patch plane; and
generate a patch image comprising depth information for the set of points corresponding to the patch, wherein the depth information represents depths of the points in a direction perpendicular to the patch plane;
pack generated patch images for each of the determined patches into one or more two dimensional (2D) image frames; and
encode the one or more 2D image frames.

16. The device of claim 15, wherein the program instructions, when executed on or across the one or more processors, further cause the one or more processors to:
for each patch,
generate a patch image comprising attribute information for one or more attributes of the set of points corresponding to the patch;
wherein said pack generated patch images for the determined patches into one or more 2D image frames comprises packing the patch images comprising attribute information.

17. The device of claim 15, wherein the program instructions, when executed on or across the one or more processors, further cause the one or more processors to:
fill one or more spaces in the one or more 2D image frames not occupied by a patch image with a padding image.

18. The device of claim 15, wherein the program instructions, when executed on or across the one or more processors, further cause the one or more processors to:
generate an occupancy map indicating locations of patch images in the one or more 2D image frames; and
encode the occupancy map.

19. The device of claim 15, further comprising:
one or more sensors configured to capture a plurality of points that make up the point cloud, wherein respective ones of the points comprise spatial information for the point and attribute information for the point.

20. The device of claim 19, wherein the program instructions, when executed on or across the one or more processors, further cause the one or more processors to:
cause the one or more sensors to capture a first plurality of points that make up the point cloud at a first point in time;
cause the one or more sensors to capture a second plurality of points that make up the point cloud at a subsequent point in time subsequent to the first point in time, wherein at least some of the points of the point cloud have moved between the first point in time and the subsequent point in time, determine vector movements of the at least some points between the first point in time and the subsequent point in time;
generate, for each patch comprising moved points, a patch image comprising vector movement information for at least some of the points, of the set of points corresponding to the patch, that have moved, wherein movement in a vector component direction for a point is represented by an intensity of a color at the point in the patch image.

* * * * *